US011081608B2

(12) United States Patent
Yoscovich et al.

(10) Patent No.: US 11,081,608 B2
(45) Date of Patent: Aug. 3, 2021

(54) APPARATUS AND METHOD FOR DETERMINING AN ORDER OF POWER DEVICES IN POWER GENERATION SYSTEMS

(71) Applicant: Solaredge Technologies Ltd., Herzeliya (IL)

(72) Inventors: Ilan Yoscovich, Ramat Gan (IL); Yoav Galin, Raanana (IL); Amir Fishelov, Tel Aviv (IL); Yakir Loewenstern, Ariel (IL); David Braginsky, Ashdod (IL); Lior Handelsman, Givatayim (IL); Ohad Gidon, Netanya (IL); Guy Sella, Bitan Aharon (IL); Gil Litmanovitch, Mazkeret Batya (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 16/784,980

(22) Filed: Feb. 7, 2020

(65) Prior Publication Data

US 2020/0279963 A1 Sep. 3, 2020

Related U.S. Application Data

(63) Continuation-in-part of application No. 16/217,679, filed on Dec. 12, 2018, now Pat. No. 10,599,113,
(Continued)

(51) Int. Cl.
*H01L 31/05* (2014.01)
*H01L 31/02* (2006.01)
*H01L 31/0224* (2006.01)

(52) U.S. Cl.
CPC ...... *H01L 31/0504* (2013.01); *H01L 31/0201* (2013.01); *H01L 31/022433* (2013.01)

(58) Field of Classification Search
CPC ............. H01L 31/0504; H01L 31/0201; H01L 31/022433; H01L 31/05; H01L 31/02; H01L 31/0224
See application file for complete search history.

(56) References Cited

U.S. PATENT DOCUMENTS 2,586,804 A 2/1952 Fluke
2,758,219 A 8/1956 Miller
(Continued)

FOREIGN PATENT DOCUMENTS

AU 2012225199 A1 10/2013
CN 2071396 U 2/1991
(Continued)

OTHER PUBLICATIONS

United Kingdom Intellectual Property Office, Combined Search and Examination Report Under Sections 17 and 18(3), GB1020862.7, dated Jun. 16, 2011.
(Continued)

*Primary Examiner* — Robert L Deberadinis
(74) *Attorney, Agent, or Firm* — Banner & Witcoff, Ltd.

(57) ABSTRACT

Various implementations described herein are directed to a method for determining an order of power devices connected in a serial string. A command is transmitted, to at least one first power device of a plurality of power devices, to change an output electrical parameter. At least one electrical signal is caused to be transmitted from at least one second power device of the plurality of power devices. At least one measured value responsive to the electrical signal is received from at least one of the plurality of power devices. A determination is made, by analyzing the at least one measured value, which ones of the plurality of power
(Continued)

devices are ordered in the serial string between the at least one first power device and the at least one second power device.

20 Claims, 35 Drawing Sheets

Related U.S. Application Data which is a continuation-in-part of application No. 15/447,981, filed on Mar. 2, 2017, now Pat. No. 10,061,957.

(60) Provisional application No. 62/381,298, filed on Aug. 30, 2016, provisional application No. 62/303,017, filed on Mar. 3, 2016.

(56) References Cited

U.S. PATENT DOCUMENTS

| | | |
|---|---|---|
| 2,958,171 A | 11/1960 | Deckers |
| 3,369,210 A | 2/1968 | Manickella |
| 3,740,652 A | 6/1973 | Burgener |
| 3,958,136 A | 5/1976 | Schroeder |
| 4,101,816 A | 7/1978 | Shepter |
| 4,129,823 A | 12/1978 | van der Pool et al. |
| 4,146,785 A | 3/1979 | Neale |
| 4,161,771 A | 7/1979 | Bates |
| 4,257,087 A | 3/1981 | Cuk |
| 4,296,461 A | 10/1981 | Mallory et al. |
| 4,346,341 A | 8/1982 | Blackburn et al. |
| 4,452,867 A | 6/1984 | Conforti |
| 4,481,654 A | 11/1984 | Daniels et al. |
| 4,533,986 A | 8/1985 | Jones |
| 4,549,254 A | 10/1985 | Kissel |
| 4,554,515 A | 11/1985 | Burson et al. |
| 4,611,090 A | 9/1986 | Catella et al. |
| 4,623,753 A | 11/1986 | Feldman et al. |
| 4,639,844 A | 1/1987 | Gallios et al. |
| 4,641,042 A | 2/1987 | Miyazawa |
| 4,644,458 A | 2/1987 | Harafuji et al. |
| 4,652,770 A | 3/1987 | Kumano |
| 4,685,040 A | 8/1987 | Steigerwald et al. |
| 4,686,617 A | 8/1987 | Colton |
| 4,706,181 A | 11/1987 | Mercer |
| 4,720,667 A | 1/1988 | Lee et al. |
| 4,720,668 A | 1/1988 | Lee et al. |
| 4,746,879 A | 5/1988 | Ma et al. |
| 4,783,728 A | 11/1988 | Hoffman |
| 4,797,803 A | 1/1989 | Carroll |
| RE33,057 E | 9/1989 | Clegg et al. |
| 4,864,213 A | 9/1989 | Kido |
| 4,868,379 A | 9/1989 | West |
| 4,888,063 A | 12/1989 | Powell |
| 4,888,702 A | 12/1989 | Gerken et al. |
| 4,899,246 A | 2/1990 | Tripodi |
| 4,899,269 A | 2/1990 | Rouzies |
| 4,906,859 A | 3/1990 | Kobayashi et al. |
| 4,910,518 A | 3/1990 | Kim et al. |
| 4,978,870 A | 12/1990 | Chen et al. |
| 4,987,360 A | 1/1991 | Thompson |
| 5,045,988 A | 9/1991 | Glitter et al. |
| 5,081,558 A | 1/1992 | Mahler |
| 5,097,196 A | 3/1992 | Schoneman |
| 5,191,519 A | 3/1993 | Kawakami |
| 5,210,519 A | 5/1993 | Moore |
| 5,280,232 A | 1/1994 | Kohl et al. |
| 5,287,261 A | 2/1994 | Ehsani |
| 5,289,361 A | 2/1994 | Vinciarelli |
| 5,327,071 A | 7/1994 | Frederick et al. |
| 5,345,375 A | 9/1994 | Mohan |
| 5,391,235 A | 2/1995 | Inoue |
| 5,402,060 A | 3/1995 | Erisman |
| 5,428,286 A | 6/1995 | Kha |
| 5,446,645 A | 8/1995 | Shirahama et al. |
| 5,460,546 A | 10/1995 | Kunishi et al. |
| 5,469,919 A | 11/1995 | Carisella |
| 5,493,154 A | 2/1996 | Smith et al. |
| 5,497,289 A | 3/1996 | Sugishima et al. |
| 5,517,378 A | 5/1996 | Asplund et al. |
| 5,530,335 A | 6/1996 | Decker et al. |
| 5,548,504 A | 8/1996 | Takehara |
| 5,563,780 A | 10/1996 | Goad |
| 5,604,430 A | 2/1997 | Decker et al. |
| 5,616,913 A | 4/1997 | Litterst |
| 5,644,219 A | 7/1997 | Kurokawa |
| 5,654,740 A | 8/1997 | Schulha |
| 5,659,465 A | 8/1997 | Flack et al. |
| 5,686,766 A | 11/1997 | Tamechika |
| 5,696,439 A | 12/1997 | Presti et al. |
| 5,726,505 A | 3/1998 | Yamada et al. |
| 5,734,259 A | 3/1998 | Sisson et al. |
| 5,773,963 A | 6/1998 | Blanc et al. |
| 5,777,515 A | 7/1998 | Kimura |
| 5,777,858 A | 7/1998 | Rodulfo |
| 5,780,092 A | 7/1998 | Agbo et al. |
| 5,798,631 A | 8/1998 | Spee et al. |
| 5,801,519 A | 9/1998 | Midya et al. |
| 5,804,894 A | 9/1998 | Leeson et al. |
| 5,821,734 A | 10/1998 | Faulk |
| 5,822,186 A | 10/1998 | Bull et al. |
| 5,838,148 A | 11/1998 | Kurokami et al. |
| 5,869,956 A | 2/1999 | Nagao et al. |
| 5,873,738 A | 2/1999 | Shimada et al. |
| 5,886,882 A | 3/1999 | Rodulfo |
| 5,886,890 A | 3/1999 | Ishida et al. |
| 5,892,354 A | 4/1999 | Nagao et al. |
| 5,902,347 A | 5/1999 | Backman et al. |
| 5,905,645 A | 5/1999 | Cross |
| 5,917,722 A | 6/1999 | Singh |
| 5,919,314 A | 7/1999 | Kim |
| 5,923,158 A | 7/1999 | Kurokami et al. |
| 5,930,128 A | 7/1999 | Dent |
| 5,945,806 A | 8/1999 | Faulk |
| 5,955,885 A | 9/1999 | Kurokami et al. |
| 5,961,739 A | 10/1999 | Osborne |
| 5,963,010 A | 10/1999 | Hayashi et al. |
| 5,982,253 A | 11/1999 | Perrin et al. |
| 5,986,909 A | 11/1999 | Hammond et al. |
| 6,002,290 A | 12/1999 | Avery et al. |
| 6,002,603 A | 12/1999 | Carver |
| 6,031,736 A | 2/2000 | Takehara et al. |
| 6,037,720 A | 3/2000 | Wong et al. |
| 6,046,919 A | 4/2000 | Madenokouji et al. |
| 6,078,511 A | 6/2000 | Fasullo et al. |
| 6,082,122 A | 7/2000 | Madenokouji et al. |
| 6,087,738 A | 7/2000 | Hammond |
| 6,091,329 A | 7/2000 | Newman |
| 6,111,391 A | 8/2000 | Cullen |
| 6,163,086 A | 12/2000 | Choo |
| 6,166,527 A | 12/2000 | Dwelley et al. |
| 6,219,623 B1 | 4/2001 | Wills |
| 6,256,234 B1 | 7/2001 | Keeth et al. |
| 6,259,234 B1 | 7/2001 | Perol |
| 6,268,559 B1 | 7/2001 | Yamawaki |
| 6,274,804 B1 | 8/2001 | Psyk et al. |
| 6,285,572 B1 | 9/2001 | Onizuka et al. |
| 6,292,379 B1 | 9/2001 | Edevold et al. |
| 6,297,621 B1 | 10/2001 | Hui et al. |
| 6,304,065 B1 | 10/2001 | Wittenbreder |
| 6,339,538 B1 | 1/2002 | Handleman |
| 6,344,612 B1 | 2/2002 | Kuwahara et al. |
| 6,369,462 B1 | 4/2002 | Siri |
| 6,396,170 B1 | 5/2002 | Laufenberg et al. |
| 6,441,597 B1 | 8/2002 | Lethellier |
| 6,448,489 B2 | 9/2002 | Kimura et al. |
| 6,465,931 B2 | 10/2002 | Knowles et al. |
| 6,483,203 B1 | 11/2002 | McCormack |
| 6,493,246 B2 | 12/2002 | Suzui et al. |
| 6,507,176 B2 | 1/2003 | Wittenbreder, Jr. |
| 6,512,444 B1 | 1/2003 | Morris, Jr. et al. |
| 6,531,848 B1 | 3/2003 | Chitsazan et al. |
| 6,545,211 B1 | 4/2003 | Mimura |

(56) References Cited

U.S. PATENT DOCUMENTS

| | | |
|---|---|---|
| 6,548,205 B2 | 4/2003 | Leung et al. |
| 6,587,051 B2 | 7/2003 | Takehara et al. |
| 6,590,793 B1 | 7/2003 | Nagao et al. |
| 6,590,794 B1 | 7/2003 | Carter |
| 6,593,521 B2 | 7/2003 | Kobayashi |
| 6,600,100 B2 | 7/2003 | Ho et al. |
| 6,608,468 B2 | 8/2003 | Nagase |
| 6,611,441 B2 | 8/2003 | Kurokami et al. |
| 6,628,011 B2 | 9/2003 | Droppo et al. |
| 6,633,824 B2 | 10/2003 | Dollar, II |
| 6,636,431 B2 | 10/2003 | Seki et al. |
| 6,650,560 B2 | 11/2003 | MacDonald et al. |
| 6,653,549 B2 | 11/2003 | Matsushita et al. |
| 6,655,987 B2 | 12/2003 | Higashikozono et al. |
| 6,678,174 B2 | 1/2004 | Suzui et al. |
| 6,690,590 B2 | 2/2004 | Stamenic et al. |
| 6,693,781 B1 | 2/2004 | Kroker |
| 6,731,136 B2 | 5/2004 | Knee |
| 6,738,692 B2 | 5/2004 | Schienbein et al. |
| 6,744,643 B2 | 6/2004 | Luo et al. |
| 6,750,391 B2 | 6/2004 | Bower |
| 6,765,315 B2 | 7/2004 | Hammerstrom et al. |
| 6,768,047 B2 | 7/2004 | Chang et al. |
| 6,788,033 B2 | 9/2004 | Vinciarelli |
| 6,788,146 B2 | 9/2004 | Forejt et al. |
| 6,795,318 B2 | 9/2004 | Haas et al. |
| 6,801,442 B2 | 10/2004 | Suzui et al. |
| 6,810,339 B2 | 10/2004 | Wills |
| 6,828,503 B2 | 12/2004 | Yoshikawa et al. |
| 6,828,901 B2 | 12/2004 | Birchfield et al. |
| 6,850,074 B2 | 2/2005 | Adams et al. |
| 6,882,131 B1 | 4/2005 | Takada et al. |
| 6,914,418 B2 | 7/2005 | Sung |
| 6,919,714 B2 | 7/2005 | Delepaut |
| 6,927,955 B2 | 8/2005 | Suzui et al. |
| 6,933,627 B2 | 8/2005 | Wilhelm |
| 6,936,995 B2 | 8/2005 | Kapsokavathis et al. |
| 6,950,323 B2 | 9/2005 | Achleitner et al. |
| 6,963,147 B2 | 11/2005 | Kurokami et al. |
| 6,984,967 B2 | 1/2006 | Notman |
| 6,984,970 B2 | 1/2006 | Capel |
| 7,030,597 B2 | 4/2006 | Bruno et al. |
| 7,038,430 B2 | 5/2006 | Itabashi et al. |
| 7,042,195 B2 | 5/2006 | Tsunetsugu et al. |
| 7,046,531 B2 | 5/2006 | Zocchi et al. |
| 7,053,506 B2 | 5/2006 | Alonso et al. |
| 7,072,194 B2 | 7/2006 | Nayar et al. |
| 7,079,406 B2 | 7/2006 | Kurokami et al. |
| 7,087,332 B2 | 8/2006 | Harris |
| 7,090,509 B1 | 8/2006 | Gilliland et al. |
| 7,099,169 B2 | 8/2006 | West et al. |
| 7,281,141 B2 | 10/2007 | Elkayam et al. |
| 7,348,802 B2 | 3/2008 | Kasanyal et al. |
| 7,443,052 B2 | 10/2008 | Wendt et al. |
| 7,456,523 B2 | 11/2008 | Kobayashi |
| 7,485,987 B2 | 2/2009 | Mori et al. |
| 7,495,419 B1 | 2/2009 | Ju |
| 7,504,811 B2 | 3/2009 | Watanabe et al. |
| 7,596,008 B2 | 9/2009 | Iwata et al. |
| 7,615,981 B2 | 11/2009 | Wong et al. |
| 7,709,727 B2 | 5/2010 | Roehrig et al. |
| 7,719,140 B2 | 5/2010 | Ledenev et al. |
| 7,759,575 B2 | 7/2010 | Jones et al. |
| 7,763,807 B2 | 7/2010 | Richter |
| 7,772,716 B2 | 8/2010 | Shaver, II et al. |
| 7,782,031 B2 | 8/2010 | Qiu et al. |
| 7,783,389 B2 | 8/2010 | Yamada et al. |
| 7,787,273 B2 | 8/2010 | Lu et al. |
| 7,804,282 B2 | 9/2010 | Bertele |
| 7,808,125 B1 | 10/2010 | Sachdeva et al. |
| 7,812,701 B2 | 10/2010 | Lee et al. |
| 7,824,189 B1 | 11/2010 | Lauermann et al. |
| 7,868,599 B2 | 1/2011 | Rahman et al. |
| 7,880,334 B2 | 2/2011 | Evans et al. |
| 7,893,346 B2 | 2/2011 | Nachamkin et al. |
| 7,906,007 B2 | 3/2011 | Gibson et al. |
| 7,919,952 B1 | 4/2011 | Fahrenbruch |
| 7,925,552 B2 | 4/2011 | Tarbell et al. |
| 7,944,191 B2 | 5/2011 | Xu |
| 7,945,413 B2 | 5/2011 | Krein |
| 7,948,221 B2 | 5/2011 | Watanabe et al. |
| 7,952,897 B2 | 5/2011 | Nocentini et al. |
| 7,960,650 B2 | 6/2011 | Richter et al. |
| 8,003,885 B2 | 8/2011 | Richter et al. |
| 8,018,748 B2 | 9/2011 | Leonard |
| 8,035,249 B2 | 10/2011 | Shaver, II et al. |
| 8,049,363 B2 | 11/2011 | McLean et al. |
| 8,058,747 B2 | 11/2011 | Avrutsky et al. |
| 8,067,855 B2 | 11/2011 | Mumtaz et al. |
| 8,089,780 B2 | 1/2012 | Mochikawa et al. |
| 8,097,818 B2 | 1/2012 | Gerull et al. |
| 8,102,144 B2 | 1/2012 | Capp et al. |
| 8,138,914 B2 | 3/2012 | Wong et al. |
| 8,139,335 B2 | 3/2012 | Quardt et al. |
| 8,139,382 B2 | 3/2012 | Zhang et al. |
| 8,169,252 B2 | 5/2012 | Fahrenbruch et al. |
| 8,184,460 B2 | 5/2012 | O'Brien et al. |
| 8,204,709 B2 | 6/2012 | Presher, Jr. et al. |
| 8,248,804 B2 | 8/2012 | Han et al. |
| 8,289,183 B1 | 10/2012 | Foss |
| 8,289,742 B2 | 10/2012 | Adest et al. |
| 8,294,451 B2 | 10/2012 | Hasenfus |
| 8,310,102 B2 | 11/2012 | Raju |
| 8,324,921 B2 | 12/2012 | Adest et al. |
| 8,378,656 B2 | 2/2013 | de Rooij et al. |
| 8,379,418 B2 | 2/2013 | Falk |
| 8,395,366 B2 | 3/2013 | Uno |
| 8,410,359 B2 | 4/2013 | Richter |
| 8,410,950 B2 | 4/2013 | Takehara et al. |
| 8,415,937 B2 | 4/2013 | Hester |
| 8,427,009 B2 | 4/2013 | Shaver, II et al. |
| 8,436,592 B2 | 5/2013 | Salton |
| 8,531,055 B2 | 9/2013 | Adest et al. |
| 8,570,017 B2 | 10/2013 | Perichon et al. |
| 8,618,692 B2 | 12/2013 | Adest et al. |
| 8,670,255 B2 | 3/2014 | Gong et al. |
| 8,710,351 B2 | 4/2014 | Robbins |
| 8,791,598 B2 | 7/2014 | Jain |
| 8,809,699 B2 | 8/2014 | Funk |
| 8,816,535 B2 | 8/2014 | Adest et al. |
| 8,823,342 B2 | 9/2014 | Williams |
| 8,835,748 B2 | 9/2014 | Frolov et al. |
| 8,859,884 B2 | 10/2014 | Dunton et al. |
| 8,878,563 B2 | 11/2014 | Robbins |
| 8,963,375 B2 | 2/2015 | DeGraaff |
| 8,972,765 B1 | 3/2015 | Krolak et al. |
| 9,291,696 B2 | 3/2016 | Adest et al. |
| 2001/0000957 A1 | 5/2001 | Birchfield et al. |
| 2001/0023703 A1 | 9/2001 | Kondo et al. |
| 2001/0034982 A1 | 11/2001 | Nagao et al. |
| 2002/0017900 A1 | 2/2002 | Takeda et al. |
| 2002/0044473 A1 | 4/2002 | Toyomura et al. |
| 2002/0047693 A1 | 4/2002 | Chang |
| 2002/0056089 A1 | 5/2002 | Houston |
| 2002/0134567 A1 | 9/2002 | Rasmussen et al. |
| 2002/0148497 A1 | 10/2002 | Sasaoka et al. |
| 2002/0190696 A1 | 12/2002 | Darshan |
| 2003/0025594 A1 | 2/2003 | Akiyama et al. |
| 2003/0058593 A1 | 3/2003 | Bertele et al. |
| 2003/0058662 A1 | 3/2003 | Baudelot et al. |
| 2003/0066076 A1 | 4/2003 | Minahan |
| 2003/0075211 A1 | 4/2003 | Makita et al. |
| 2003/0080741 A1 | 5/2003 | LeRow et al. |
| 2003/0090246 A1 | 5/2003 | Shenai et al. |
| 2003/0107352 A1 | 6/2003 | Downer et al. |
| 2003/0111103 A1 | 6/2003 | Bower et al. |
| 2003/0116154 A1 | 6/2003 | Butler et al. |
| 2003/0214274 A1 | 11/2003 | Lethellier |
| 2004/0004402 A1 | 1/2004 | Kippley |
| 2004/0041548 A1 | 3/2004 | Perry |
| 2004/0056642 A1 | 3/2004 | Nebrigic et al. |
| 2004/0061527 A1 | 4/2004 | Knee |
| 2004/0125618 A1 | 7/2004 | De Rooij et al. |
| 2004/0140719 A1 | 7/2004 | Vulih et al. |

(56) References Cited

U.S. PATENT DOCUMENTS

| | | |
|---|---|---|
| 2004/0150410 A1 | 8/2004 | Schoepf et al. |
| 2004/0169499 A1 | 9/2004 | Huang et al. |
| 2004/0201279 A1 | 10/2004 | Templeton |
| 2004/0201933 A1 | 10/2004 | Blanc |
| 2004/0230343 A1 | 11/2004 | Zalesski |
| 2004/0246226 A1 | 12/2004 | Moon |
| 2004/0263183 A1 | 12/2004 | Naidu et al. |
| 2005/0002214 A1 | 1/2005 | Deng et al. |
| 2005/0005785 A1 | 1/2005 | Poss et al. |
| 2005/0017697 A1 | 1/2005 | Capel |
| 2005/0057214 A1 | 3/2005 | Matan |
| 2005/0057215 A1 | 3/2005 | Matan |
| 2005/0068820 A1 | 3/2005 | Radosevich et al. |
| 2005/0099138 A1 | 5/2005 | Wilhelm |
| 2005/0103376 A1 | 5/2005 | Matsushita et al. |
| 2005/0105224 A1 | 5/2005 | Nishi |
| 2005/0162018 A1 | 7/2005 | Realmuto et al. |
| 2005/0172995 A1 | 8/2005 | Rohrig et al. |
| 2005/0194937 A1 | 9/2005 | Jacobs |
| 2005/0218876 A1 | 10/2005 | Nino |
| 2005/0226017 A1 | 10/2005 | Kotsopoulos et al. |
| 2005/0275979 A1 | 12/2005 | Xu |
| 2005/0281064 A1 | 12/2005 | Olsen et al. |
| 2005/0287402 A1 | 12/2005 | Maly et al. |
| 2006/0001406 A1 | 1/2006 | Matan |
| 2006/0017327 A1 | 1/2006 | Siri et al. |
| 2006/0034106 A1 | 2/2006 | Johnson |
| 2006/0038692 A1 | 2/2006 | Schnetker |
| 2006/0043792 A1 | 3/2006 | Hjort et al. |
| 2006/0043942 A1 | 3/2006 | Cohen |
| 2006/0053447 A1 | 3/2006 | Krzyzanowski et al. |
| 2006/0066349 A1 | 3/2006 | Murakami |
| 2006/0068239 A1 | 3/2006 | Norimatsu et al. |
| 2006/0077046 A1 | 4/2006 | Endo |
| 2006/0108979 A1 | 5/2006 | Daniel et al. |
| 2006/0109009 A1 | 5/2006 | Banke et al. |
| 2006/0113843 A1 | 6/2006 | Beveridge |
| 2006/0113979 A1 | 6/2006 | Ishigaki et al. |
| 2006/0118162 A1 | 6/2006 | Saelzer et al. |
| 2006/0132102 A1 | 6/2006 | Harvey |
| 2006/0149396 A1 | 7/2006 | Templeton |
| 2006/0162772 A1 | 7/2006 | Presher et al. |
| 2006/0163946 A1 | 7/2006 | Henne et al. |
| 2006/0171182 A1 | 8/2006 | Siri et al. |
| 2006/0174939 A1 | 8/2006 | Matan |
| 2006/0176716 A1 | 8/2006 | Balakrishnan et al. |
| 2006/0185727 A1 | 8/2006 | Matan |
| 2006/0192540 A1 | 8/2006 | Balakrishnan et al. |
| 2006/0208660 A1 | 9/2006 | Shinmura et al. |
| 2006/0227577 A1 | 10/2006 | Horiuchi et al. |
| 2006/0227578 A1 | 10/2006 | Datta et al. |
| 2006/0235717 A1 | 10/2006 | Sharma et al. |
| 2006/0237058 A1 | 10/2006 | McClintock et al. |
| 2006/0266408 A1 | 11/2006 | Horne et al. |
| 2006/0267515 A1 | 11/2006 | Burke et al. |
| 2007/0013349 A1 | 1/2007 | Bassett |
| 2007/0029636 A1 | 2/2007 | Kanemaru et al. |
| 2007/0030068 A1 | 2/2007 | Motonobu et al. |
| 2007/0044837 A1 | 3/2007 | Simburger et al. |
| 2007/0075711 A1 | 4/2007 | Blanc et al. |
| 2007/0081364 A1 | 4/2007 | Andreycak |
| 2007/0085523 A1 | 4/2007 | Scoones et al. |
| 2007/0089778 A1 | 4/2007 | Horne et al. |
| 2007/0115635 A1 | 5/2007 | Low et al. |
| 2007/0133241 A1 | 6/2007 | Mumtaz et al. |
| 2007/0159866 A1 | 7/2007 | Siri |
| 2007/0164750 A1 | 7/2007 | Chen et al. |
| 2007/0165347 A1 | 7/2007 | Wendt et al. |
| 2007/0205778 A1 | 9/2007 | Fabbro et al. |
| 2007/0227574 A1 | 10/2007 | Cart |
| 2007/0236187 A1 | 10/2007 | Wai et al. |
| 2007/0241720 A1 | 10/2007 | Sakamoto et al. |
| 2007/0247135 A1 | 10/2007 | Koga |
| 2007/0247877 A1 | 10/2007 | Kwon et al. |
| 2007/0273339 A1 | 11/2007 | Haines |
| 2007/0273342 A1 | 11/2007 | Kataoka et al. |
| 2007/0290636 A1 | 12/2007 | Beck et al. |
| 2008/0024098 A1 | 1/2008 | Hojo |
| 2008/0088184 A1 | 4/2008 | Tung et al. |
| 2008/0097655 A1 | 4/2008 | Hadar et al. |
| 2008/0142071 A1 | 6/2008 | Dorn et al. |
| 2008/0143188 A1 | 6/2008 | Adest et al. |
| 2008/0143462 A1 | 6/2008 | Belisle et al. |
| 2008/0179949 A1 | 7/2008 | Besser et al. |
| 2008/0186004 A1 | 8/2008 | Williams |
| 2008/0192519 A1 | 8/2008 | Iwata et al. |
| 2008/0218152 A1 | 9/2008 | Bo |
| 2008/0236647 A1 | 10/2008 | Gibson et al. |
| 2008/0236648 A1 | 10/2008 | Klein et al. |
| 2008/0238195 A1 | 10/2008 | Shaver et al. |
| 2008/0246460 A1 | 10/2008 | Smith |
| 2008/0246463 A1 | 10/2008 | Sinton |
| 2008/0252273 A1 | 10/2008 | Woo et al. |
| 2008/0297963 A1 | 12/2008 | Lee et al. |
| 2008/0298608 A1 | 12/2008 | Wilcox |
| 2009/0014050 A1 | 1/2009 | Haaf |
| 2009/0014057 A1 | 1/2009 | Croft et al. |
| 2009/0015071 A1 | 1/2009 | Iwata et al. |
| 2009/0066399 A1 | 3/2009 | Chen et al. |
| 2009/0073726 A1 | 3/2009 | Babcock |
| 2009/0078300 A1 | 3/2009 | Ang et al. |
| 2009/0084570 A1 | 4/2009 | Gherardini et al. |
| 2009/0097172 A1 | 4/2009 | Bremicker et al. |
| 2009/0102440 A1 | 4/2009 | Coles |
| 2009/0121549 A1 | 5/2009 | Leonard |
| 2009/0141522 A1 | 6/2009 | Adest et al. |
| 2009/0160258 A1 | 6/2009 | Allen et al. |
| 2009/0179500 A1 | 7/2009 | Ragonese et al. |
| 2009/0184746 A1 | 7/2009 | Fahrenbruch |
| 2009/0190275 A1 | 7/2009 | Gilmore et al. |
| 2009/0217965 A1 | 9/2009 | Dougal et al. |
| 2009/0224817 A1 | 9/2009 | Nakamura et al. |
| 2009/0242011 A1 | 10/2009 | Proisy et al. |
| 2009/0243547 A1 | 10/2009 | Andelfinger |
| 2009/0295225 A1 | 12/2009 | Asplund et al. |
| 2009/0325003 A1 | 12/2009 | Aberle et al. |
| 2010/0001587 A1 | 1/2010 | Casey et al. |
| 2010/0020576 A1 | 1/2010 | Falk |
| 2010/0026736 A1 | 2/2010 | Plut |
| 2010/0038907 A1 | 2/2010 | Hunt et al. |
| 2010/0052735 A1 | 3/2010 | Burkland et al. |
| 2010/0060000 A1 | 3/2010 | Scholte-Wassink |
| 2010/0071742 A1 | 3/2010 | de Rooij et al. |
| 2010/0085670 A1 | 4/2010 | Palaniswami et al. |
| 2010/0124087 A1 | 5/2010 | Falk |
| 2010/0126550 A1 | 5/2010 | Foss |
| 2010/0127571 A1 | 5/2010 | Hadar et al. |
| 2010/0132761 A1 | 6/2010 | Echizenya et al. |
| 2010/0139743 A1 | 6/2010 | Hadar et al. |
| 2010/0141041 A1 | 6/2010 | Bose et al. |
| 2010/0147362 A1 | 6/2010 | King et al. |
| 2010/0154858 A1 | 6/2010 | Jain |
| 2010/0176773 A1 | 7/2010 | Capel |
| 2010/0181957 A1 | 7/2010 | Goeltner |
| 2010/0195361 A1 | 8/2010 | Stem |
| 2010/0206378 A1 | 8/2010 | Erickson, Jr. et al. |
| 2010/0214808 A1 | 8/2010 | Rodriguez |
| 2010/0217551 A1 | 8/2010 | Goff et al. |
| 2010/0241375 A1 | 9/2010 | Kumar |
| 2010/0244575 A1 | 9/2010 | Coccia et al. |
| 2010/0246223 A1 | 9/2010 | Xuan |
| 2010/0264736 A1 | 10/2010 | Mumtaz et al. |
| 2010/0286836 A1 | 11/2010 | Shaver, II et al. |
| 2010/0288327 A1 | 11/2010 | Lisi et al. |
| 2011/0006743 A1 | 1/2011 | Fabbro |
| 2011/0031816 A1 | 2/2011 | Buthker et al. |
| 2011/0037600 A1 | 2/2011 | Takehara et al. |
| 2011/0043172 A1 | 2/2011 | Dearn |
| 2011/0056533 A1 | 3/2011 | Kuan |
| 2011/0061705 A1 | 3/2011 | Croft et al. |
| 2011/0068633 A1 | 3/2011 | Quardt et al. |
| 2011/0079263 A1 | 4/2011 | Avrutsky |
| 2011/0080147 A1 | 4/2011 | Schoenlinner et al. |
| 2011/0108087 A1 | 5/2011 | Croft et al. |

(56) References Cited

U.S. PATENT DOCUMENTS

| | | |
|---|---|---|
| 2011/0115295 A1 | 5/2011 | Moon et al. |
| 2011/0125431 A1 | 5/2011 | Adest et al. |
| 2011/0198935 A1 | 8/2011 | Hinman et al. |
| 2011/0232714 A1 | 9/2011 | Bhavaraju et al. |
| 2011/0240100 A1 | 10/2011 | Lu et al. |
| 2011/0254372 A1 | 10/2011 | Haines et al. |
| 2011/0260866 A1 | 10/2011 | Avrutsky et al. |
| 2011/0267859 A1 | 11/2011 | Chapman |
| 2011/0273017 A1 | 11/2011 | Borup et al. |
| 2011/0278955 A1 | 11/2011 | Signorelli et al. |
| 2011/0290317 A1 | 12/2011 | Naumovitz et al. |
| 2011/0298288 A1 | 12/2011 | Cho et al. |
| 2012/0019966 A1 | 1/2012 | DeBoer |
| 2012/0026769 A1 | 2/2012 | Schroeder et al. |
| 2012/0033392 A1 | 2/2012 | Golubovic et al. |
| 2012/0043818 A1 | 2/2012 | Stratakos et al. |
| 2012/0048325 A1 | 3/2012 | Matsuo et al. |
| 2012/0049627 A1 | 3/2012 | Matsuo et al. |
| 2012/0049801 A1 | 3/2012 | Chang |
| 2012/0063177 A1 | 3/2012 | Garrity |
| 2012/0080943 A1 | 4/2012 | Phadke |
| 2012/0081009 A1 | 4/2012 | Shteynberg et al. |
| 2012/0081933 A1 | 4/2012 | Garrity |
| 2012/0081934 A1 | 4/2012 | Garrity et al. |
| 2012/0081937 A1 | 4/2012 | Phadke |
| 2012/0087159 A1 | 4/2012 | Chapman et al. |
| 2012/0091810 A1 | 4/2012 | Aiello et al. |
| 2012/0091817 A1 | 4/2012 | Seymour et al. |
| 2012/0098344 A1 | 4/2012 | Bergveld et al. |
| 2012/0104863 A1 | 5/2012 | Yuan |
| 2012/0113554 A1 | 5/2012 | Paoletti et al. |
| 2012/0133372 A1 | 5/2012 | Tsai et al. |
| 2012/0138123 A1 | 6/2012 | Newdoll et al. |
| 2012/0139343 A1 | 6/2012 | Adest et al. |
| 2012/0146583 A1 | 6/2012 | Gaul et al. |
| 2012/0161526 A1 | 6/2012 | Huang et al. |
| 2012/0169124 A1 | 7/2012 | Nakashima et al. |
| 2012/0187769 A1 | 7/2012 | Spannhake et al. |
| 2012/0194003 A1 | 8/2012 | Schmidt et al. |
| 2012/0217973 A1 | 8/2012 | Avrutsky |
| 2012/0274145 A1 | 11/2012 | Taddeo |
| 2012/0274264 A1 | 11/2012 | Mun et al. |
| 2012/0280571 A1 | 11/2012 | Hargis |
| 2013/0002335 A1 | 1/2013 | DeGraaff |
| 2013/0038124 A1 | 2/2013 | Newdoll et al. |
| 2013/0049710 A1 | 2/2013 | Kraft et al. |
| 2013/0063119 A1 | 3/2013 | Lubomirsky |
| 2013/0082724 A1 | 4/2013 | Noda et al. |
| 2013/0321013 A1 | 12/2013 | Pisklak et al. |
| 2013/0342389 A1 | 12/2013 | Cojocaru et al. |
| 2013/0346054 A1 | 12/2013 | Mumtaz |
| 2014/0097808 A1 | 4/2014 | Clark et al. |
| 2014/0111220 A1 | 4/2014 | Andersen |
| 2014/0167715 A1 | 6/2014 | Wu et al. |
| 2014/0265629 A1 | 9/2014 | Gazit et al. |
| 2014/0265638 A1 | 9/2014 | Orr et al. |
| 2015/0188415 A1 | 7/2015 | Abido et al. |

FOREIGN PATENT DOCUMENTS

| | | |
|---|---|---|
| CN | 1236213 A | 11/1999 |
| CN | 1309451 A | 8/2001 |
| CN | 1122905 C | 10/2003 |
| CN | 1474492 A | 2/2004 |
| CN | 1523726 A | 8/2004 |
| CN | 1588773 A | 3/2005 |
| CN | 2706955 Y | 6/2005 |
| CN | 1838191 A | 9/2006 |
| CN | 1902809 A | 1/2007 |
| CN | 1933315 A | 3/2007 |
| CN | 2891438 Y | 4/2007 |
| CN | 101107712 A | 1/2008 |
| CN | 101128974 A | 2/2008 |
| CN | 101136129 A | 3/2008 |
| CN | 101180781 A | 5/2008 |
| CN | 101257221 A | 9/2008 |
| CN | 201167381 Y | 12/2008 |
| CN | 101488271 A | 7/2009 |
| CN | 101521459 A | 9/2009 |
| CN | 101523230 A | 9/2009 |
| CN | 101672252 A | 3/2010 |
| CN | 101779291 A | 7/2010 |
| CN | 101847939 A | 9/2010 |
| CN | 201601477 U | 10/2010 |
| CN | 201623478 U | 11/2010 |
| CN | 101902051 A | 12/2010 |
| CN | 201663167 U | 12/2010 |
| CN | 101939660 A | 1/2011 |
| CN | 101951011 A | 1/2011 |
| CN | 101951190 A | 1/2011 |
| CN | 101953051 A | 1/2011 |
| CN | 101976855 A | 2/2011 |
| CN | 101976952 A | 2/2011 |
| CN | 101980409 A | 2/2011 |
| CN | 102089883 A | 6/2011 |
| CN | 102148584 A | 8/2011 |
| CN | 201926948 U | 8/2011 |
| CN | 201956938 U | 8/2011 |
| CN | 202034903 U | 11/2011 |
| CN | 102273039 A | 12/2011 |
| CN | 102362550 A | 2/2012 |
| CN | 202178274 U | 3/2012 |
| CN | 102474112 A | 5/2012 |
| CN | 202871823 U | 4/2013 |
| DE | 1161639 B | 1/1964 |
| DE | 4041672 A1 | 6/1992 |
| DE | 19737286 A1 | 3/1999 |
| DE | 10219956 A1 | 4/2003 |
| DE | 102004053942 A1 | 5/2006 |
| DE | 20 2005 020161 U1 | 11/2006 |
| DE | 102005036153 A1 | 12/2006 |
| DE | 102005030907 A1 | 1/2007 |
| DE | 202007002077 U1 | 4/2008 |
| DE | 102006060815 A1 | 6/2008 |
| DE | 102007051134 A1 | 3/2009 |
| DE | 202008012345 U1 | 3/2009 |
| DE | 102007037130 B3 | 4/2009 |
| DE | 202009007318 U1 | 8/2009 |
| DE | 102008057874 A1 | 5/2010 |
| DE | 102009051186 A1 | 5/2010 |
| DE | 102009022569 A1 | 12/2010 |
| DE | 102010023549 A1 | 12/2011 |
| EP | 419093 A2 | 3/1991 |
| EP | 04168612 A1 | 3/1991 |
| EP | 420295 A1 | 4/1991 |
| EP | 604777 A1 | 7/1994 |
| EP | 756178 A2 | 1/1997 |
| EP | 827254 A2 | 3/1998 |
| EP | 1039361 A1 | 9/2000 |
| EP | 1039621 A2 | 9/2000 |
| EP | 1047179 A1 | 10/2000 |
| EP | 1330009 A2 | 7/2003 |
| EP | 1503490 A1 | 2/2005 |
| EP | 1531542 A2 | 5/2005 |
| EP | 1531545 A2 | 5/2005 |
| EP | 1642355 A2 | 4/2006 |
| EP | 1657557 A1 | 5/2006 |
| EP | 1657797 A1 | 5/2006 |
| EP | 1887675 A2 | 2/2008 |
| EP | 1914857 A1 | 4/2008 |
| EP | 2048679 A1 | 4/2009 |
| EP | 2130286 A1 | 12/2009 |
| EP | 2135296 A2 | 12/2009 |
| EP | 2234237 A1 | 9/2010 |
| EP | 2249457 A1 | 11/2010 |
| EP | 2256819 A1 | 12/2010 |
| EP | 2315328 A2 | 4/2011 |
| EP | 2386122 A2 | 11/2011 |
| EP | 2393178 A2 | 12/2011 |
| EP | 3214758 A1 | 9/2017 |
| ES | 2249147 A1 | 3/2006 |
| ES | 2249149 A1 | 3/2006 |
| GB | 2128017 A | 4/1984 |
| GB | 2476508 A | 6/2011 |

(56) References Cited

FOREIGN PATENT DOCUMENTS

| | | |
|---|---|---|
| GB | 2480015 B | 12/2011 |
| JP | 61065320 A | 4/1986 |
| JP | 8009557 A | 1/1996 |
| JP | H10308523 A | 11/1998 |
| JP | 11041832 A | 2/1999 |
| JP | 11103538 A | 4/1999 |
| JP | 11206038 A | 7/1999 |
| JP | 11289891 A | 10/1999 |
| JP | 11318042 A | 11/1999 |
| JP | 2000174307 A | 6/2000 |
| JP | 2000339044 A | 12/2000 |
| JP | 2001189476 A | 7/2001 |
| JP | 2002300735 A | 10/2002 |
| JP | 2003124492 A | 4/2003 |
| JP | 2003134667 A | 5/2003 |
| JP | 2003282916 A | 10/2003 |
| JP | 2004194500 A | 7/2004 |
| JP | 2004260944 A | 9/2004 |
| JP | 2004-334704 A | 11/2004 |
| JP | 2005192314 A | 7/2005 |
| JP | 2006278755 A | 10/2006 |
| JP | 2007058845 A | 3/2007 |
| JP | 4174227H B2 | 10/2008 |
| JP | 2011-249790 A | 12/2011 |
| JP | 2012178535 A | 9/2012 |
| KR | 101073143 B1 | 10/2011 |
| TW | 497326 B | 8/2002 |
| TW | 200913291 A | 3/2009 |
| WO | 1993013587 A1 | 7/1993 |
| WO | 95/25374 A1 | 9/1995 |
| WO | 95/34121 A1 | 12/1995 |
| WO | 1996013093 A1 | 5/1996 |
| WO | 1998023021 A2 | 5/1998 |
| WO | 00/00839 A1 | 1/2000 |
| WO | 00/21178 A1 | 4/2000 |
| WO | 01/13502 A1 | 2/2001 |
| WO | 0231517 | 4/2002 |
| WO | 2003050938 A2 | 6/2003 |
| WO | 2003071655 A1 | 8/2003 |
| WO | 2003098703 | 11/2003 |
| WO | 2004023278 A2 | 3/2004 |
| WO | 2004090993 A2 | 10/2004 |
| WO | 2004098261 A2 | 11/2004 |
| WO | 2004107543 A2 | 12/2004 |
| WO | 2005076444 A1 | 8/2005 |
| WO | 2005076445 A1 | 8/2005 |
| WO | 2005119278 A1 | 12/2005 |
| WO | 2006005125 A1 | 1/2006 |
| WO | 2006007198 A1 | 1/2006 |
| WO | 2006/074561 A1 | 7/2006 |
| WO | 2006078685 A2 | 7/2006 |
| WO | 2006130520 A2 | 12/2006 |
| WO | 2007006564 A2 | 1/2007 |
| WO | 2007/020419 A1 | 2/2007 |
| WO | 2007048421 A2 | 5/2007 |
| WO | 2007073951 A1 | 7/2007 |
| WO | 2007084196 A2 | 7/2007 |
| WO | 2007090476 A2 | 8/2007 |
| WO | 2007113358 A1 | 10/2007 |
| WO | 2008008528 A2 | 1/2008 |
| WO | 2008/046370 A1 | 4/2008 |
| WO | 2008119034 A1 | 10/2008 |
| WO | 2008121266 A2 | 10/2008 |
| WO | 2008132551 A2 | 11/2008 |
| WO | 2008132553 A2 | 11/2008 |
| WO | 2009011780 A2 | 1/2009 |
| WO | 2009/026602 A1 | 3/2009 |
| WO | 2009046533 A1 | 4/2009 |
| WO | 2009051870 A1 | 4/2009 |
| WO | 2009/059877 A1 | 5/2009 |
| WO | 2009118682 A2 | 10/2009 |
| WO | 2009118683 A2 | 10/2009 |
| WO | 2009136358 A1 | 11/2009 |
| WO | 2010/002960 A1 | 1/2010 |
| WO | 2010/003941 A2 | 1/2010 |
| WO | 2010020385 A2 | 2/2010 |
| WO | 2010/071855 A2 | 6/2010 |
| WO | 2010065043 A1 | 6/2010 |
| WO | 2010065388 A1 | 6/2010 |
| WO | 2010072717 A1 | 7/2010 |
| WO | 2010078303 A2 | 7/2010 |
| WO | 2010080672 A2 | 7/2010 |
| WO | 2010094012 A1 | 8/2010 |
| WO | 2010118503 A1 | 10/2010 |
| WO | 2010/132369 A1 | 11/2010 |
| WO | 20100134057 A1 | 11/2010 |
| WO | 2011011711 A2 | 1/2011 |
| WO | 2011017721 A1 | 2/2011 |
| WO | 2011019936 A1 | 2/2011 |
| WO | 2011023732 A2 | 3/2011 |
| WO | 2011044641 A1 | 4/2011 |
| WO | 2011059067 A1 | 5/2011 |
| WO | 2011074025 A1 | 6/2011 |
| WO | 2011076707 A2 | 6/2011 |
| WO | 2011089607 A1 | 7/2011 |
| WO | 1998023021 A | 7/2013 |

OTHER PUBLICATIONS

QT Technical Application Papers, "ABB Circuit-Breakers for Direct current Applications", ABB SAGE S.p.A., An ABB Group Company, L.V. Breakers, Via Baioni, 35, 24123 Bergamo-Italy, Tel.: +39 035.395.111—Telefax: +39 035.395306-433, Sep. 2007.

Woyte, et al., "Mains Monitoring and Protection in a European Context", 17th European Photovoltaic Solar Energy Conference and Exhibition, Munich, Germany, Oct. 22-26, 2001, Achim, Woyte, et al., pp. 1-4.

"Implementation and testing of Anti-Islanding Algorithms for IEEE 929-2000 Compliance of Single Phase Photovoltaic Inverters", Raymond M. Hudson, Photovoltaic Specialists Conference, 2002. Conference Record of the Twenty-Ninth IEEE, May 19-24, 2002.

Fairchild Semiconductor, Application Note 9016, IGBT Basics 1, by K.S. Oh Feb. 1, 2001.

"Disconnect Switches in Photovoltaic Applications", ABB, Inc., Low Voltage Control Products & Systems, 1206 Hatton Road, Wichita Falls, TX 86302, Phone 888-385-1221, 940-397-7000, Fax: 940-397-7085, 1SXU301197B0201, Nov. 2009.

Walker, "A DC Circuit Breaker for an Electric Vehicle Battery Pack", Australasian Universities Power Engineering Conference and IEAust Electric Energy Conference, Sep. 26-29, 1999.

Combined Search and Examination Report for GB1018872.0 dated Apr. 15, 2011, 2 pages.

International Search Report and Opinion of International Patent Application PCT/2009/051221, dated Oct. 19, 2009.

International Search Report and Opinion of International Patent Application PCT/2009/051222, dated Oct. 7, 2009.

Communication in EP07874025.5 dated Aug. 17, 2011.

IPRP for PCT/IB2008/055095 dated Jun. 8, 2010, with Written Opinion.

ISR for PCT/IB2008/055095 dated Apr. 30, 2009.

ISR for PCT/IL07/01064 dated Mar. 25, 2008.

IPRP for PCT/IB2007/004584 dated Jun. 10, 2009, with Written Opinion.

IPRP for PCT/IB2007/004591 dated Jul. 13, 2010, with Written Opinion.

IPRP for PCT/IB2007/004643 dated Jun. 10, 2009, with Written Opinion.

Written Opinion for PCT/IB2008/055092 submitted with IPRP dated Jun. 8, 2010.

IPRP for PCT/US2008/085754 dated Jun. 8, 2010, with Written Opinion dated Jan. 21, 2009.

IPRP for PCT/US2008/085755 dated Jun. 8, 2010, with Written Opinion dated Jan. 20, 2009.

IPRP for PCT/IB2009/051221 dated Sep. 28, 2010, with Written Opinion.

IPRP for PCT/IB2009/051222 dated Sep. 28, 2010, with Written Opinion.

IPRP for PCT/IB2009/051831 dated Nov. 9, 2010, with Written Opinion.

(56) References Cited

OTHER PUBLICATIONS

IPRP for PCT/US2008/085736 dated Jun. 7, 2011, with Written Opinion.
IPRP for PCT/IB2010/052287 dated Nov. 22, 2011, with Written Opinion.
ISR for PCT/IB2010/052413 dated Sep. 7, 2010.
UK Intellectual Property Office, Application No. GB1109618.7, Patents Act 1977, Examination Report Under Section 18(3), dated Sep. 16, 2011.
UK Intellectual Property Office, Patents Act 1977: Patents Rules Notification of Grant: Patent Serial No. GB2480015, dated Nov. 29, 2011.
Walker, et al. "PV String Per-Module Maximum Power Point Enabling Converters", School of Information Technology and Electrical Engineering the University of Queensland, Sep. 28, 2003.
Walker, "Cascaded DC-DC Converter Connection of Photovoltaic Modules", 33rd Annual IEEE Power Electronics Specialists Conference. PESC 2002. Conference Proceedings. Cairns, Queensland, Australia, Jun. 23-27, 2002; [Annual Power Electronics Specialists Conference], New York, NY: IEEE US, vol. 1, Jun. 23, 2002, pp. 24-29, XP010596060 ISBN: 978-0-7803-7262-7, figure 1.
Baggio, "Quasi-ZVS Activity Auxiliary Commutation Circuit for Two Switches Forward Converter", 32nd Annual IEEE Power Electronics Specialists Conference. PESC 2001. Conference Proceedings. Vancouver, Canada, Jun. 17-21, 2001; [Annual Power Electronics Specialists Conference] New York, NY: IEEE, US.
Ilic, "Interleaved Zero-Current-Transition Buck Converter", IEEE Transactions on Industry Applications, IEEE Service Center, Piscataway, NJ, US, vol. 43, No. 6, Nov. 1, 2007, pp. 1619-1627, XP011197477 ISSN: 0093-9994, pp. 1619-1922.
Lee: "Novel Zero-Voltage-Transition and Zero-Current-Transition Pulse-Width-Modulation Converters", Power Electronics Specialists Conference, 1997, PESC '97, Record, 28th Annual IEEE St. Louis, MO, USA, Jun. 22-27, 1997, New York, NY, USA IEEE, US, vol. 1, Jun. 22, 1997, pp. 233-239, XP010241553, ISBN: 978-0-7803-3840-1, pp. 233-236.
Sakamoto, "Switched Snubber for High-Frequency Switching Converters", Electronics & Communications in Japan, Part 1—Communications, Wiley, Hoboken, NJ, US, vol. 76, No. 2, Feb. 1, 1993, pp. 30-38, XP000403018 ISSN: 8756-6621, pp. 30-35.
Duarte, "A Family of ZVX-PWM Active-Clamping DC-to-DC Converters: Synthesis, Analysis and Experimentation", Telecommunications Energy Conference, 1995, INTELEC '95, 17th International The Hague, Netherlands, Oct. 29-Nov. 1, 1995, New York, NY, US, IEEE, US, Oct. 29, 1995, pp. 502-509, XP010161283 ISBN: 978-0-7803-2750-4 p. 503-504.
IPRP for PCT/IL2007/001064 dated Mar. 17, 2009, with Written Opinion dated Mar. 25, 2008.
IPRP for PCT/IB2007/004586 dated Jun. 10, 2009, with Written Opinion.
Gao, et al., "Parallel-Connected Solar PV System to Address Partial and Rapidly Fluctuating Shadow Conditions", IEEE Transactions on Industrial Electronics, vol. 56, No. 5, May 2009, pp. 1548-1556.
IPRP PCT/IB2007/004610—date of issue Jun. 10, 2009.
Extended European Search Report—EP12176089.6—dated Nov. 8, 2012.
Gwon-Jong Yu et al: "Maximum power point tracking with temperature compensation of photovoltaic for air conditioning system with fuzzy controller", May 13, 1996; May 13, 1996-May 17, 1996, May 13, 1996 ( May 13, 1996), pp. 1429-1432, XP010208423.
Extended European Search Report—EP12177067.1—dated Dec. 7, 2012.
GB Combined Search and Examination Report—GB1200423.0—dated Apr. 30, 2012.
GB Combined Search and Examination Report—GB1201499.9—dated May 28, 2012.
GB Combined Search and Examination Report—GB1201506.1—dated May 22, 2012.

"Study of Energy Storage Capacitor Reduction for Single Phase PWM Rectifier", Ruxi Wang et al., Virginia Polytechnic Institute and State University, Feb. 2009.
"Multilevel Inverters: A Survey of Topologies, Controls, and Applications", José Rodriguez et al., IEEE Transactions on Industrial Electronics, vol. 49, No. 4, Aug. 2002.
Extended European Search Report—EP 08878650.4—dated Mar. 28, 2013.
Satcon Solstice—Satcon Solstice 100 kW System Solution Sheet—2010.
John Xue, "PV Module Series String Balancing Converters", University of Queensland—School of Information Technology & Electrical Engineering, Nov. 6, 2002.
Robert W Erickson, "Future of Power Electronics for Photovoltaics", IEEE Applied Power Electronics Conference, Feb. 2009.
GB Combined Search and Examination Report—GB1203763.6—dated Jun. 25, 2012.
Mohammad Reza Amini et al., "Quasi Resonant DC Link Inverter with a Simple Auxiliary Circuit", Journal of Power Electronics, vol. 11, No. 1, Jan. 2011.
Khairy Fathy et al., "A Novel Quasi-Resonant Snubber-Assisted ZCS-PWM DC-DC Converter with High Frequency Link", Journal of Power Electronics, vol. 7, No. 2, Apr. 2007.
Cheng K.W.E., "New Generation of Switched Capacitor Converters", Department of Electrical Engineering, The Hong Kong Polytechnic University, Hung Horn, Hong Kong, Power Electronics Conference, 1998, PESC 98.
1999—Per Karlsson, "Quasi Resonant DC Link Converters—Analysis and Design for a Battery Charger Application", Universitetstryckeriet, Lund University, 1999, ISBN 91-88934-14-4; Added to Lund University Publications on Jun. 4, 2012.
Hsiao Sung-Hsin et al., "ZCS Switched-Capacitor Bidirectional Converters with Secondary Output Power Amplifier for Biomedical Applications", Power Electronics Conference (IPEC) Jun. 21, 2010.
Yuang-Shung Lee et al.,"A Novel QR ZCS Switched-Capacitor Bidirectional Converter", IEEE, 2007.
Antti Tolvanen et al., "Seminar on Solar Simulation Standards and Measurement Principles", May 9, 2006 Hawaii.
J.A. Eikelboom and M.J. Jansen, "Characterisation of PV Modules of New Generations—Results of tests and simulations", Jun. 2000.
Yeong-Chau Kuo et al., "Novel Maximum-Power-Point-Tracking Controller for Photovoltaic Energy Conversion System", IEEE Transactions on Industrial Electronics, vol. 48, No. 3, Jun. 2001.
C. Liu et al., "Advanced Algorithm for MPPT Control of Photovoltaic Systems", Canadian Solar Buildings Conference, Montreal, Aug. 20-24, 2004.
Chihchiang Hua and Chihming Shen, "Study of Maximum Power Tracking Techniques and Control of DC/DC Converters for Photovoltaic Power System", IEEE 1998.
Tore Skjellnes et al., "Load sharing for parallel inverters without communication", Nordic Workshop in Power and Industrial Electronics, Aug. 12-14, 2002.
Giorgio Spiazzi at el., "A New Family of Zero-Current-Switching Variable Frequency dc-dc Converters", IEEE 2000.
Nayar, C.V., M. Ashari and W.W.L Keerthiphala, "A Grid Interactive Photovoltaic Uninterruptible Power Supply System Using Battery Storage and a Back up Diesel Generator", IEEE Transactions on Energy Conversion, vol. 15, No. 3, Sep. 2000, pp. 348?353.
Ph. Strauss et al., "AC coupled PV Hybrid systems and Micro Grids-state of the art and future trends", 3rd World conference on Photovoltaic Energy Conversion, Osaka, Japan May 11-18, 2003.
Nayar, C.V., abstract, Power Engineering Society Summer Meeting, 2000. IEEE, 2000, pp. 1280-1282 vol. 2.
D. C. Martins et al., "Analysis of Utility Interactive Photovoltaic Generation System using a Single Power Static Inverter", Asian J. Energy Environ., vol. 5, Issue 2, (2004), pp. 115-137.
Rafael C. Beltrame et al., "Decentralized Multi String PV System With Integrated ZVT Cell", Congresso Brasileiro de Automática / Sep. 12-16, 2010, Bonito—MS.
Sergio Busquets-Monge et al., "Multilevel Diode-clamped Converter for Photovoltaic Generators With Independent Voltage Control of Each Solar Array", IEEE Transactions on Industrial Electronics, vol. 55, No. 7, Jul. 2008.

(56) References Cited

OTHER PUBLICATIONS

Soeren Baekhoej Kjaer et al., "A Review of Single-Phase Grid-Connected Inverters for Photovoltaic Modules", IEEE Transactions on Industry Applications, vol. 41, No. 5, Sep./Oct. 2005.
Office Action—JP 2011-539491—dated Mar. 26, 2013.
Supplementary European Search Report—EP08857456—dated Dec. 6, 2013.
Extended European Search Report—EP14151651.8—dated Feb. 25, 2014.
Iyomori H et al: "Three-phase bridge power block module type auxiliary resonant AC link snubber-assisted soft switching inverter for distributed AC power supply", INTELEC 2003. 25th. International Telecommunications Energy Conference. Yokohama, Japan, Oct. 19-23, 2003; Tokyo, IEICE, JP, Oct. 23, 2003 (Oct. 23, 2003), pp. 650-656, XP031895550, ISBN: 978-4-88552-196-6.
Yuqing Tang: "High Power Inverter EMI characterization and Improvement Using Auxiliary Resonant Snubber Inverter", Dec. 17, 1998 (Dec. 17, 1998), XP055055241, Blacksburg, Virginia Retrieved from the Internet: URL:http:ijscholar.lib.vt.edu/theses/available/etd-012299-165108/unrestricted/THESIS. PDF, [retrieved on Mar. 5, 2013].
Yoshida M et al: "Actual efficiency and electromagnetic noises evaluations of a single inductor resonant AC link snubber-assisted three-phase soft-switching inverter", Intelec 2003. 25th. International Telecommunications Energy Conference Yokohama, Japan, Oct. 19-23, 2003; Tokyo, IEICE, JP, Oct. 23, 2003 (Oct. 23, 2003), pp. 721-726, XP031895560, ISBN: 978-4-88552-196-6.
Third party observation—EP07874025.5—dated Aug. 6, 2011.
Extended European Search Report—EP 13152967.9—dated Aug. 28, 2014.
Extended European Search Report—EP 14159696—dated Jun. 20, 2014.
Gow Ja A et al: "A Modular DC-DC Converter and Maximum Power Tracking Controller for Medium to Large Scale Photovoltaic Generating Plant" 8th European Conference on Power Electronics and Applications. Lausaane, CH, Sep. 7-9, 1999, EPE. European Conference on Power Electronics and Applications, Brussls: EPE Association, BE, vol. Conf. 8, Sep. 7, 1999, pp. 1-8, XP000883026.
Matsuo H et al: "Novel Solar Cell Power Supply System Using the Multiple-input DC-DC Converter" 20th4 SUP International telecommunications Energy Conference. Intelec '98 San Francisco, CA, Oct. 4-8, 1998, Intelec International Telecommunications Energy Conference, New York, NY: IEEE, US, Oct. 4, 1998, pp. 797-802, XP000896384.
European Patent Application No. 08845104.2, Extended Search Report, dated Jul. 31, 2014.
European Patent Application No. 11772811.3, Extended Search Report, dated Dec. 15, 2014.
European Search Report—EP App. 14159457.2—dated Jun. 12, 2015.
European Search Report and Written Opinion—EP Appl. 12150819.6—dated Jul. 6, 2015.
Alonso, O. et al. "Cascaded H-Bridge Multilevel Converter for Grid Connected Photovoltaic Generators With Independent Maximum Power Point Tracking of Each Solar Array." IEEE 34th Annual Power Electronics Specialists Conference. vol. 2, Jun. 15, 2003.
Alonso, et al., "Cascaded H-Bridge Multilevel Converter for Grid Connected Photovoltaic Generators with Independent Maximum Power Point Tracking of Each Solar Array", 2003 IEEE 34th, Annual Power Electronics Specialists Conference, Acapulco, Mexico, Jun. 15-19, 2003, pp. 731-735, vol. 2.
Chinese Office Action—CN Appl. 201280006369.2—dated Aug. 4, 2015.
Chinese Office Action—CN Appl. 201210253614.1—dated Aug. 18, 2015.
Extended European Search Report, EP Application 04753488.8, dated Apr. 29, 2015.
International Search Report from PCT/US04/16668, form PCT/ISA/220, filing date May 27, 2004.

Office Action U.S. Appl. No. 13/785,857, dated Jun. 6, 2013.
Partial Extended European Search Report, EP Application 04753488.8, dated Feb. 2, 2015.
The International Search Report (Form PCT /ISA/220) Issued in corresponding international application No. PCT/US04/16668, filed May 27, 2004.
International Search Report—PCT/US2004/016668, form PCT/ISA/220—filed May 27, 2004—dated Jan. 19, 2005.
Written Opinion of the International Searching Authority—PCT/US2004/016668, form PCT/ISA/220—filing date May 27, 2004—dated Jan. 19, 2005.
Extended European Search Report—EP Appl. 04753488.8—dated Apr. 29, 2015.
Supplementary Partial European Search Report—EP Appl. 04753488.8—dated Feb. 2, 2015.
U.S. Office Action—U.S. Appl. 13/785,857—dated Jun. 6, 2013.
European Office Action—EP Appl. 09725443.7—dated Aug. 18, 2015.
Test NPL _ Not Real.
Chinese Office Action—CN Appl. 201110349734.7—dated Oct. 13, 2015.
Chinese Office Action—CN Appl. 201210007491.3—dated Nov. 23, 2015.
European Office Action—EP Appl. 12176089.6—dated Dec. 16, 2015.
Chinese Office Action—CN Appl. 201310035223.7—dated Dec. 29, 2015.
Chinese Office Action—CN Application 201210334311.2—dated Jan. 20, 2016.
European Search Report—EP Appl. 13800859.4—dated Feb. 15, 2016.
Chinese Office Action—CN App. 201310035221.8—dated Mar. 1, 2016.
PCT/2008/058473 International Preliminary Report, 6 pages, dated Nov. 2, 2009.
International Search Report and Written Opinion, WO 2010080672, dated Aug. 19, 2010.
PCT/US2010/045352 International Search Report and Written Opinion; 12 pages; dated Oct. 26, 2010.
International Search Report and Written Opinion dated Feb. 6, 2009,. In counteprart PCT/US2008/008451, 13 pages.
European Search Report: dated Jan. 10, 2013 in corresponding EP application No. 09838022.3, 7 pages.
D. Ton and W. Bower; Summary Report of the DOE High-Tech Inverter Workshop; Jan. 2005
First Action Interview Pre-Interview Communication from U.S. Appl. No. 13/174,495 dated Jun. 18, 2014, 7 pgs.
Johnson et al., "Arc-fault detector algorithm evaluation method utilizing prerecorded arcing signatures", Photovoltaic Specialists Conference (PVSC), Jun. 2012.
Philippe Welter, et al. "Electricity at 32 kHz," Photon International, The Photovoltaic Magazine, Http://www.photon-magazine.com/archiv/articles.aspx?criteria=4&HeftNr=0807&Title=Elec . . . printed May 27, 2011).
PCT/US2009/069582 Int. Search Report—dated Aug. 19, 2010.
Chinese Office Action—CN Appl. 201210007491.3—dated Apr. 25, 2016.
CN Office Action—CN Appl. 201310004123.8—dated May 5, 2016.
Law et al, "Design and Analysis of Switched-Capacitor-Based Step-Up Resonant Converters," IEEE Transactions on Circuits and Systems, vol. 52, No. 5, published May 2005.
CN Office Action—CN Appl. 201310066888.4—dated May 30, 2016.
European Search Report—EP Appl. 13152966.1—dated Jul. 21, 2016.
European Search Report—EP Appl. 12183811.4—dated Aug. 4, 2016.
European Notice of Opposition—EP Patent 2374190—dated Jul. 19, 2016.

(56) References Cited

OTHER PUBLICATIONS

"Es werde Dunkelheit. Freischaltung von Solarmodulen im Brandfall"—"Let there be Darkness: Quality control of Solar Modules in Case of Fire"; Photon, May 2005, 75-77, ISSN 1430-5348, English translation provided.
Chinese Office Action—CN Appl. 201380029450.7—dated Jul. 28, 2016.
Chinese Office Action—CN Appl. 201310035221.8—dated Aug. 11, 2016.
Zhou, Wilson and Theo Phillips—"Industry's First 4-Switch Buck-Boost Controller Achieves Highest Efficiency Using a Single Inducutor—Design Note 369"—Linear Technology Corporation—www.linear.com—2005.
"Micropower Synchronous Buck-Boost DC/DC Converter"—Linear Technology Corporation—www.linear.com/LTC3440-2001.
Caricchi, F. et al—20 kW Water-Cooled Prototype of a Buck-Boost Bidirectional DC-DC Converter Topology for Electrical Vehicle Motor Drives—University of Rome—IEEE 1995—pp. 887-892.
Roy, Arunanshu et al—"Battery Charger using Bicycle"—EE318 Electronic Design Lab Project Report, EE Dept, IIT Bombay, Apr. 2006.
Jun. 20-25, 2004—Viswanathan, K. et al—Dual-Mode Control of Cascade Buck-Boost PFC Converter—35th Annual IEEE Power Electronics Specialists Conference—Aachen, Germany, 2004.
Zhang, Pei et al.—"Hardware Design Experiences in ZebraNet"—Department of Electrical Engineering, Princeton University—SenSys '04, Nov. 3-5, 2004.
"High Efficiency, Synchronous, 4-Switch Buck-Boost Controller"—Linear Technology Corporation-www.linear.com/LTC3780—2005.
Chomsuwan, Komkrit et al. "Photovoltaic Grid-Connected Inverter Using Two-Switch Buck-Boost Converter"—Department of Electrical Engineering, King Mongkut's Institute of Technology Ladkrabang, Thailand, National Science and Technology Development Agency, Thailand—IEEE—2002.
Midya, Pallab et al.—"Buck or Boost Tracking Power Converter"—IEEE Power Electronics Letters, vol. 2, No. 4—Dec. 2004.
Chinese Office Action—CN Appl. 201510111948.9—dated Sep. 14, 2016.
Chinese Office Action—CN Appl. 201310066888.4—dated Nov. 2, 2016.
"Power-Switching Converters—the Principle, Simulation and Design of the Switching Power (the Second Edition)", Ang, Oliva, et al., translated by Xu Dehong, et al., China Machine Press, Aug. 2010, earlier publication 2005.
European Notice of Opposition—EP Patent 2092625—dated Nov. 29, 2016.
Mar. 8, 2003—Vishay Siliconix "Si 7884DP—n-Channel 40-V (D-S) MOSFET" (2003).
Chinese Office Action—CN 201510423458.2—dated Jan. 3, 2017 (english translation provided).
Chinese Office Action—CN 201410098154.9—dated Mar. 3, 2017 (english translation provided).
European Search Report—EP Appl. 13150911.9—dated Apr. 7, 2017.
Chinese Office Action and Search Report—CN 201510578586.4—dated Apr. 19, 2017.
Jul. 7, 2017—European Search Report—EP 17158978.1.
Howard et al, "Relaxation on a Mesh: a Formalism for Generalized Localization." Proceedings of the IEEE/RSJ International Conference on Intelligent Robots and Systems (IROS 2001). Wailea, Hawaii, Oct. 2001.
Ciobotaru, et al., Control of single-stage single-phase PV inverter, Aug. 7, 2006.
International Search Report and Written Opinion for PCT/IB2007/004591 dated Jul. 5, 2010.
European Communication for EP07873361.5 dated Jul. 12, 2010.
European Communication for EP07874022.2 dated Oct. 18, 2010.
European Communication for EP07875148.4 dated Oct. 18, 2010.

Chen, et al., "A New Low-Stress Buck-Boost Converter for Universal-Input PFC Applications", IEEE Applied Power Electronics Conference, Feb. 2001, Colorado Power Electronics Center Publications.
Chen, et al., "Buck-Boost PWM Converters Having Two Independently Controlled Switches", IEEE Power Electronics Specialists Conference, Jun. 2001, Colorado Power Electronics Center Publications.
Esram, et al., "Comparison of Photovoltaic Array Maximum Power Point Tracking Techniques", IEEE Transactions on Energy Conversion, vol. 22, No. 2, Jun. 2007, pp. 439-449.
Walker, et al., "Photovoltaic DC-DC Module Integrated Converter for Novel Cascaded and Bypass Grid Connection Topologies-Design and Optimisation", 37th IEEE Power Electronics Specialists Conference, Jun. 18-22, 2006, Jeju, Korea.
Geoffrey R. Walker Affidavit re: U.S. Appl. No. 11/950,307, submitted in an IDS for U.S. Appl. No. 11/950,271 on Mar. 9, 2010.
Geoffrey R. Walker Affidavit re: U.S. Appl. No. 11/950,271, submitted in an IDS for U.S. Appl. No. 11/950,271 on Mar. 9, 2010.
International Search Report for PCT/IB2007/004610 dated Feb. 23, 2009.
International Search Report for PCT/IB2007/004584 dated Jan. 28, 2009.
International Search Report for PCT/IB2007/004586 dated Mar. 5, 2009.
International Search Report for PCT/IB2007/004643 dated Jan. 30, 2009.
International Search Report for PCT/US2008/085736 dated Jan. 28, 2009.
International Search Report for PCT/US2008/085754 dated Feb. 9, 2009.
International Search Report for PCT/US2008/085755 dated Feb. 3, 2009.
Kajihara, et al., "Model of Photovoltaic Cell Circuits Under Partial Shading", 2005 IEEE, pp. 866-870.
Knaupp, et al., "Operation of a 10 KW PV Façade with 100 W AC Photovoltaic Modules", 1996 IEEE, 25th PVSC, May 13-17, 1996, pp. 1235-1238, Washington, DC.
Myrzik, et al., "String and Module Integrated Inverters for Single-Phase Grid Connected Photovoltaic Systems—A Review", Power Tech Conference Proceedings, 2003 IEEE Bologna, Jun. 23-26, 2003, p. 8, vol. 2.
Chen, et al., "Predictive Digital Current Programmed Control", IEEE Transactions on Power Electronics, vol. 18, Issue 1, Jan. 2003.
Wallace, et al., "DSP Controlled Buck/Boost Power Factor Correction for Telephony Rectifiers", Telecommunications Energy Conference 2001, INTELEC 2001, Twenty-Third International, Oct. 18, 2001, pp. 132-138.
Alonso, "A New Distributed Converter Interface for PV Panels", 20th European Photovoltaic Solar Energy Conference, Jun. 6-10, 2005, Barcelona, Spain, pp. 2288-2291.
Alonso, "Experimental Results of Intelligent PV Module for Grid-Connected PV Systems", 21st European Photovoltaic Solar Energy Conference, Sep. 4-8, 2006, Dresden, Germany, pp. 2297-2300.
Enslin, "Integrated Photovoltaic Maximum Power Point Tracking Converter", IEEE Transactions on Industrial Electronics, vol. 44, No. 6, Dec. 1997, pp. 769-773.
Sep. 7-9, 1999—Lindgren, "Topology for Decentralised Solar Energy Inverters with a Low Voltage AC-Bus", Chalmers University of Technology, Department of Electrical Power Engineering, EPE '99—Lausanne.
Nikraz, "Digital Control of a Voltage Source Inverter in a Photovoltaic Applications", 2004 35th Annual IEEE Power Electronics Specialists Conference, Aachen, Germany, 2004, pp. 3266-3271.
Orduz, "Evaluation Test Results of a New Distributed MPPT Converter", 22nd European Photovoltaic Solar Energy Conference, Sep. 3-7, 2007, Milan, Italy.
Palma, "A Modular Fuel Cell, Modular DC-DC Converter Concept for High Performance and Enhanced Reliability", IEEE 2007, pp. 2633-2638.
Sep. 16-19, 1996—Quaschning, "Cost Effectiveness of Shadow Tolerant Photovoltaic Systems", Berlin University of Technology, Institute of Electrical Energy Technology, Renewable Energy Section. EuroSun '96, pp. 819-824.

(56) References Cited

OTHER PUBLICATIONS

Roman, "Intelligent PV Module for Grid-Connected PV Systems", IEEE Transactions on Industrial Electronics, vol. 52, No. 4, Aug. 2006, pp. 1066-1073.
Roman, "Power Line Communications in Modular PV Systems", 20th European Photovoltaic Solar Energy Conference, Jun. 6-10, 2005, Barcelona, Spain, pp. 2249-2252.
Uriarte, "Energy Integrated Management System for PV Applications", 20th European Photovoltaic Solar Energy Conference, Jun. 6-10, 2005, Barcelona, Spain, pp. 2292-2295.
Walker, "Cascaded DC-DC Converter Connection of Photovoltaic Modules", IEEE Transactions on Power Electronics, vol. 19, No. 4, Jul. 2004, pp. 1130-1139.
Oct. 3-7, 1999—Matsui, et al., "A New Maximum Photovoltaic Power Tracking Control Scheme Based on Power Equilibrium at DC Link", IEEE, 1999, pp. 804-809.
Hou, et al., Application of Adaptive Algorithm of Solar Cell Battery Charger, Apr. 2004.
Stamenic, et al., "Maximum Power Point Tracking for Building Integrated Photovoltaic Ventilation Systems", 2000.
International Preliminary Report on Patentability for PCT/IB2008/055092 dated Jun. 8, 2010.
International Search Report for PCT/IB2008/055092 dated Sep. 8, 2009.
International Search Report and Opinion of International Patent Application WO2009136358 (PCT/IB2009/051831), dated Sep. 16, 2009.
Informal Comments to the International Search Report dated Dec. 3, 2009.
PCT/IB2010/052287 International Search Report and Written Opinion dated Sep. 2, 2010.
UK Intellectual Property office, Combined Search and Examination Report for GB1100450.4 under Sections 17 and 18 (3), dated Jul. 14, 2011.
Jain, et al., "A Single-Stage Grid Connected Inverter Topology for Solar PV Systems with Maximum Power Point Tracking", IEEE Transactions on Power Electronics, vol. 22, No. 5, Sep. 2007, pp. 1928-1940.
Lynch, et al., "Flexible DER Utility Interface System: Final Report", Sep. 2004-May 2006, Northern Power Systems, Inc., Waitsfield, Vermont B. Kroposki, et al., National Renewable Energy Laboratory Golden, Colorado Technical Report NREL/TP-560-39876, Aug. 2006.
Schimpf, et al., "Grid Connected Converters for Photovoltaic, State of the Art, Ideas for improvement of Transformerless Inverters", NORPIE/2008, Nordic Workshop on Power and Industrial Electronics, Jun. 9-11, 2008.
Sandia Report SAND96-2797 I UC-1290 Unlimited Release, Printed Dec. 1996, "Photovoltaic Power Systems and The National Electrical Code: Suggested Practices", by John Wiles, Southwest Technology Development Institute New Mexico State University Las Cruces, NM.
Feb. 10, 2020—EP Search Report—EP 19215309.6.

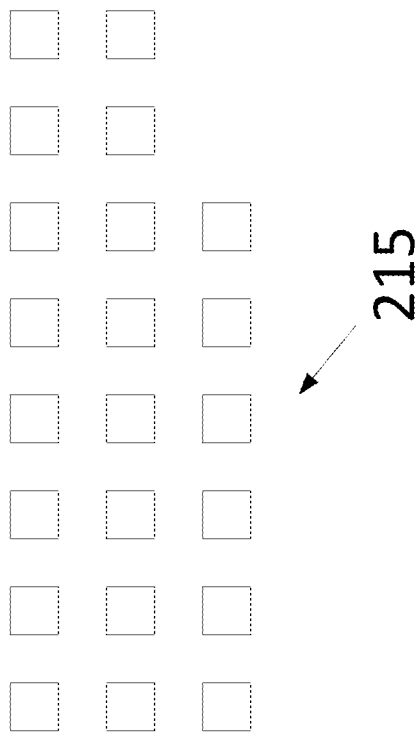

physical_map.txt

```
Row 1: 20 devices, 1 meter apart
Distance between row 1 and row 2: 4m
Row 2: 20 devices, 1 meter apart
Distance between row 2 and row 3: 4m
Row 2: 30 devices, 1 meter apart
Distance between row 2 and row 3: 8m
```

Example of step 100

Example of step 100

Example of step 112

Fig. 8B

APPARATUS AND METHOD FOR DETERMINING AN ORDER OF POWER DEVICES IN POWER GENERATION SYSTEMS

CROSS-REFERENCE TO RELATED APPLICATIONS

The present application is a continuation in part of U.S. non-provisional patent application Ser. No. 16/217,679, filed Dec. 12, 2018, entitled "Apparatus and Method for Determining an Order of Power Devices in Power Generation Systems," which is a continuation in part of U.S. non-provisional patent application Ser. No. 15/447,981, filed Mar. 2, 2017, now U.S. Pat. No. 10,061,957, issued Aug. 28, 2018, entitled "Methods for Mapping Power Generation Installations." The present application claims priority to U.S. non-provisional patent application Ser. No. 16/217,679, filed Dec. 12, 2018, entitled "Apparatus and Method for Determining an Order of Power Devices in Power Generation Systems," U.S. non-provisional patent application Ser. No. 15/447,981, filed Mar. 2, 2017, now U.S. Pat. No. 10,061,957, issued Aug. 28, 2018, entitled "Methods for Mapping Power Generation Installations," U.S. provisional patent application Ser. No. 62/303,017, filed Mar. 3, 2016, entitled "Methods for Mapping Power Generation Installations," and U.S. provisional patent application Ser. No. 62/381,298, filed Aug. 30, 2016, entitled "Methods for Mapping Power Generation Installations," which are hereby incorporated by reference in their entirety.

BACKGROUND

Photovoltaic (PV) installations may include a large number of components and wide variety of devices. A PV installation may include one or more arrays of PV generators (such as solar modules, solar cells, solar panels), one or more inverter(s), communication devices, and PV power devices such as DC/DC: converters, DC-AC microinverters, combiner boxes, and Maximum-Power-Point-Tracking (MPPT) devices. Some installations may further include batteries. Some of the electronic modules may be integrated with the PV modules and may provide other functions such as monitoring of performance and/or protection against theft. In case of the system experiencing power loss or in case of a potentially unsafe condition, it may be desirable for a system maintenance operator to physically locate a particular device (such as solar panel, DC-DC converter or micro-inverter) that may be potentially responsible for the power loss or potentially unsafe condition.

Operators and monitoring bodies of PV installations might not always have access to a map which indicates the location of each PV module, identified by a serial number. In such cases, troubleshooting problems may be time consuming, since locating a specific module, such as a malfunctioning module, may be difficult. In other instances, a map of the installation may be obtained by significant manual effort, such as a maintenance worker walking through the installation and copying ID numbers off modules, denoting their location on a map. When performed manually, human error may also cause inaccurate information to be recorded in the maps.

There is a need for an automatic or semi-automatic method of generating physical maps of PV installations, to save work and reduce errors, while allowing system monitoring personnel to obtain the benefits of having a map which indicates the locations and ID numbers of PV modules.

SUMMARY

The following summary is a short summary of some of the inventive concepts for illustrative purposes only, and is not intended to limit or constrain the examples in the detailed description. One skilled in the art will recognize other novel combinations and features from the detailed description.

Embodiments herein may employ methods for generating maps of PV installations. Some illustrative embodiments may be fully automatic, and some may require manual steps.

In illustrative methods, a suitable localization algorithm may be utilized to measure or estimate the global coordinates of photovoltaic (PV) devices, and/or the distance and/or angle between different devices, and/or the distance and/or angle between devices and known locations. Some embodiments may include obtaining the global coordinates of devices. Some embodiments may produce a map displaying the physical placement and location of devices along with identifying information (such as ID or serial numbers). Some embodiments may utilize high-accuracy Global Positioning System (GPS) technology to map the installation. For example, some illustrative methods may include scanning an identifying barcode on PV devices while using GPS to obtain the global coordinates at each scanned location. In some embodiments, a map not including identifying module information may be further utilized to match specific modules to the measured GPS coordinates. Some embodiments may include PV devices transmitting and receiving wireless signals from one another, and using measured or estimated quantities such as Received Signal Strength Indication (RSSI), Angle of Arrival (AOA, also known as Direction of Arrival, or DOA) and/or Time Difference of Arrival (TDOA) to estimate relative distances and/or angles between modules. In some embodiments, Power Line Communication (PLC) methods may be used along with Time Domain Reflection (TDR) techniques to estimate the location of a set of PV devices within a PV installation. The set of estimates may be processed to obtain an accurate physical map of the installation, including identifying where each PV module and/or PV device is physically located.

In other illustrative methods, photovoltaic modules may be operated to increase and decrease the electrical power produced by the photovoltaic modules, which may result in a change of temperature at the photovoltaic modules. A thermal imaging device may be used to capture thermal images of a group of photovoltaic modules under different power production and temperature conditions, and suitable methods may analyze and aggregate the thermal images to obtain an accurate physical map of the installation.

In other illustrative methods, aspects of electronic systems may be used to determine the order of photovoltaics (PV) panels connected in a serial string. Each PV panel may be connected to an electronic device (such as a power converter) as an intermediate device between the PV panel and the serial string. The device may set or change an electrical parameter, such as an impedance, a voltage, and/or the like, measured or reflected at the electrical conductor that serially connects PV panels. When a device connected as part of the string, such as a device connected at the end of the string, the middle of the string, the beginning of the string, and/or the like, transmits a signal along the conductor, the power devices (such as devices including converters) may each measure the received signal at each power converter and transmit the recorded signal to the same or a different device to analyze the order of the devices of the string.

In other illustrative methods, an order of power devices connected in a serial string may be determined. A command is transmitted, to at least one first power device of a plurality of power devices, to change an output electrical parameter. At least one electrical signal is caused to be transmitted from at least one second power device of the plurality of power devices. At least one measured value responsive to the electrical signal is received from at least one of the plurality of power devices. A determination is made, by analyzing the at least one measured value, which ones of the plurality of power devices are ordered in the serial string between the at least one first power device and the at least one second power device.

In other illustrative embodiments, a power device includes a communication interface configured to receive commands; at least one hardware controller; at least two output conductors; and an adjustment circuit configured to adjust an output electrical parameter of at least one of the at least two output conductors. The adjustment is responsive to the received command, and wherein the at least one hardware controller is configured to (i) perform the adjustment based on the received command, and (ii) measure an electrical signal transmitted on at least one of the at least two output conductors.

In other illustrative embodiments, an ordering of power devices of a power generation system is provided, wherein the power devices are connected in a serial string. The power generation system includes a plurality of power devices each comprising a plurality of electrical output conductors, wherein each of the plurality of power devices is configured to adjust an electrical output parameter of the plurality of electrical output conductors. The power generation system also includes at least one transmitting power device of the plurality of power devices configured to transmit an electrical signal. The power generation system further includes at least one receiving power device of the plurality of power devices configured to receive and record the electrical signal, wherein the at least one receiving power device comprises a communication interface for sending a recorded electrical signal. The power generation also includes at least one hardware processor. The hardware processor is configured to command at least one of the plurality of power devices to adjust an electrical output parameter. The hardware processor is also configured to command the at least one transmitting power device to transmit the electrical signal. The hardware processor is further configured to command the at least one receiving power device configured to receive the electrical signal, record at least one value of the electrical signal, and send the recorded electrical signal value. The hardware processor is also configured to receive the recorded electrical signal values. The hardware processor is still further configured to analyze the recorded electrical signal values to determine an ordering at least in part of the plurality of power devices.

As noted above, this summary is merely a summary of some of the features described herein. It is not exhaustive, and it is not to be a limitation on the claims.

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures. A more complete understanding of the present disclosure and the advantages thereof may be acquired by referring to the following description in consideration of the accompanying drawings, in which like reference numbers indicate like features, and wherein:

FIG. 2B illustrates a non-identifying map (NIM), according to one or more illustrative aspects of the disclosure.

FIG. 8B illustrates results of various stages of installation mapping, according to one or more illustrative aspects of the disclosure.

DETAILED DESCRIPTION

In the following description of various illustrative embodiments, reference is made to the accompanying drawings, which form a part hereof, and in which is shown, by way of illustration, various embodiments in which aspects of the disclosure may be practiced. It is to be understood that other embodiments may be utilized and structural and functional modifications may be made, without departing from the scope of the present disclosure.

Monitoring of PV installations may include data collected by a central control system which monitors the power output by the PV installation and identifies potentially problematic operating conditions or safety hazards. When the installation experiences power loss, it may be desirable to ascertain whether it is due to environmental conditions or from malfunctions and/or poor maintenance of the components of the PV installation. Furthermore, it may be desirable to easily physically locate the particular module (such as solar panel, DC-DC converter or micro-inverter, combiner box) that may be responsible for the power loss. A map of the PV installation which displays the physical location of the various PV modules or devices (identified by ID numbers, for example) comprising the installation may assist in rapid location of the desired module and fast resolution of the problem. For example, in case of a decrease in the power output by a PV panel, a power device coupled to the panel may send information to a centralized control unit reporting the loss of power. The information may be transmitted using power line communications, wireless communication, acoustic communication or other protocols, and may include the ID number of the PV device. When the low power output persists, a maintenance worker may need to physically go to the underperforming panel and investigate the reason behind the low power.

A Physical Identification Map (PIM) may refer to a physical map indicating the location of modules within a photovoltaic (PV) installation, including attaching identifying information such as serial or ID numbers to some or all of the modules displayed in the map. A Non-Identifying Map (NIM) may refer to a map that describes the location of modules but does not identify a specific module at each location.

Figure 1:
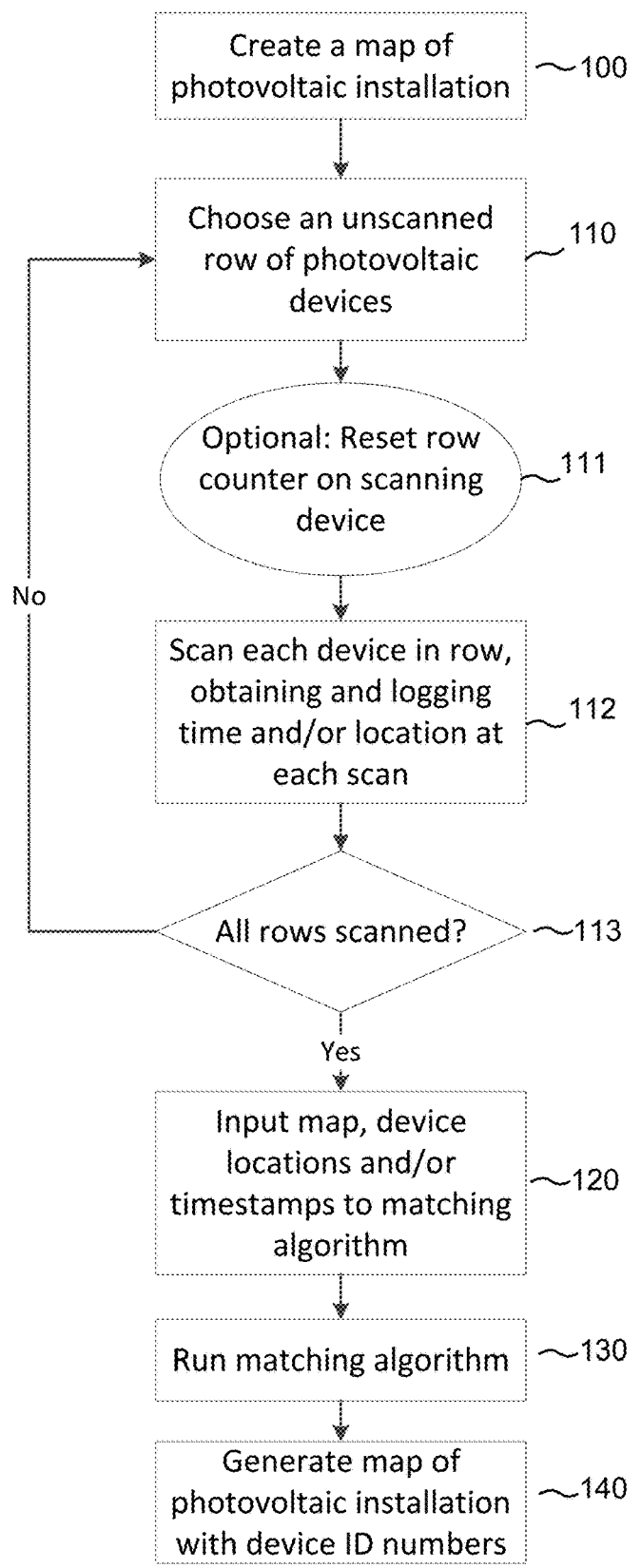
FIG. 1 is a flow diagram of a method for generating a photovoltaic (PV) installation map, according to one or more illustrative aspects of the disclosure.

FIG. 1 is a flow diagram of a method for generating a PV installation map according to one or more illustrative aspects of the disclosure. In one or more embodiments, the method of FIG. 1, or one or more steps thereof, may be performed by one or more computing devices or entities. For example, portions of the method of FIG. 1 may be performed by components of a computer system. The method of FIG. 1, or one or more steps thereof, may be embodied in computer-executable instructions that are stored in a computer-readable medium, such as a non-transitory computer-readable medium. The steps in the method of FIG. 1 might not all be performed in the order specified and some steps may be omitted or changed in order.

At step 100, an initial map of a PV installation layout may be created. The initial map may be a physical map. For example, at step 100, measured. Global Positioning System (GPS) coordinates may be used to match modules to physical locations on a PIM. The initial map may be created and represented in various ways. In one implementation, the initial map may be represented as a text file which includes information regarding the number of devices, the number of rows, the distances between devices, the distances between rows, or any other information relevant to the physical layout of the installation. In another implementation, the basic map may be automatically generated by installation-design software, and the layout information may be encoded in a digital file generated by the installation-design software.

In some embodiments, step 100 might not be performed. For example, step 100 might not be performed when there is high enough accuracy in other steps of the method to compensate for the lack of an initial map.

In steps 110-13, power modules in the PV installation may be scanned. For example, the power modules may be scanned by rows. At step 110 each device in a row of the PV installation may be scanned. The scanning may be carried out using a locating device that combines scanning capabilities with a GPS receiver. The locating device may further include one or more of a clock, memory, communication means and a processing unit. Scanning may comprise utilizing a barcode reader to read a barcode which is attached to the module being scanned (such as a barcode on a sticker which is stuck to the module), utilizing a camera to identify serial numbers, obtaining identifying information from an RFID tag, or any combinations thereof. The locating device may be a smartphone running an application which combines barcode reading or serial number identifying with UPS localization. The scanning may comprise taking a picture of an identifying element of the module (such as an identification sticker) which may later be processed to identify the module based on the picture. In some embodiments, in step 111 the user may configure the device (such as by press of a button) at the start of each row to begin logging a row of the installation. In some embodiments, the locating device may use time or spatial differences between scans to determine when a new row is being scanned. For example, when a time between scans is above a certain threshold, the locating device may determine that a new row is being scanned.

At step 112 each PV device in the current row may be scanned. Each time a device is scanned, the module's identifying information (such as barcode, ID number, picture, RFID tag) as well as the GPS coordinates of the locating device at the time of scanning may be logged and stored into memory. The identifying information corresponding to a device may be unique. A timestamp of the time of scanning may also be logged or stored.

At step 113 it may be determined when all rows of the installation have been scanned. For example, it may be determined when A rows within a specified area have been scanned. When all rows have been scanned, the method may proceed to step 120. Otherwise, steps 110-13 may be repeated. Steps 110-13 may be repeated until all rows of the installation, or all devices within the installation, have been scanned.

At step 120, the data (such as coordinates, timestamps) collected during steps 110-13 may be collected and input to a matching algorithm. The map created in step 100 may also be input to the matching algorithm.

Figure 2A:
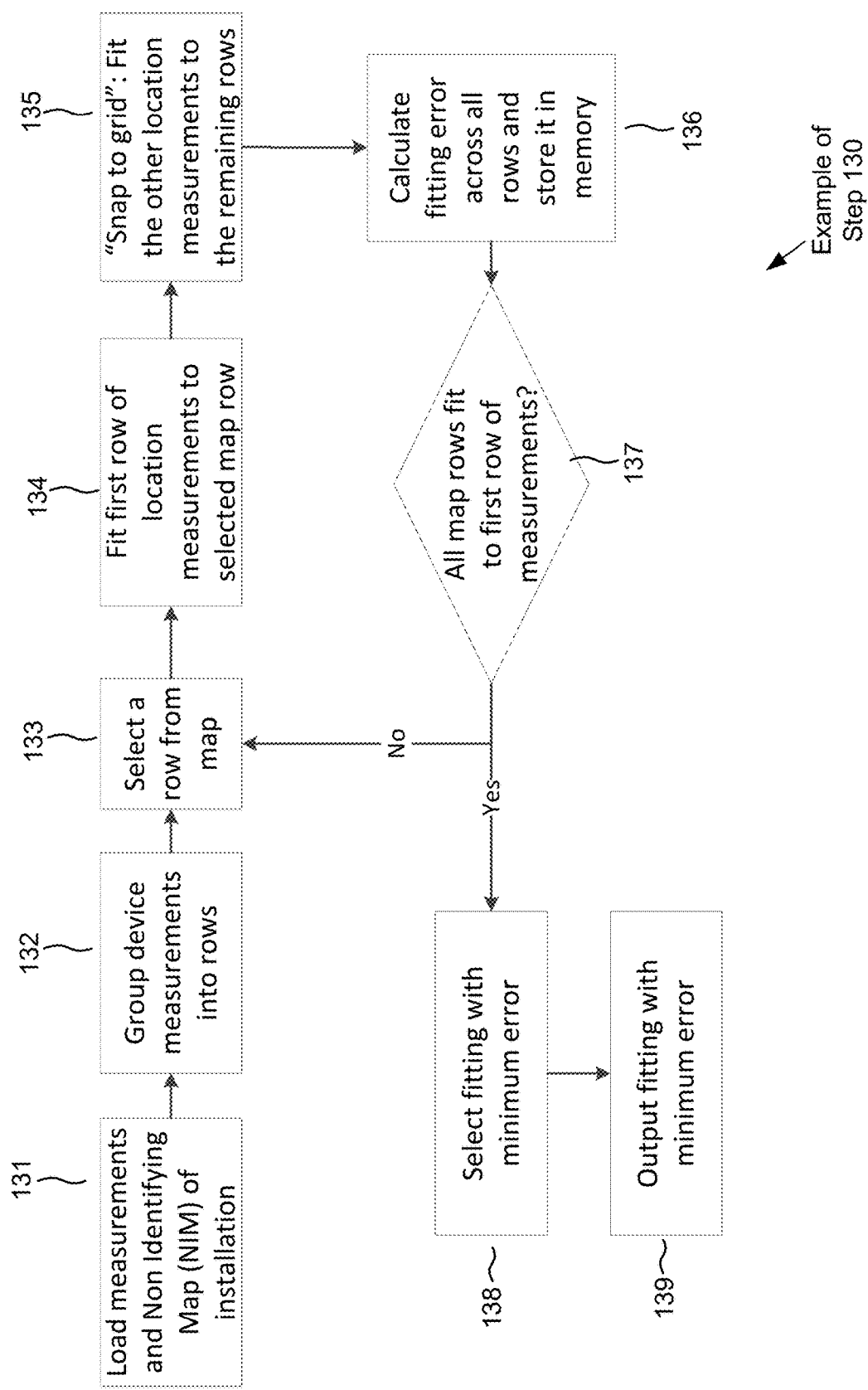
FIG. 2A is a flow diagram of a method for fitting measured locations to a map, according to one or more illustrative aspects of the disclosure.

At step 130, the matching algorithm may be run by an appropriate computing device, such as a computer, server, DSP, microcontroller, ASIC or FPGA. The algorithm may use the inputted data and/or the map to determine which PV module is located at each of the locations indicated on the map. FIG. 2A, further described below, is an example of a method that may be used by a matching algorithm at step 130.

At step 140, the matching algorithm may generate, based on the input received at step 120, a map of the PV installation. The map may comprise one or more module identifiers. The module identifiers may be associated with a location in the map. For example, the algorithm may output a map with module identification information being displayed at each module's location. The map may be physically printed onto a sheet of paper, or viewed on an appropriate electronic device such as a computer monitor, tablet or smartphone.

FIG. 2A is a flow diagram of a method for fitting measured locations to a map according to one or more illustrative aspects of the disclosure. In one or more embodiments, the method of FIG. 2A, or one or more steps thereof, may be performed by one or more computing devices or entities. For example, portions of the method of FIG. 2A may be performed by components of a computer system. The method of FIG. 2A, or one or more steps thereof, may be embodied in computer-executable instructions that are stored in a computer-readable medium, such as a non-transitory computer-readable medium. The steps in the method of FIG. 2A might not all be performed in the order specified and some steps may be omitted or changed in order.

At step 131, a map and/or GPS coordinates may be received. For example, the map and/or GPS coordinates may be loaded from memory. The map and/or GPS coordinates may have been measured when scanning PV modules. The received map may comprise a non-identifying (NIM), which might not include identifying module information.

At step 132, the GPS measurements may be grouped into rows. In some embodiments, the grouping into rows may be done while scanning one or more modules. For example, a scanning operator may press a reset button when beginning to scan, or prior to scanning, each row. In some embodiments, the grouping of measurements into rows may be carried out by a computer algorithm, using methods further described herein. The grouping of measurements into rows may be helpful, for example, when the PIM is generated using an NIM, which already indicates the number of rows and the length of each row. In embodiments in which the PIM is generated without benefit of a pre-existing NIM, the grouping into rows may allow for filtering of measurement noise. For example, filtering, or reduction, of measurement noise may be performed by determining the standard distance and angle between adjacent panels in a same row. Steps 133-37 may be performed iteratively, until the first row of scanned samples has been considered as a candidate to represent each row of the installation. At step 133, a row is selected from the NIM. At step 134, the first row of location measurements may be fit to the selected row. At step 135, having fit the first row of location measurements to the selected row, the other rows of measured samples may be fit to the other rows of the NIM, using "snap to grid" or similar methods. In some embodiments, attempted fitting of the other rows of measured samples to the other NIM rows may be carried out multiple times, using multiple row orientations, before an optimal fitting (by an appropriate criterion such as Least Squares) is selected.

At step 136, a total fitting error may be calculated. The total fitting error may be based on the estimated locations of each device and/or the locations indicated by the NIM. Estimated individual errors of each device may be aggregated by an appropriate criterion, such as Sum of Squares. The selected fitting and resultant aggregated error may be stored. For example, the selected fitting and resultant aggregated error may be stored in an appropriate memory device.

At step 137, the method may determine when all NIM rows have been considered as the row represented by the first row of measurements. When some NIM rows have not been considered the method may loop back to step 134. For example, the NIM rows that have not been considered may be candidates for consideration in later iterations. When it is determined, at step 137, that all NIM rows have been considered, the method may proceed to step 138.

At step 138, one or more aggregated errors calculated and stored at step 136 may be compared to one another to select a fitting. In one implementation, a fitting corresponding to the minimum aggregated error may be selected. Other factors may be considered at step 138.

At step 139, the fitting selected at step 138 may be output, transforming the NIM to a PIM that includes the fitting selected at step 138. In some embodiments, steps 134-37 may be modified such that instead of fitting the first row of measurements to each row in the NIM, each row of measurements is fitted to a certain row of the NIM (for example, the first row of the NIM).

Figure 2C:
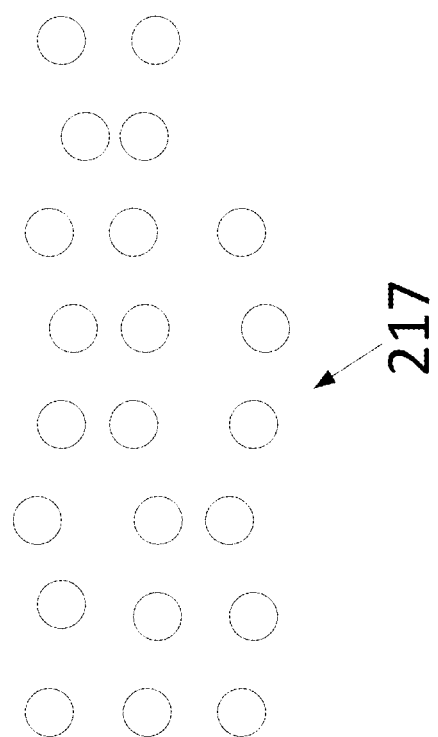
FIG. 2C illustrates an estimated layout map (ELM), according to one or more illustrative aspects of the disclosure.

Reference is now made to FIGS. 2B and 2C, which depict illustrative examples of a PV installation which may be mapped according to illustrative embodiments. FIG. 2B illustrates a Non-Identifying Map (NIM) 215 that may be generated, using methods described herein, to reflect a layout of the PV installation. FIG. 2C illustrates an Estimated Layout Map (ELM) 217 of the installation, which may be obtained using methods described herein to estimate the absolute locations of PV devices or the locations with regard to one another. FIGS. 2B and 2C may correspond to a same PV installation.

Figure 2D:
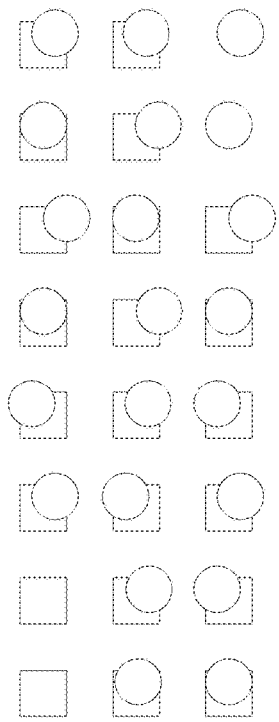
FIG. 2D illustrates how illustrative methods may be applied to illustrative PV systems, according to one or more illustrative aspects of the disclosure.
Figure 2D:
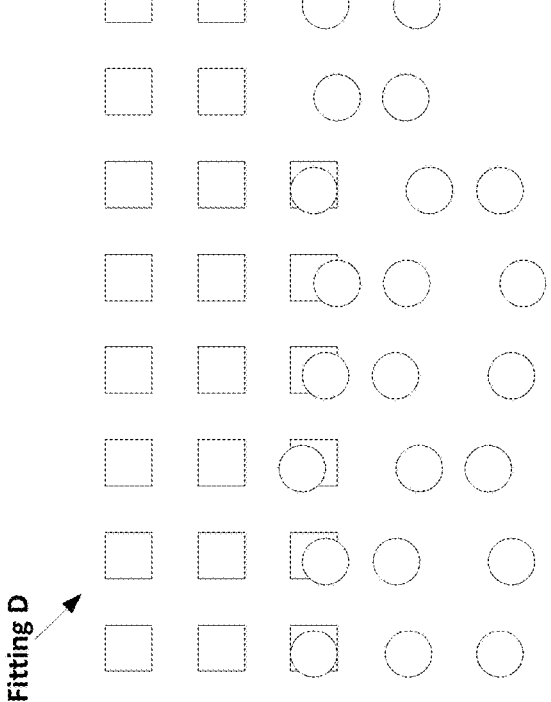
Figure 2D:
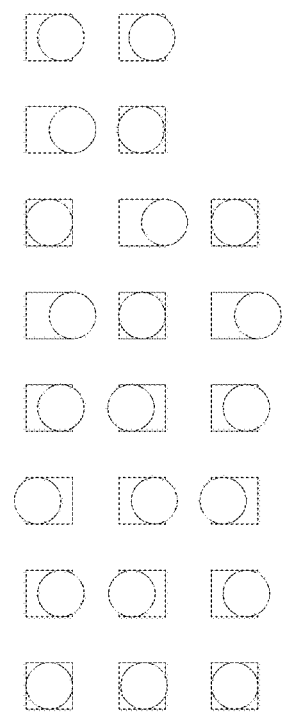
Figure 2D:
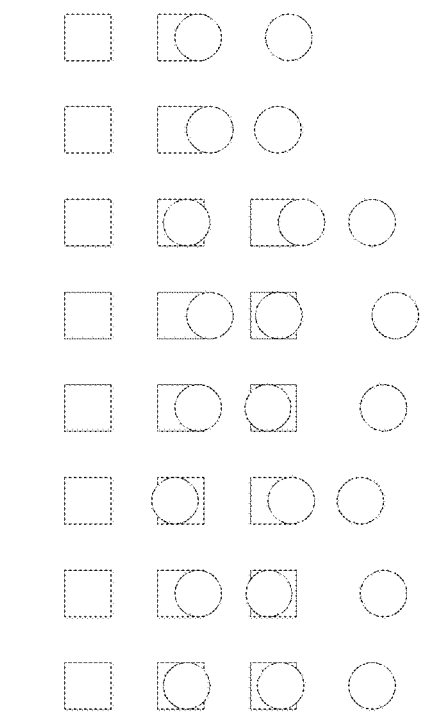

In FIGS. 2B-D, the illustrated squares may correspond to device locations according to the NIM, and the circles may correspond to device locations according to measured data corresponding to the devices. In certain instances, the PV system may be of a non-symmetric layout. For example, in the NIM 215, one row has two fewer devices than the other two rows. In certain instances, because of measurement inaccuracies and/or noise, an ELM, such as the ELM 217, may contain inaccuracies.

Reference is now made to FIG. 2D, which illustrates aspects of steps 134-36, described above in FIG. 2A, as applied to the PV system illustrated in FIGS. 2B-C. In Fitting A, at step 133, the first row of the NIM is selected. At step 134, the first row of location measurements is fit to the selected first row of the NIM, and at step 135 the remaining two rows are fit to the NIM in a way that minimizes the total mismatch between the NIM-devices (depicted as squares) and the ELM devices (depicted as circles). At step 136, the total fitting error is calculated. Different error measures may be considered. For example, a sum-of-squares error measure may be considered. If, for example three devices are estimated to be at the following locations along the KY-plane: (0,0), (1,0) and (2,0), while according to the NIM the three devices are actually located at (0, 0.5), (1, 1.5) and (2,0), the square of the estimation error for the first device may be $(0-0)^2+(0-0.5)^2=0.25$. Similarly, the squared estimation error for the second device may be $(1-1)^2+(0-1.5)^2=2.25$. The third device location is perfectly estimated, with zero error, leading to a total error of 2.5. Other error measures may be considered as well, such as Sum of Absolute, Errors, or weighted variations which may take other considerations into account and/or add penalty factors to certain types of errors.

At step 137, the method may loop back to step 133, as the first row of measurements has been fit to the first NIM, and other map rows have not been fit. At step 134, the first row of measurements is fit to the second NIM row, and at step 135, the other EL rows are "snapped" to the NIM and fitted to the other NIM rows, as shown in Fitting B. The matching illustrated in Fitting B is less successful than the one shown in Fitting A, and the fitting error calculated in step 136 may be higher. At step 137, the method may determine that the first row of measurements has not yet been fit to one of the NIM rows (the third), and it may loop back to step 133 and select the third NIM row. At step 134, the first row of measurements may be fit to the third NIM row, and at step 135, the other EL rows may be "snapped" to the NIM and fitted to the other NIM rows. Several fittings are possible, as illustrated by Fitting C and Fitting D, and by various methods the algorithm may be configured to consider multiple fittings and select one of the fittings, for example, a fitting with minimal estimation error or a least estimation error. At step 136 the fitting error may be calculated, and at step 137 the algorithm may determine that the first row of measurements has now been fit to all of the NIM rows, and may proceed to step 138. At step 138, the algorithm may determine that Fitting A has the lowest estimation error of all the fittings considered, and may output Fitting A at step 139.

Figure 3A:
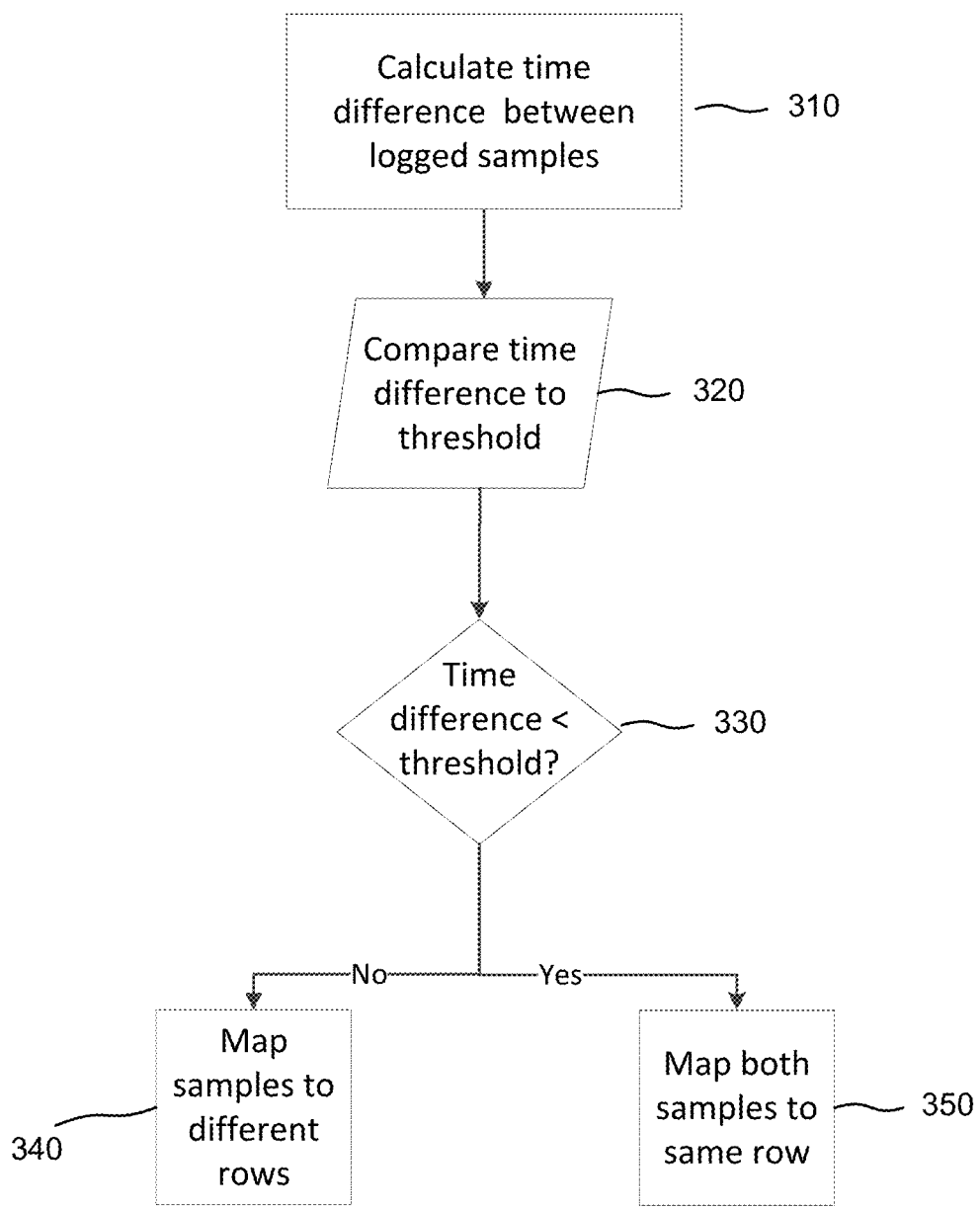
FIG. 3A is a flow diagram of a method for generating an installation map based on time and location, according to one or more illustrative aspects of the disclosure.

FIG. 3A is a flow diagram of a method for generating an installation map based on time and location according to one or more illustrative aspects of the disclosure. In one or more embodiments, the method of FIG. 3A, or one or more steps thereof, may be performed by one or more computing devices or entities. For example, portions of the method of FIG. 3A may be performed by components of a computer system. The method of FIG. 3A, or one or more steps thereof, may be embodied in computer-executable instructions that are stored in a computer-readable medium, such as a non-transitory computer-readable medium. The steps in the method of FIG. 3A might not all be performed in the order specified and some steps may be omitted or changed in order.

The method of FIG. 3A may be used for grouping device measurements into rows. For example, the method of FIG. 3A may be performed at step 132 of FIG. 2A. According to this illustrative embodiment, each row of an installation may be processed such that the time that elapses between scanning a device in the row and the adjacent device in the row is less than a certain threshold, such as, for example, 10 seconds. The installer may be instructed to scan each device in the row rapidly, and take a short break between rows. The scanning device may be configured to record the time each device was scanned.

At step 310, a time difference between each pair of consecutive scans may be calculated. At step 320 the calculated time differences may be compared to a threshold amount of time. In some embodiments the threshold may be preset or predefined, and in some embodiments the threshold may be derived from calculated time differences (such as the threshold may be twenty percent longer than an average time difference between consecutive scans). At step 330, when the time difference between the timestamps of scanning two consecutive devices is above the threshold, the two devices may be determined to be in different rows, and may be mapped to different rows at step 340. When the time difference is below the threshold, the two devices may be determined to be in a same row, and mapped to the same row at step 350. Alternatively, or in addition to the method described above, the installer may be instructed to press a "New Row" button on his or her device between rows, which may indicate completing the scanning of one row and beginning another. The "New Row" button may be used to override timing considerations, and/or to compensate for inconsistent scanning speed.

Figure 3B:
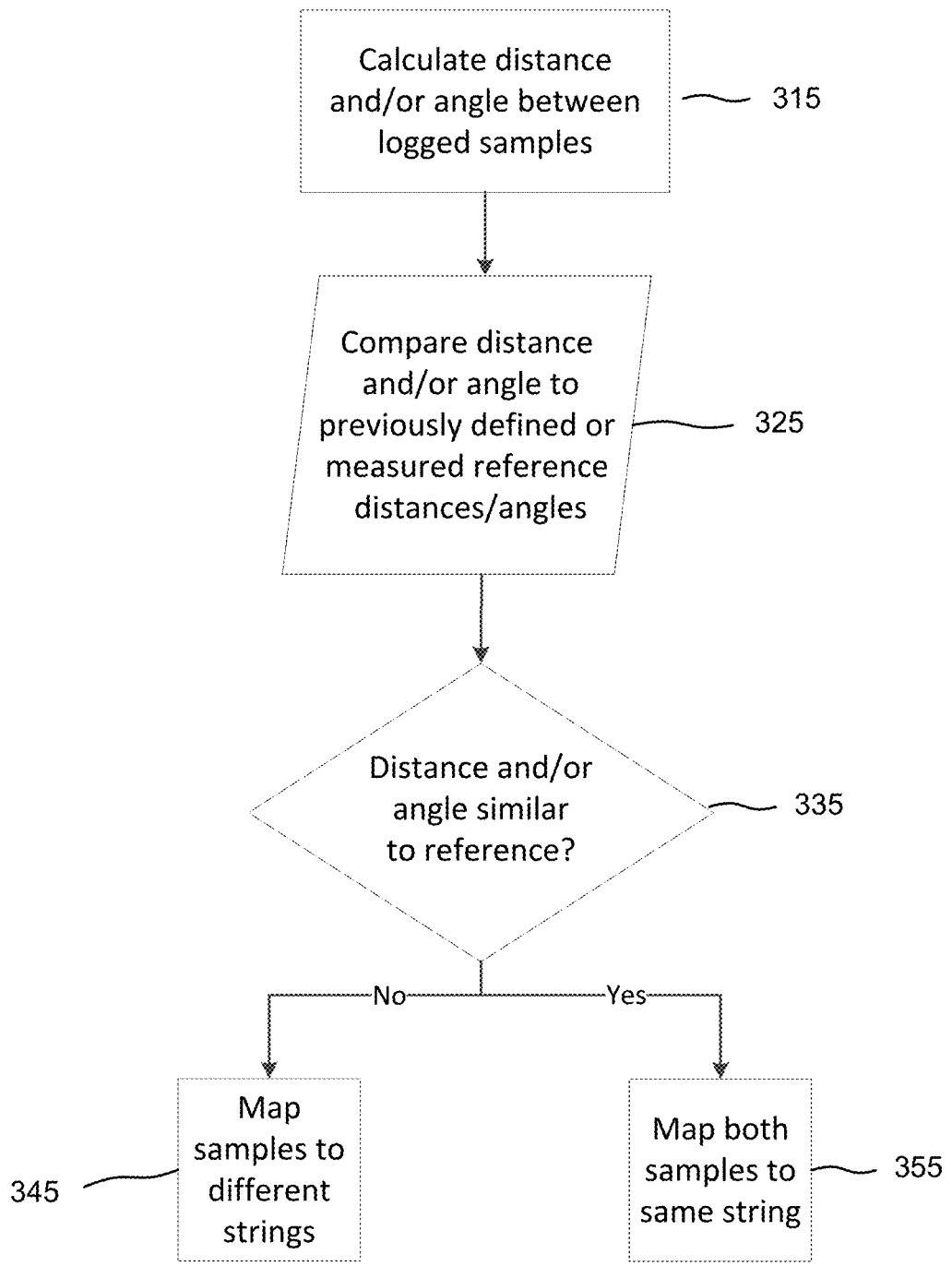
FIG. 3B is a flow diagram of a method for mapping samples to strings, according to one or more illustrative aspects of the disclosure.

FIG. 3B is a flow diagram of a method for mapping samples to strings according to one or more illustrative aspects of the disclosure. In one or more embodiments, the method of FIG. 3B, or one or more steps thereof, may be performed by one or more computing devices or entities. For example, portions of the method of FIG. 3B may be performed by components of a computer system. The method of FIG. 3B, or one or more steps thereof, may be embodied in computer-executable instructions that are stored in a computer-readable medium, such as a non-transitory computer-readable medium. The steps in the method of FIG. 3B might not all be performed in the order specified and some steps may be omitted or changed in order.

Reference is now made to FIG. 3B, which shows an illustrative implementation for grouping device measurements into rows. For example, the steps described in FIG.

3B may be performed at step 132, described above in FIG. 2A. According to this illustrative embodiment, each row of the installation may be processed such that the distance and/or angle between scanned devices may be compared to a reference distance and/or angle. The scanning device may be configured to determine and/or estimate a global position at the time of each scan, by utilizing localization systems such as Global Positioning System (GPS). At step 315, the estimated distance and/or angle between each pair of scanned devices may be calculated. At step 325, the estimated distance and/or angle between scanned devices may be compared to a reference and/or a threshold. In some embodiments the reference may be predefined, while in other embodiments the reference may be derived from calculated distances (such as the reference may be the average distance between consecutive scans, with a threshold twenty percent longer than the reference, or the reference may be derived from the angles between consecutive scans, with an appropriate threshold).

At step 335, the distance and/or angle between two devices, which may have been scanned consecutively, are compared to the reference distance and/or angle. If, at step 335, it is determined that the distance and/or angle are above the threshold, the two devices may be mapped to different rows, or strings, at step 345. If, at step 335, it is determined that the distance and/or angle are below the threshold, the two devices may be mapped to a same row, or string, at step 355. Alternatively, or in addition to the method described above, the installer may be instructed to press a "New Row" button on his or her device between rows, which may indicate him or her completing the scanning of one row and beginning another. The "New Row" button may be used to override distance and/or angle considerations, and/or to compensate for inconsistent distances and/or angles between devices in the same row.

Figure 4:
FIG. 4 illustrates an illustrative of representing and storing a Non-Identifying Map, according to one or more illustrative aspects of the disclosure.

Reference is now made to FIG. 4, which depicts one illustrative embodiment of representing a Non-Identifying Map (NIM). Generation of a representation of an NIM may be included in installation mapping methods including steps such as step 100 from FIG. 1, which is described above. A PV installation may be represented as a text file which contains information regarding the installation. For example, an NIM may be represented by a text file which lists the rows in the installation, the number of devices in each row, and/or the distance between each pair of devices. Additional information such as absolute locations of some devices, row orientation, angles and distances between rows, or other information may be included in the NIM. The mapping method may include an appropriate parser to parse the text file and extract information from the NIM to compare the scanned information to the NIM layout.

Figure 5A:
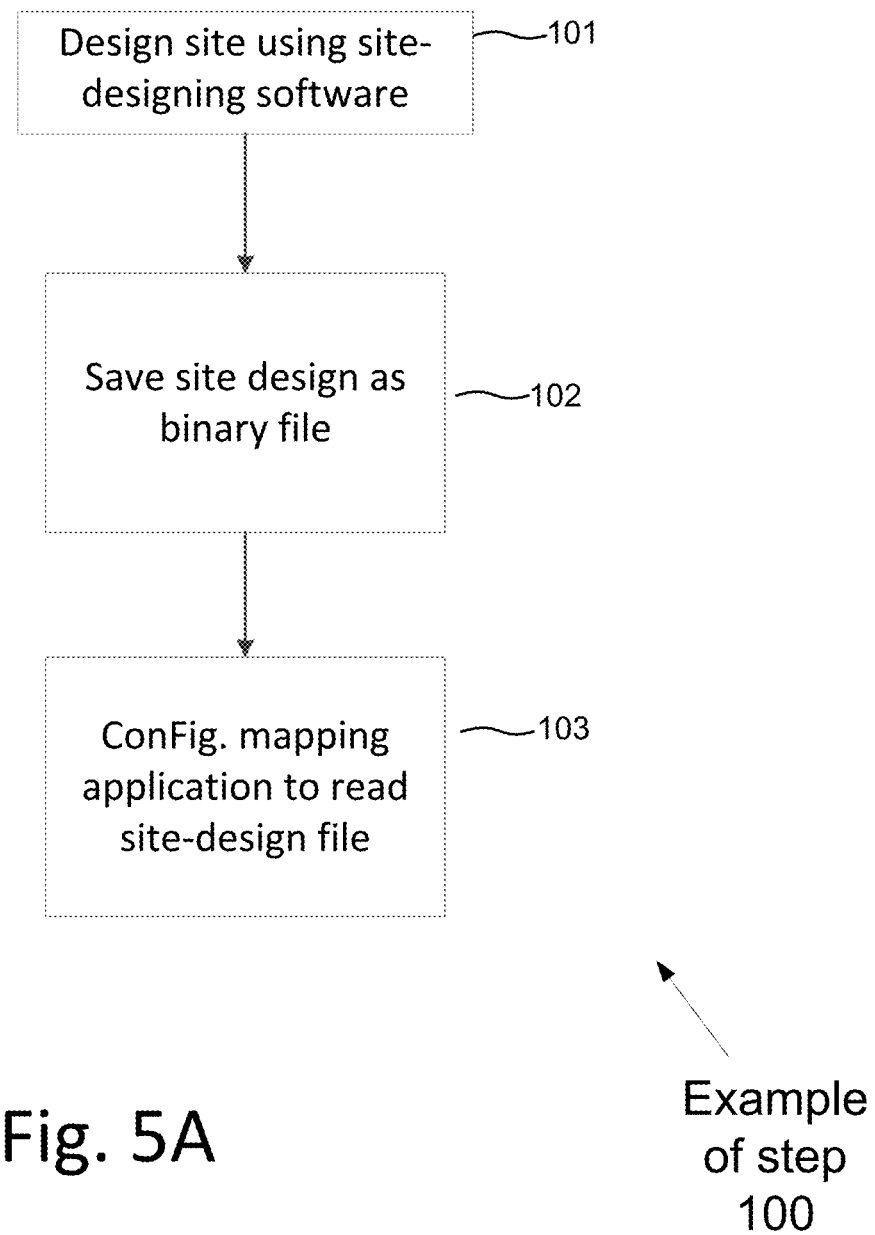
FIG. 5A is a flow diagram of a method for generating a Non-Identifying Map, according to one or more illustrative aspects of the disclosure.

FIG. 5A is a flow-chart of generating a Non-Identifying Map. In one or more embodiments, the method of FIG. 5A, or one or more steps thereof, may be performed by one or more computing devices or entities. For example, portions of the method of FIG. 5A may be performed by components of a computer system. The method of FIG. 5A, or one or more steps thereof, may be embodied in computer-executable instructions that are stored in a computer-readable medium, such as a non-transitory computer-readable medium. The steps in the method of FIG. 5 might not all be performed in the order specified and some steps may be omitted or changed in order.

Figure 5B:
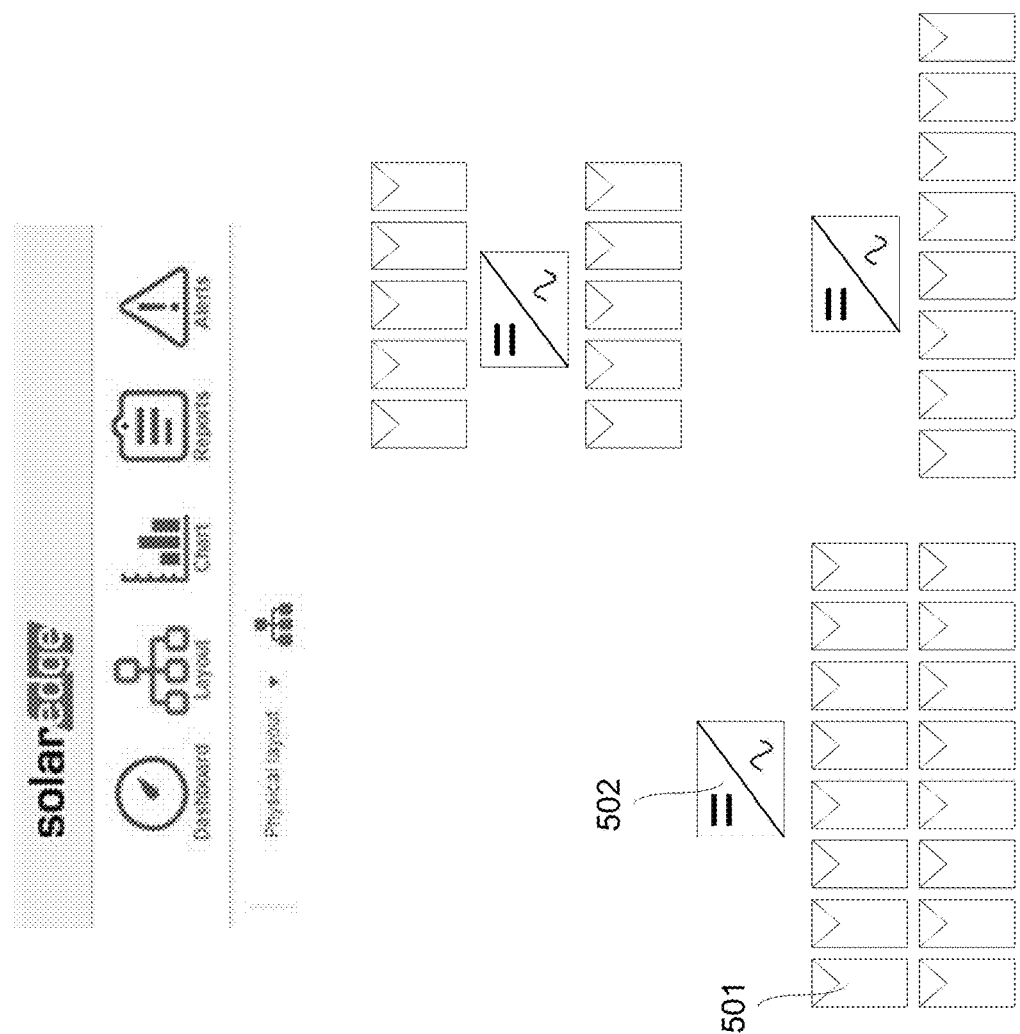
FIG. 5B illustrates a user interface for PV installation mapping, according to one or more illustrative aspects of the disclosure.

FIG. 5A, depicts an illustrative embodiment of generation and representation of a Non-Identifying Map (NIM). For example, the steps described in FIG. 5A may be performed during the method described in FIG. 1. A program or application may be used to design and plan a PV installation. The program may run on appropriate platforms (PCs, tablets, smartphones, servers, and/or the like), and may be made available to installers and/or system designers. The program may include a Graphic User Interface (GUI) to facilitate in site planning. At step 101, the site planner or designer may use the program or application to design a PV installation using the tools made available by the application. For example, FIG. 5B illustrates an example of a user interface for PV installation mapping that may be used at step 101 of FIG. 5A to design the PV installation. A user may design a PV installation featuring a plurality of photovoltaic generators 501 (such as PV panels, PV modules, PV cells, strings or substrings of PV panels) and featuring one or more power converters (such as PV inverter 502).

At step 102, of FIG. 5A, a binary file may be generated comprising information describing a portion of or the full layout of the system. The binary file may be generated at step 102 after a layout of the PV installation has been designed using the program GUI. Embodiments of the PV installation mapping methods described herein may include reading the binary file generated at step 102 and extracting site layout information from the binary file.

Figure 6:
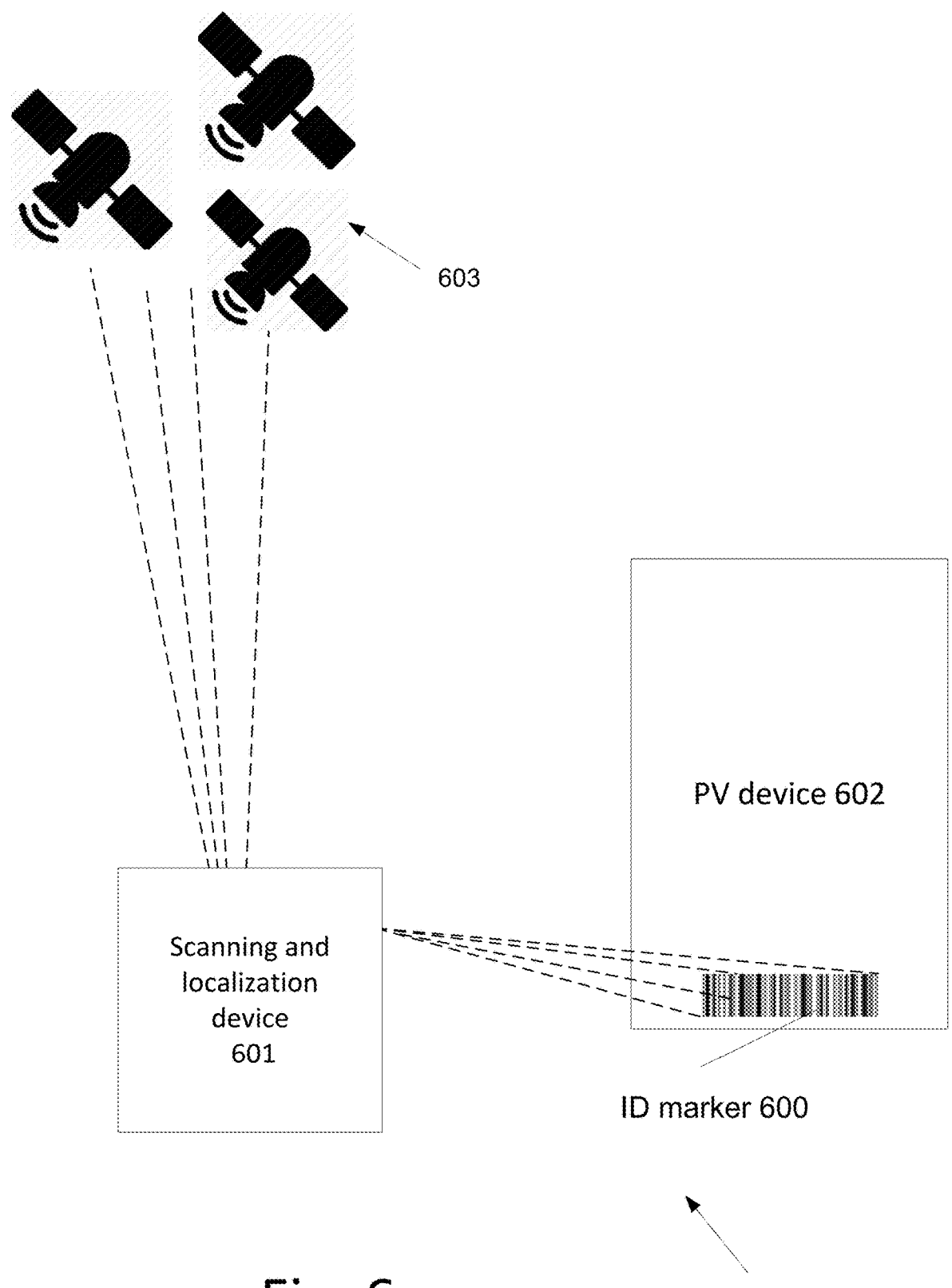
FIG. 6 illustrates an illustrative embodiment of reading identifying information from a PV device and estimating the device location, according to one or more illustrative aspects of the disclosure.

Reference is now made to FIG. 6, which shows components for scanning a PV device and logging the time and/or location of the scanner at the time of scanning. PV device 602 (such as PV panel, optimization device, DC/DC converter, inverter, monitoring device, communication device, and/or the like) may be marked with an ID marker 600 that may be scanned or processed. ID marker 600 may be a barcode that may be scanned by a scanning device. ID marker 600 may be a serial number identifiable by a camera, such as a camera with digit-identification capabilities. ID marker 600 may be an RFID tag, or a memory device readable by an electronic circuit. It should be understood that any other type of marker may be used in addition to or instead of the listed examples.

Scanning and localization device 601 may capture or record data provided by the ID marker 600. For example, the device 601 may be configured to obtain the identifying information from PV device 602, by scanning, taking a picture of, or retrieving data stored by the ID marker 600. Device 601 may include a clock and memory device, and be configured to store the timestamp of each scan along with the identifying information of the device scanned at that time. Device 601 may include a localization device such as a UPS device, configured to communicate with satellites 603 and estimate the location of the device at the time of scanning. In one implementation, the UPS methods employed may allow for estimates with sufficient accuracy to provide differentiation between adjacent PV devices deployed in the same installation.

Figure 7:
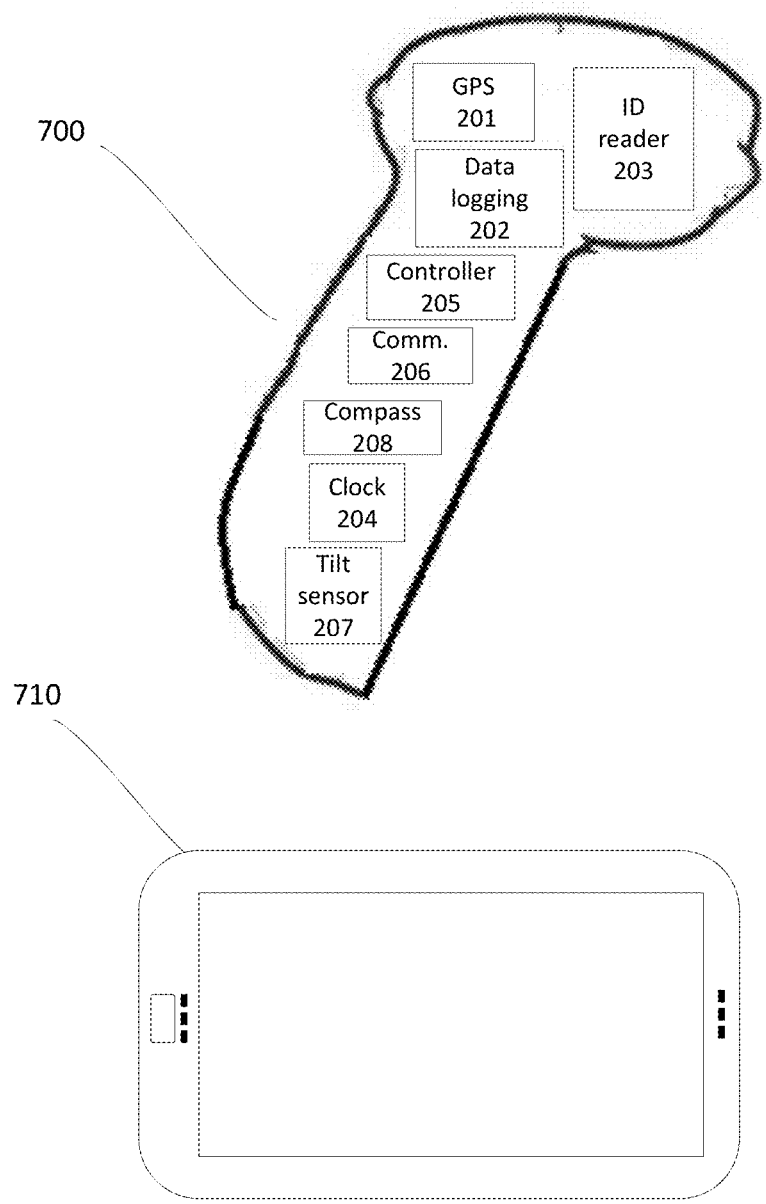
FIG. 7 illustrates illustrative devices which may be used for reading identifying information and/or estimating device location, according to one or more illustrative aspects of the disclosure.

Reference is now made to FIG. 7, which shows examples of scanning and locating devices that may be used in conjunction with illustrative embodiments described herein. Combined device 700 may include one or more of the illustrated components. ID reader 203 may be configured to retrieve identifying information from a PV device. In some embodiments, ID reader 203 may comprise a camera, and may be configured to take a photograph of a serial number or other identifying information on the PV device. In some embodiments, ID reader 203 may comprise a barcode scanner and be configured to scan a barcode on the PV device. In some embodiments, ID reader 203 may comprise an electronic circuit configured to read an RFID tag or a memory device storing identifying information.

In some embodiments, the device 700 may include GPS device 201, configured to receive or determine a GPS location, for example, when scanning a PV device. The device 700 may write (such as record, store, transmit, and/or the like) the ID information and GPS coordinates to data logging device 202. The data logging device 202 may comprise flash memory, EEPROM, or other memory devices.

Controller 205 may synchronize the various components comprising device 700. The controller 205 may comprise a DSP, MCU, ASIC, FPGA, and/or a different control unit. The controller may be split into several control units, each responsible for different components. Device 700 may include communication device 206. The communication device 206 may be configured to communicate using a wireless technology such as ZigBee, Bluetooth, cellular protocols, and/or other communication protocols. In some embodiments, measurements, timestamps and/or ID information may be transmitted, for example, by the communication device 206, to a remote server and/or stored to memory at a remote location. Device 700 may include clock 204, configured to sample, store, and/or communicate the time (in conjunction with the memory device and/or communication devices). For example, the clock 204 may be used to record a timestamp each time the ID reader 203 determines (such as obtains, measures, and/or the like) a device ID.

Device 700 may further include tilt sensor 207, configured to measure the tilt of the device 700 and store the measurement to memory and/or communicate the measurement. The tilt sensor may be used to measure the tilt of PV devices such as PV panel. Scanning device 700 may also include a compass 208. The compass 208 may be configured to measure or determine the direction a PV module is facing. For example, the compass 208 may be used to measure a direction of a PV module when a tilt measurement is carried out. Determining the tilt of one or more PV panels and/or the direction that the one or more PV panels face may be useful for various applications, such as monitoring applications or mapping applications. When the tilt of the PV panels is fixed during deployment, the installer may want to measure tilt and angle while scanning the PV devices for mapping purposes. The scanned data may be uploaded to a remote monitoring device.

In some embodiments, a device such as mobile phone/tablet 710 may include some or all of the functionality described with regard to combined device 700. Combined device 700 may also include a screen, configured to display the information generated by the device. In one implementation, the screen may display information in real-time, which may allow the installer to monitor progress, and may improve scanning accuracy. Many mobile devices include ID readers such as barcode scanners or a camera, a GPS device, controller, communication methods, a clock, compass and tilt sensor. Application software may be downloaded to the mobile device to allow the different components to interact in a way that achieves the desired functions described herein with regard to mapping PV installations. The mobile device may allow the installation map to be displayed on the device's screen while scanning, and show real-time updating of the information attached to each PV device in the field, to aid the installer in determining that the information is being processed accurately and clearly.

Figure 8A:
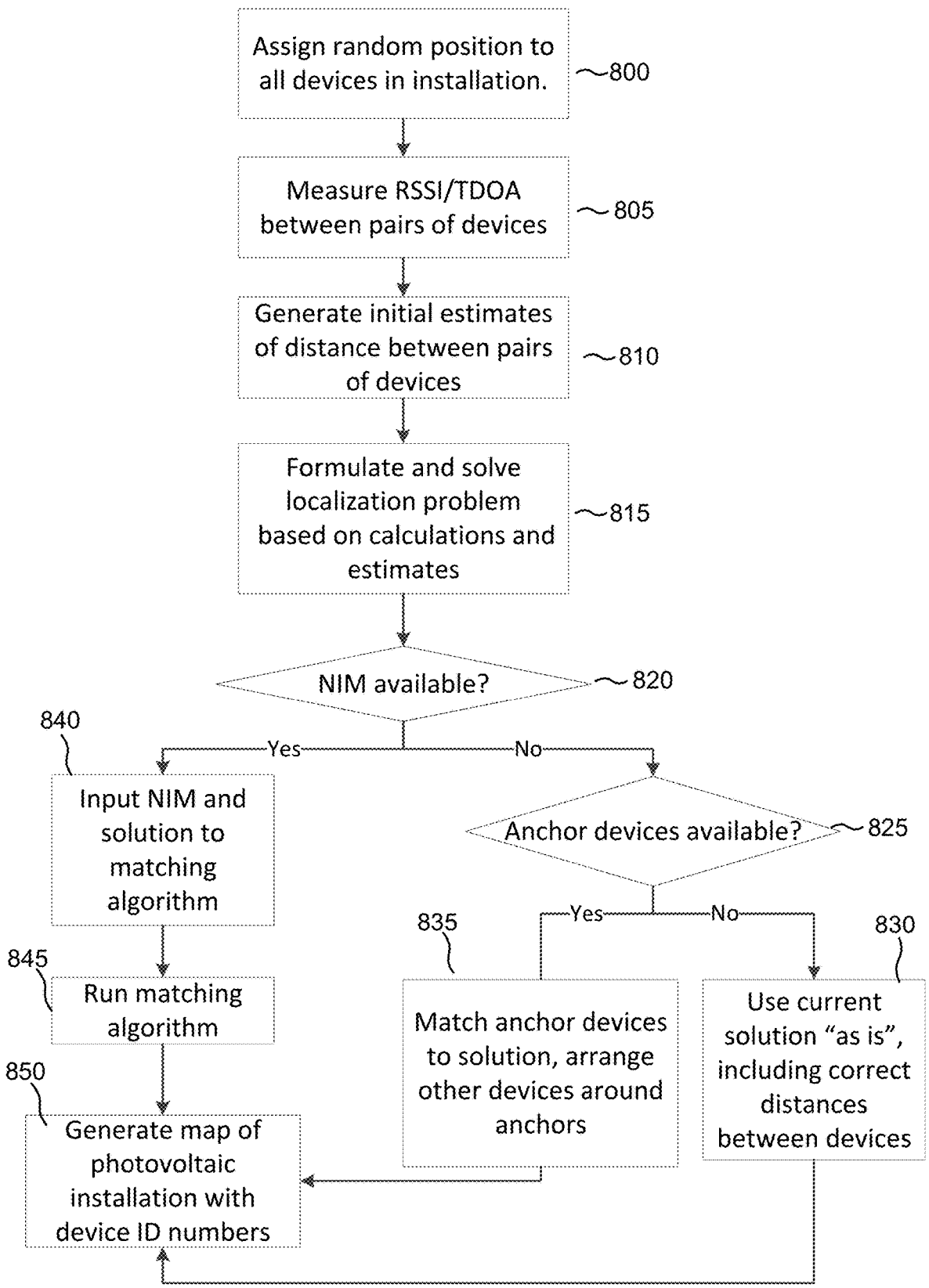
FIG. 8A is a flow diagram of a method for installation mapping, according to one or more illustrative aspects of the disclosure.

FIG. 8A is a flow diagram of a method for installation mapping according to one or more illustrative aspects of the disclosure. In one or more embodiments, the method of FIG. 8A, or one or more steps thereof, may be performed by one or more computing devices or entities. For example, portions of the method of FIG. 8A may be performed by components of a computer system. The method of FIG. 8A, or one or more steps thereof, may be embodied in computer-executable instructions that are stored in a computer-readable medium, such as a non-transitory computer-readable medium. The steps in the method of FIG. 8A might not all be performed in the order specified and some steps may be omitted or changed in order.

Reference is now made to FIG. 8A, which shows an illustrative method for estimating relative positions of a plurality of PV devices with regard to one another. In one implementation, the position may be estimated, or determined, without the use of localization devices, such as satellites. All or a portion of the PV devices in a PV installation may be equipped with a communication device, such as a wireless transceiver running an appropriate wireless protocol (such as Bluetooth, ZigBee, LTE, GSM, UMTS, CDMA and/or the like) or a Power-Line Communication (PLC) transceiver, which may be coupled to the PV installation's cables and configured to communicate by sending messages to each other over the cables.

At step 800, a mapping algorithm may be initialized by assigning random locations to each of the PV devices that are to be mapped. In one implementation, one or more of the devices may begin communicating by broadcasting an ID number, the current timestamp, and/or other information over the communication medium (such as power cables, wireless channels). For example, the ID number, timestamp, or other information may be transmitted at a predetermined amplitude. All or a portion of the devices may be able to detect the ID signals that are broadcast by the other devices. The received signal strength and/or the time it takes for the signal to propagate from one device to the next may depend on the distance and signal attenuation between the devices. In some embodiments, the devices may engage in one-way communication only, such as each device might only send messages to some or all of the other devices without being configured to receive a response from any particular device(s). In some embodiments, two or more devices may engage in two-way communication (such as Device A sends a message to Device B requesting a response, and measures the elapsed time between sending the message and receiving the response).

At step 805, the signal strength of each signal received by each device and/or the time delay between sending and receiving messages may be measured. At step 810 the signal strength and/or time delay measured at step 805 may be used to generate one or more initial estimates of pairwise distances between devices. The initial estimates may comprise error, such as error due to stochastic attenuation factors, noisy channels, and/or unexpected delays in signal propagation. In one implementation, multiple measurements may be taken and then averaged, or some other function may be applied to the measurements. In this implementation, an initial accuracy of the measurements may be improved by taking multiple measurements.

At step 815, the initial distance estimates generated at step 810 may be input to an algorithm, which may analyze the initial pairwise distance estimates and use them to generate an Estimated Layout Map (ELM). Many algorithms for this step may be considered, and in some embodiments, combinations of algorithms may offer accurate results. For example, a Least Squares (LS) problem may be formulated to create an ELM which minimizes the disparity between the pairwise estimated distances between various devices. A myriad of other methods, such as simulated annealing, Convex Optimization, Semidefinite Programming, or Multidimensional Scaling may be combined with transliteration and/or triangulation techniques to obtain an estimated layout based on the measurements.

At step 820, it may be determined whether a non-identifying map (NIM) is available. When a NIM is available, the method may proceed to step 840. At step 840, the NIM and ELM may be input to a matching algorithm which may incorporate elements of the method illustrated in FIG. 2A, and further discussed in FIGS. 2B-D, to match the identifying information incorporated in the ELM to the device locations described by the NIM. At step 845 the matching algorithm may run, such as, execute, and at step 850 a map of the installation may be output which outlines the device locations along with ID information for each device. The map may be in a format viewable on an appropriate device, such as a computer monitor, mobile phone, tablet, and/or the like. The map may be represented digitally or in a textual format.

Alternatively, when no NIM is available at step 820, the algorithm may proceed to step 825. At step 825 the method may seek "anchor devices", such as, a set of one or more specific devices which have known locations. When such anchors exist (or may be easily obtained by the installer), certain device IDs from the ELM may be matched to the known locations at step 835, and the rest of the devices may be arranged around them, with the final arrangement then output at step 850. When no anchor devices exist or may be obtained, the algorithm may use the current solution without further modification at step 830, proceed from step to step 850, and output the ELM "as is", as a final map of the installation with ID information for each device. The method of FIG. 8A may be carried out by a centralized processing device which has access to the measurements taken by some or all of the PV devices (such as, a system inverter including a processing unit, communicatively coupled to the PV devices so that the devices may communicate their measurements to the inverter).

Figure 8B:
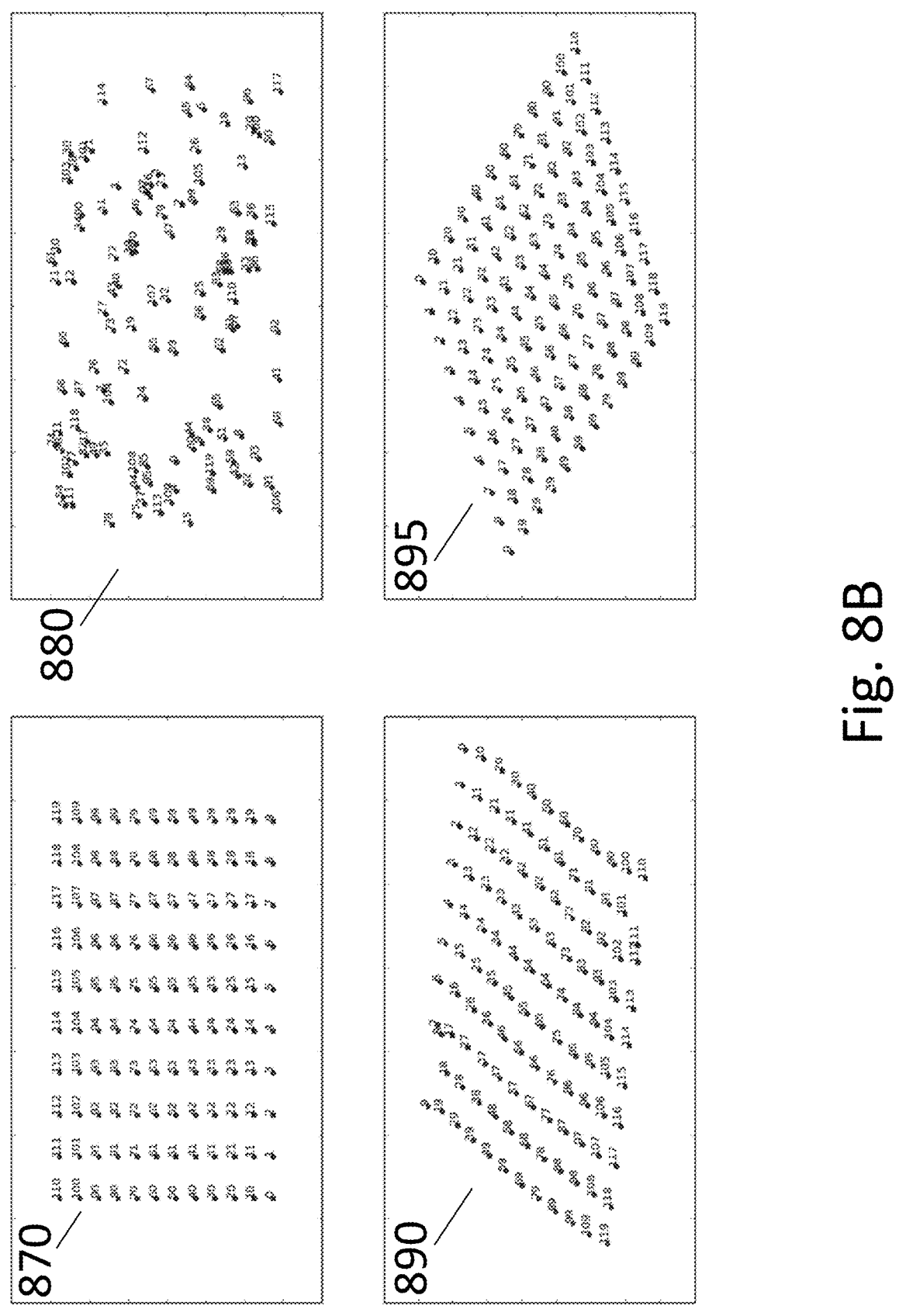

Reference is now made to FIG. 8B, which illustrates different stages of the mapping algorithm depicted in FIG. 8A according to a certain illustrative embodiment. In this illustrative embodiment, for illustrative purposes, step 815 comprises two stages. The first stage may include utilizing a mesh-relaxation technique, such as described in "Relaxation on a Mesh: a Formalism for Generalized Localization" by A. Howard, M. J. Mataric and G. Sukhatme (Proceedings of the IEEE/RSJ International Conference on intelligent Robots and Systems (IROS 2001)), with the result of the first stage being formulated as a Least-Squares problem and input to a Least-Squares solving method (many of which may be found online, such as the "leastsq" method packaged in the SciPy library for the Python programming language). 870 depicts the real layout of the PV installation, with each device numbered (0-119) and located in its "real" place. The real layout depicted in 870 is not known to the algorithm at the time of running, and is provided here for illustrative purposes. 880 depicts an example result of step 800, where the mapping algorithm has generated random location estimates for each device. In this illustrative embodiment, RSSI indicators (in conjunction with estimated random signal attenuation factors) are used to estimate pairwise distances between each pair of devices, and the estimates are input to an implementation of the "Relaxation on a Mesh" method mentioned above, at a first stage of step 815. The resultant ELM is depicted in 890, which includes some misaligned rows and a few devices which deviate from their "real" location illustrated in 870. The estimate depicted in 890 may then be input to the SciPy "leastsq" function, and a final, smooth, accurate ELM may be output, such as the output depicted in 895. It should be noted that the diamond-like shape of the ELM 895 is obtained because of unequally scaled X and Y axes. For example, when the axes in L4 were scaled equally, the shape may be that of a rectangle, which may be similar to the real installation as illustrated in L1. In one implementation the ELM 895 illustrates an estimate at the end of step 815. In the example illustrated in FIG. 8B, the degree of symmetry present in the installation may reduce accuracy of the estimated layout. In certain instances, a PV installation may include asymmetrical elements (such as some rows being shorter than other, such as in the system depicted in FIG. 213) which may improve accuracy when matching ELM elements to NIM elements. In certain instances, asymmetrical elements may result in improvements in algorithmic convergence and accuracy.

Figure 9:
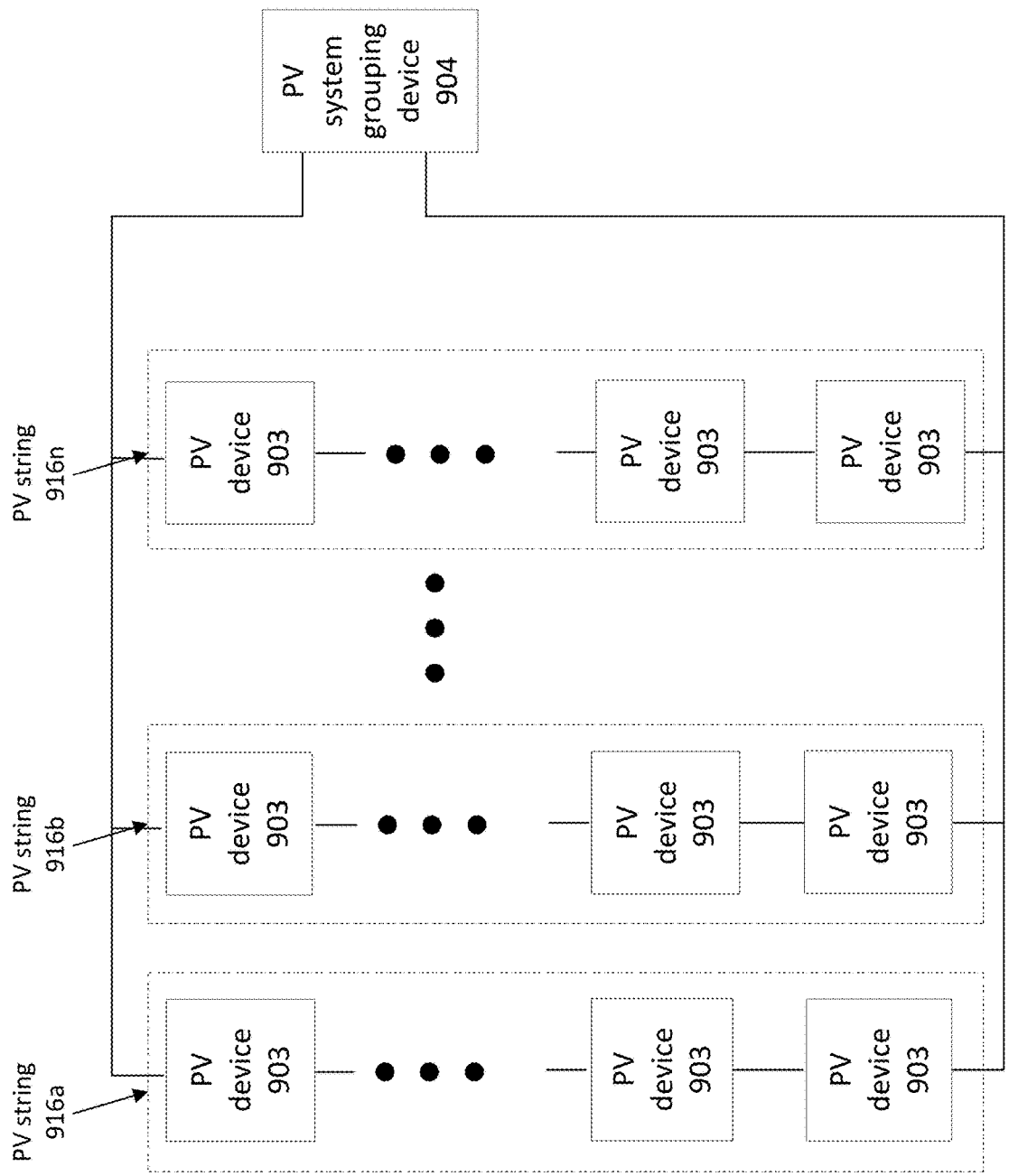
FIG. 9 is part-block diagram, part schematic of an illustrative PV installation that may be mapped, according to one or more illustrative aspects of the disclosure.

Reference is now made to FIG. 9, which shows an illustrative PV installation comprising PV devices which may be described on a map of the installation. The installation may include a plurality of PV strings 916a, 916b, to 916n. The PV strings may be connected in parallel. Each PV string 916a-n may include a plurality of PV devices 903. PV devices 903 may be PV cells or panels, power converters (such as DC/DC converters or DC/AC converters coupled to or embedded on PV panels, monitoring devices, sensors, safety devices (such as fuse boxes, RCDs), relays, and the like, or any combinations thereof. Individual PV devices 903 may be identical or might be different. The PV devices 903 may be coupled in series or in parallel. For example, each PV device 903 may comprise a DC/DC converter or DC/AC inverter coupled to a PV panel and configured to operate the panel at a set or determined power point, such as a maximum power point. Each DC/DC or DC/AC converter may convert input PV power to a low-voltage, high-current output, and multiple converters may be serially connected to form a string having high voltage. In some embodiments, each PV device 903 may include DC/DC or DC/AC converter converting input PV power to a high-voltage, low-current output, and multiple converters may be connected in parallel to form a string having high current.

The plurality of PV strings 916a-n, which may be connected in parallel, may be coupled to the inputs of PV system grouping device 904. In some embodiments, PV system grouping device 904 may comprise a central inverter configured to convert a DC input to an AC output. The AC output may be coupled to a power grid. In some embodiments, PV system grouping device 904 may comprise one or more safety, monitoring and/or communication devices. Each of the PV devices 903 and/or the grouping device 904 may include an ID tag such as a barcode, serial number and/or memory or RFID card, that comprises identifying information.

In illustrative embodiments, it may be possible to match device IDs to physical locations on a map by utilizing various methods described herein. In some embodiments, it may be possible to match device IDs to physical locations on a map by determining which devices are coupled serially to one another (such as which devices comprise each string), determining the order of the various strings and then determining the order of the devices within each string.

Figure 10:
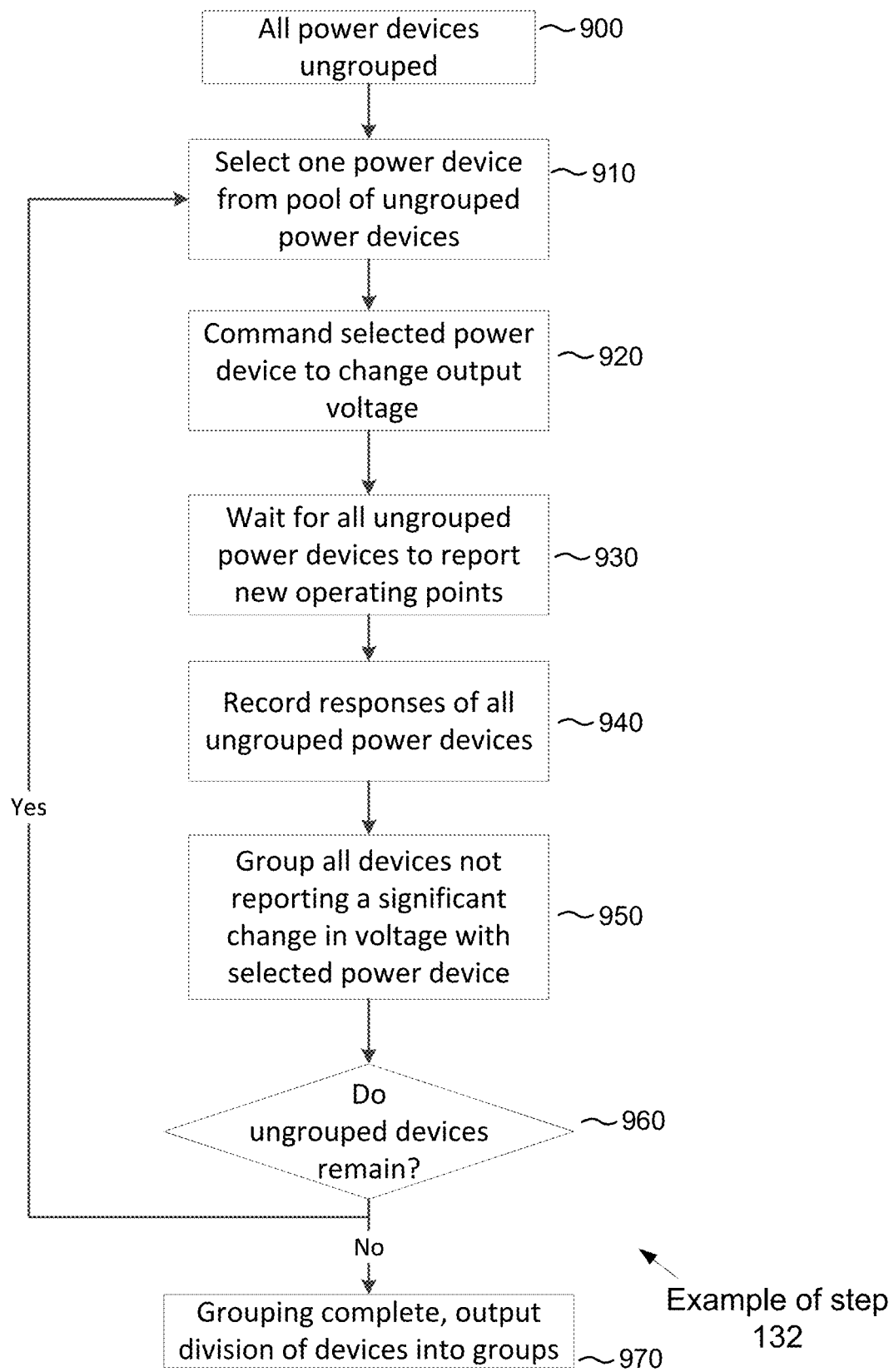
FIG. 10 is a flow diagram of a method for grouping power devices into groups, according to one or more illustrative aspects of the disclosure.

FIG. 10 is a flow diagram of a method for grouping power devices into groups according to one or more illustrative aspects of the disclosure. In one or more embodiments, the method of FIG. 10, or one or more steps thereof, may be performed by one or more computing devices or entities. For example, portions of the method of FIG. 10 may be performed by components of a computer system. The method of FIG. 10, or one or more steps thereof, may be embodied in computer-executable instructions that are stored in a computer-readable medium, such as a non-transitory computer-readable medium. The steps in the method of FIG. 10 might not all be performed in the order specified and some steps may be omitted or changed in order.

Reference is now made to FIG. 10, which depicts a method for grouping PV devices into strings. The method may be used to determine which devices are serially connected to one another in systems such as the system depicted in FIG. 9. The method of FIG. 10, or one or more steps thereof, may be used to group devices into map rows, such as at step 132 of FIG. 2A. The method may apply to a plurality of PV devices which are able to change their output voltage, such as DC/DC converters, and report their output parameters (such as voltage, current) to a system management unit communicatively coupled to some or all the PV devices.

At step 900, it may be determined that one or more power devices are ungrouped. For example, initially, all power devices may be ungrouped. At step 910, a power device may be selected from the ungrouped power devices. The power device may be selected randomly. For example, an optimizer, such as an optimizer coupled to a power generation source, may be selected. In one implementation, all or portions of step 910 may be performed by an inverter. At step 920, the power device selected at 910 may be instructed to decrease or increase an output voltage of the power device. For example, a message may be sent to the power device, via PLC, wirelessly, or via other communications methods, to increase or decrease the output voltage of the power device.

At step 930, the method may wait for power devices, such as ungrouped power devices, to report operating points. For example, the power devices may send telemetries based on a schedule or at various intervals. At step 940, operating points received from power devices, such as ungrouped power devices may be recorded. The operating points may be responsive to the increase or decrease in output voltage that was requested at step 920.

At step 950, one or more devices that do not report a change in voltage may be grouped with the power device selected at step 910. For example, devices that do not report a change in voltage greater than a threshold change in voltage may be grouped with the selected power device. The threshold may be preset or predetermined, or determined based on received operating points.

At step 960, it may be determined whether there are one or more ungrouped devices. When there are one or more ungrouped devices, the method may return to step 910 and select one of the one or more ungrouped devices. Otherwise, when at step 960 it is determined that all devices have been grouped, the method may proceed to step 970. At step 970, the grouping may be considered complete, and the division of devices into groups may be output.

As an example of the method described in FIG. 10, assume PV system grouping device 904 is an inverter including a power-line-communications (PLC) or wireless transceiver and a processor, and each PV device is an optimizer including a DC/DC converter, a maximum-power-point-tracking (MPPT) circuit and a PLC or wireless transceiver. Each optimizer may be coupled to one or more power generation sources such as PV panels, batteries and/or wind turbines. Before the grouping process begins, each optimizer may be configured to output a certain low, safe voltage such as 1V. Since the strings of optimizers (such as 316a, 316b) are coupled in parallel, they may maintain a common voltage between the two ends of each string. The optimizers may periodically send telemetries to the PV system grouping device 904 using PLC, where they report their current output voltages. At step 900, the power devices (optimizers in this example) are ungrouped. At step 910, the inverter chooses a first optimizer at random (such as Optimizer A, belonging to String F), and at step 920 sends a message (via PLC or wirelessly) instructing Optimizer A to increase its output DC voltage. This increase in voltage results in a corresponding increase in the voltage of the string including the chosen optimizer, String F. To maintain a common string voltage, the optimizers belonging to all the other strings may increase their voltages as well. However, the optimizers which are part of String F (such as Optimizers B-K) might not increase their output voltage, as Optimizer A has already raised its voltage. When the optimizers next send telemetries to the inverter, via PLC or wirelessly, at step 930, Optimizer A may report a high voltage, Optimizers B-K may report the same voltage as before, and all other optimizers may report increases in voltage. At step 940, the inverter processor may record the reports from all the optimizers. At step 950, the inverter may determine that all optimizers not reporting a significant change in voltage (B-K) belong to the same string as the originally selected optimizer (A), group them as a string and remove them from the "ungrouped power devices pool". The algorithm then repeats steps 910-50 until all optimizers have been grouped, at which stage it comes to an end, at step 970 outputting the division of optimizers into groups.

Figure 11A:
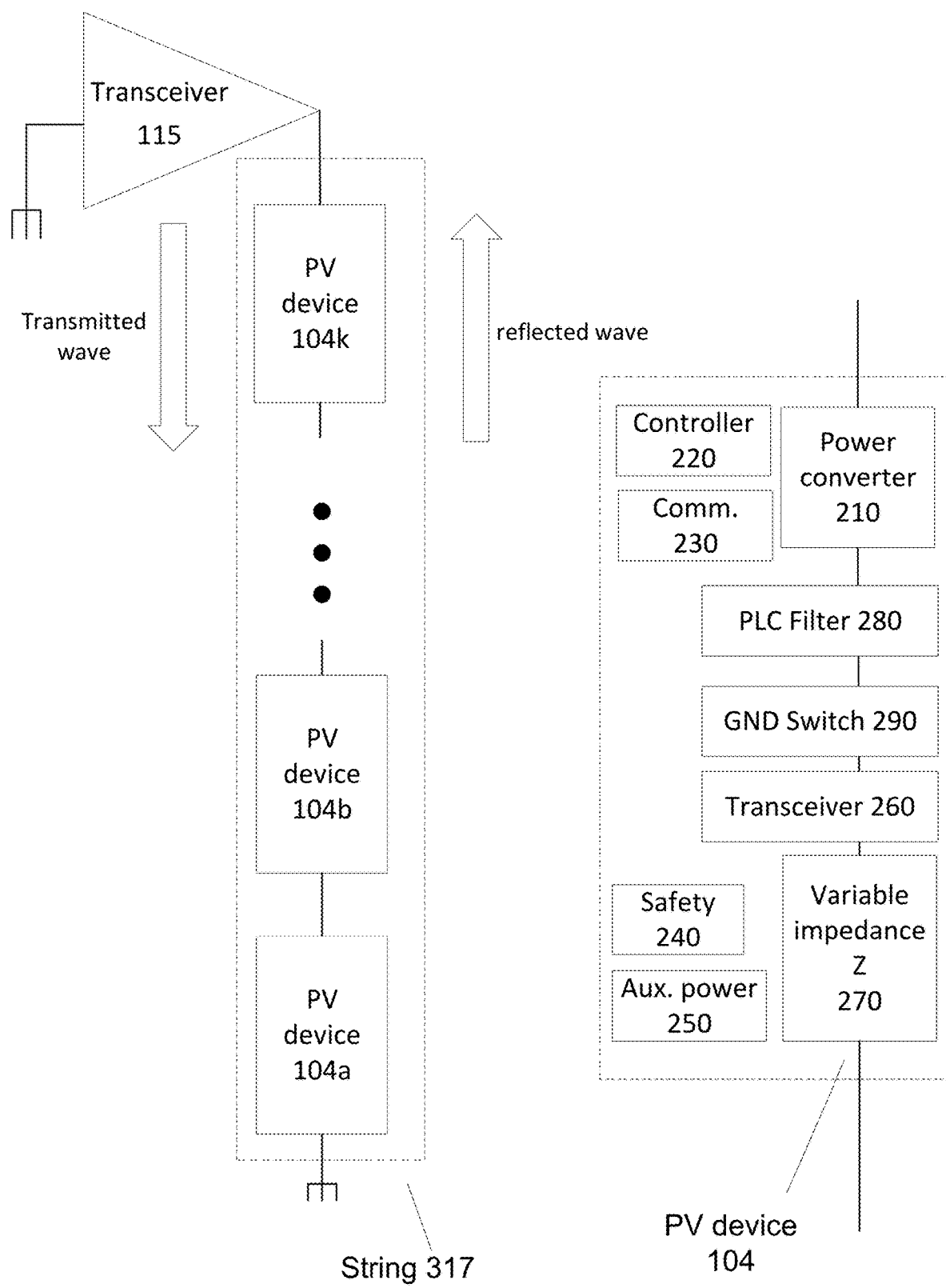
FIG. 11A is a part-block diagram, part-schematic of PV system components which may be used in conjunction with methods described herein.

Reference is now made to FIG. 11A, which shows an illustrative embodiment of a PV string of PV devices, where it may be possible to determine the order of the devices within the string. Time Domain Reflectometry (TDR) may be used to determine the ordering of PV devices within a PV string. String 317 may comprise a plurality of serially-connected PV devices 104, such as PV devices 104a, 104b, to 104k. The string 317 may comprise any number of PV devices 104a-k. Devices 104a-k may comprise elements similar to those previously discussed with regard to PV devices 103. Devices 104a-k may each include power converter 210 (such as a DC/DC or DC/AC converter) which receives input from a PV panel, battery or other form of energy generation, and produces an output. One output of converter 210 may be coupled to a variable impedance Z 270, and the other output may serve as the device output, to be coupled to an adjacent PV device in string 317. In this manner, string 317 may include a plurality of variable impedances which are coupled to the cables which couple the PV devices to one another, forming the serial string. Each PV device 104a-k may include a controller 220, configured to control the value of variable impedance Z 270. Controller 220 may be the same controller used to control the other components of PV device 104a-k (such as power converter 210, communication module 230, safety device(s) 240, auxiliary power 250, and/or the like), or it may be a different controller. Transceiver 115 may be coupled to the string 317, and may be configured to inject a voltage or current pulse over the string and measure the reflected wave. The transceiver may be coupled to one of the edges of the string, or may be coupled to a middle point between two devices. According to TDR theory, the waveform reflected back to the transceiver depends on the characteristic impedance of the PV string line. The characteristic impedance of the PV string may be affected by each of variable impedances 270 coupled to it, so by rapidly changing variable impedance Z 270 on one of the serially connected PV devices, a rapidly changing reflected waveform may be formed.

PV devices may have integrated receivers, transmitters, or transceivers 260 in each device, which may allow transmitting or receiving an RF signal on the PV conductors to determine the order of the PC devices within the string of PV panels. A transceiver signal may be fed to communication module 230 for interpreting a PLC communication, measuring a signal parameter, and/or the like. The wavelength of the signal may be shorter than the length of the conductors in PV systems, and the impedance components along the way may respond by limiting transmission at some frequencies across the conductors and nodes. Devices connected at various nodes along the string (node devices) along the string may be a power device such as a PV device, a PV power device, an inverter, an optimizer, a junction box, a combiner box, a bypass diode circuit, a direct-current (DC) to alternating-current (AC) power inverter, a DC to DC power converter, a micro-inverter, a photovoltaic panel circuit, a connector embedded circuit, or other energy management devices, where the device may comprise a signal receiver and/or transmitter and a serial impedance modification circuit as in the drawings. For example, any one or more of the above power devices may comprise an impedance modifying circuit on one or more of the output connectors of the power device.

Devices 104$a$-$k$, such as PV device 104, may further incorporate a PLC filter 280, ground (GND) switch 290, and/or the like. PLC filter 280 may be a wave trap filter, a band stop filter, a notch filter, and/or the like, and attenuate the PLC communication signal during propagation on the power device string. When the PLC filter is activated, GND switch 290 may be closed so that a return loop is created through the ground switch. In this manner, the first power device in the series may be identified, then PLC filter 280 is disconnected and GND switch 290 is opened for the first power device, and then process continued down the string until the order of the power devices in the string is determined.

The electrical signal may also be sent from one power device to an adjacent power device, and the phase may be measured. For example, when the wavelength is set to a value that is four times the string length, and the phase of the signal is adjusted and referenced so that the first power device is at zero phase, then the other power devices in the string may have a monotonically increasing or decreasing phase value, and thus the order of the power devices along the string may be determined by the phase values. For example, 20 power devices are connected with a 2-meter conductor between power devices (40 meters total), and the electrical signal is initiated by the first power device with a wavelength of 50 meters (1.5 MHz), whereby each power device may see an increasing phase of 14.4 degrees. For example, the first power device may measure a 14.4-degree phase shift, the second power device may measure a 28.8-degree phase shift, and the like. For example, for a string of n power devices, each with a distance of $x_i$ between them (where i denotes the index of the PV device) and a signal wavelength of $\lambda i$, the signal phase that will develop between device i−1 and device i is $360*x_i/\lambda i$ degrees. So the formula for the phase at each device is: $p_i = \Sigma_{k=0}^{i} 360*x_k/\lambda_k$ When one of the node devices transmits an electric signal along the string of serially connected devices, the signal strength at each node may be measured and the measured value may be analyzed to determine the order of the devices along the string. For example, by setting one of the node devices to have a different impedance compared to the others, it may be determined which of the nodes are proximal to the node with the different impedance and which are distal. By iteratively changing the impedance of one node device after the other (such as changing and reverting impedances), the measured values may be analyzed to determine the order of the devices. Thus, based on the determined order of the devices, when one of the devices has a malfunction or needs maintenance, a notification may include the location of the device along the string, thereby assisting the repair/maintenance of one or more of the devices.

For example, a power device at the end of the string may transmit the signal and the power devices further down the string may record measurements of the signal. As another example, a power device at the middle of the string sends a signal on one or more of the output connectors of that power device, and the other devices on the portion of the string connected to that power device record measurements of the signal. The measurements may be sent to a central processor, such as a processor of one of the devices for analyzing to determine the order of the power devices on the string.

When two or more parallel string strings are connected to a common power device, such as an inverter, and the end power device sends the signal to an output connector, the devices on all the parallel strings may respond and send back the measured values. To separate measured values from each string, the processor may use the groups of power devices that have been classified by strings using the methods described herein. For example, the inverter may simultaneously detect the order of power devices on multiple parallel strings by segregating the measurement values according to the string they belong to.

Figure 11B:
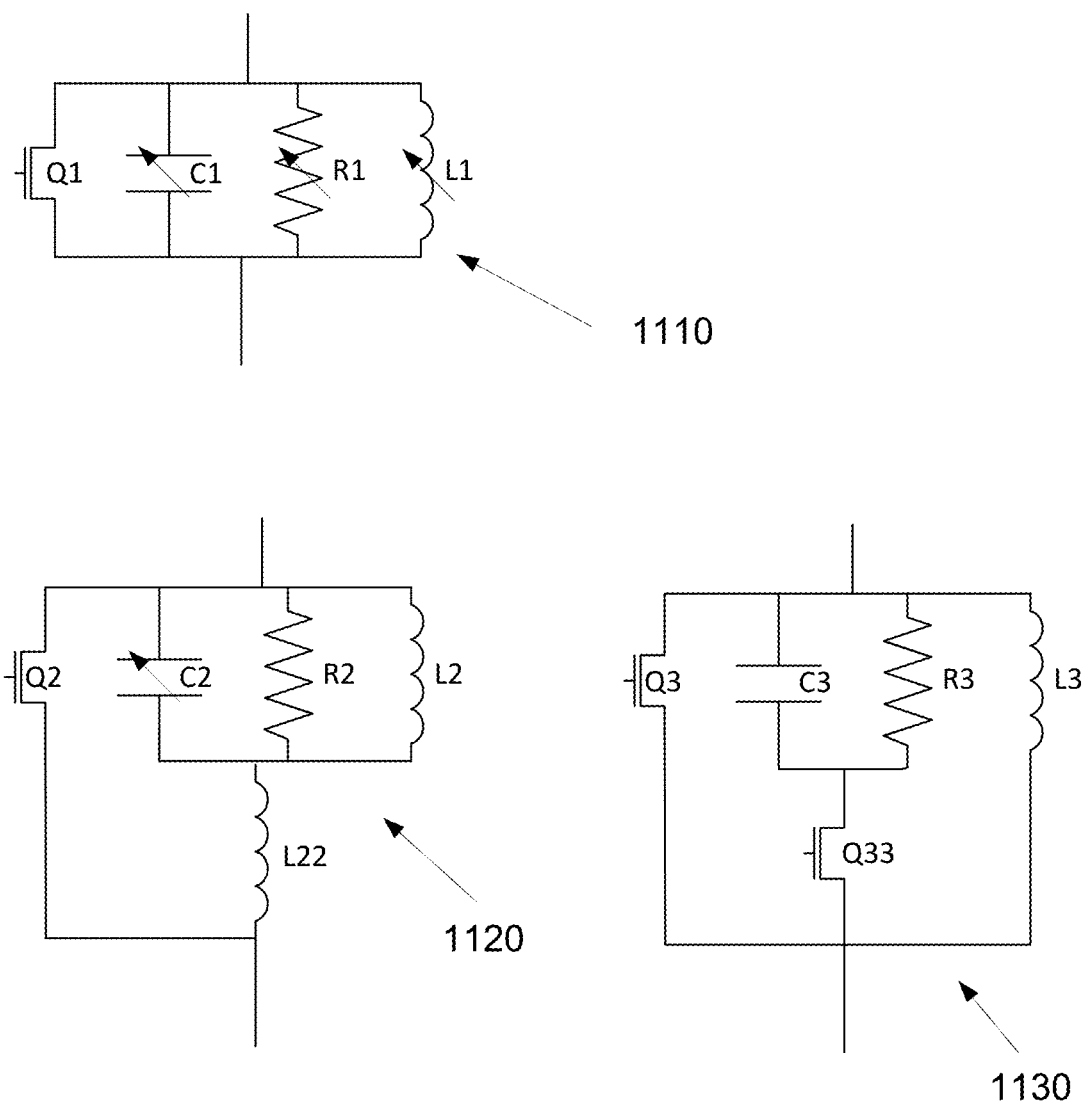
FIG. 11B is a schematic of illustrative variable impedance circuits, according to one or more illustrative aspects of the disclosure.

Reference is now made to FIG. 11B, which shows several examples of variable impedance configurations. Variable impedance 1110 may include inductor L1, resistor R1, capacitor C1 and switch Q1 (such as a MOSFET), all connected in parallel. Inductor L1, resistor R1, capacitor C1, and/or other components may comprise a variable impedance, a computer determined impedance, and/or the like. For example, the impedance is varied during a spread spectrum reflectometry or refractometry detection method. For example, in a refractory technique each power device may attenuate the transmission line electrical signal, and thus the signal amplitude may be used to determine the relative order of the power devices. When switch Q1 is ON (such as by a controller applying an appropriate voltage to the gate of MOSFET) the total impedance of impedance 1110 may be zero, since the switch bypasses the other impedance elements. When switch Q1 is off, the impedance of 1110 may be nonzero, and may be calculated as the impedance of the other three components connected in parallel. Variable impedance 1120 may comprise inductor L2, resistor R2, capacitor C2 connected in parallel, inductor L22 coupled to them in series, and switch Q2 connected in parallel to the whole arrangement. Here, when Q2 is ON the equivalent impedance of 1120 may be zero, and when it is OFF the impedance of 1120 may be nonzero, and calculated as the impedance of R2, C2 and L2 in parallel added to the impedance of L22. Variable impedance 1130 features two switches, Q3 and Q33, and more than two impedance levels. When Q3 is ON, the impedance of 1130 is zero. When Q3 and Q33 are both OFF, the impedance of 11311 is simply the impedance of inductor L3. When Q3 is OFF and Q33 is ON, the impedance of 1130 is the equivalent impedance of inductor L3, resistor R3 and capacitor C3 all coupled in parallel. Obviously, many more arrangements of components may be utilized for different (or additional) impedance levels. The switching of the switches (Q1, Q2, Q3, Q33) may be controlled by an appropriate controller (such as DSP, MCU, FPGA and/or the like) within the relevant PV device.

Figure 11C:
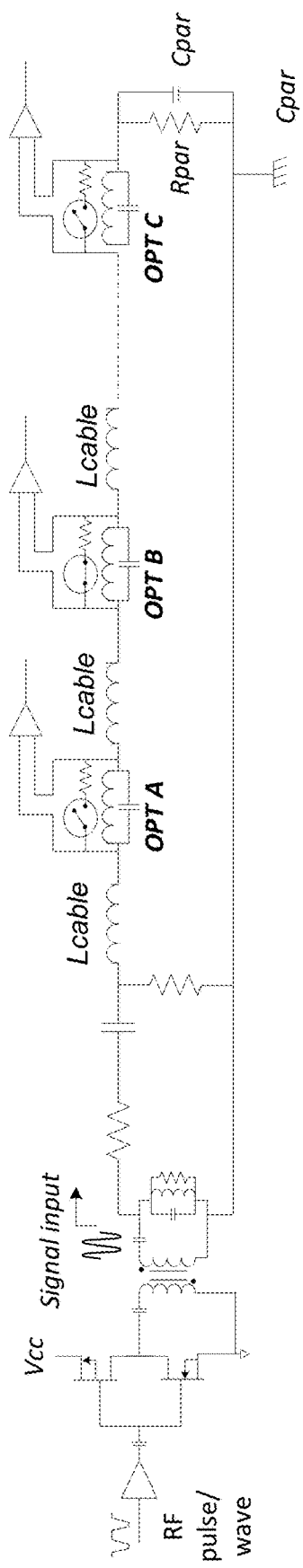
FIG. 11C is a schematic of illustrative conductor networks, according to one or more illustrative aspects of the disclosure.

Reference is now made to FIG. 11C, which shows a schematic of illustrative conductor networks according to one or more illustrative aspects of the disclosure. A RF pulse or wave may be transmitted from one location of a series network of transmission lines and received at other locations along the series. When the wavelength is near to or smaller than the conductor lengths, the impedances along the conductor may affect the wave propagation, such as a transmission line effect. For example, the signal or wave may propagate through the network, and be detectible at power devices along the network, such as OPT A, OPT B, OPT C, and/or the like. The power devices may be configured to set or adjust an impedance at each node of the network, and the set impedance at the power devices may be responsive to the cable impedances, denoted as Lcable. For example, each power device may include an impedance switching circuit, an impedance setting circuit, an impedance circuit, an impedance masking circuit, and/or the like. Each power device may include a receiver configured to receive the RF pulse or wave, and record the wave received at the device. The recorded wave strengths at each device (or node) may be transferred to a central device for processing, including comparing the recorded waves when different power devices are set to different combinations of impedances. The analysis of the waves and/or the commands to set impedance values may be used to determine the order of the power devices along the network length.

Figure 11D:
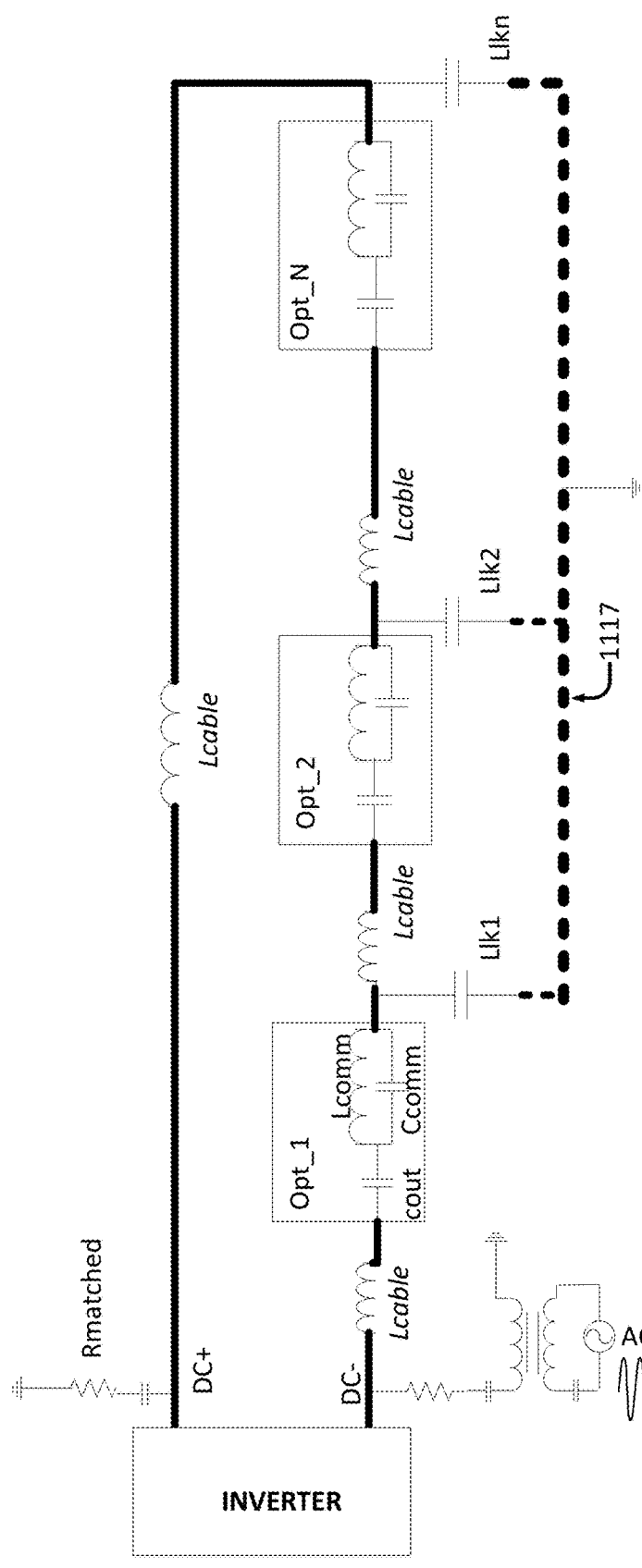
FIG. 11D is a schematic of illustrative conductor networks, according to one or more illustrative aspects of the disclosure.

Reference is now made to FIG. 11D, which shows a schematic of illustrative second conductor networks according to one or more illustrative aspects of the disclosure. An inverter that produces an AC output power is connected to a DC power source using terminals DC+ and DC−. Each power device Opt_1, Opt_2, and Opt_n, may comprise impedances such as Cout, Ccomm, Lcomm, and/or the like. The parasitic leakage capacitance Llk1, Llk2, Llkn and the like may be used together with the impedances of the devices to measure a RF pulse or wave generated by the inverter, and the signal amplitude may be used to determine the ordering of the power devices based on the recorded RF wave or pulse at each power device. The phase, timing and known location of the elements may be used to determine or analyze the of ordering of devices along the string. For example, the leakage current 1117 from the parasitic capacitances to ground may be used to analyze the recorded waves. A resistor, denoted Rmatched, may be connected from DC+ to ground, either in series or parallel to a capacitor.

The impedance adjusting circuit of the power devices may be used to identify the neighboring power devices using a peer-to-peer type handshaking technique. For example, an electrical signal is transmitted from one power device, and the other power devices dynamically change their impedance (such as changing and reverting the impedance) until it is determined which of the other power devices in neighboring to the transmitting device. For example, a PLC communication module is used to communicate an electrical signal between two of the power devices, and the other power devices sequentially and/or alternately implement an impedance change using their impedance adjusting circuit, such as a high impedance, and the power devices that caused a communication error between the two communicating power devices are determined to be ordered in the serial string in between the two communicating power devices. By changing the selected two communicating power devices and repeating the determination of the intermediate power devices between them, the order of multiple power devices in each of the multiple parallel strings may be determined.

The transmitting of electrical signals may be performed simultaneously between multiple devices, such as each device transmitting at a slightly different frequency (such as between a 10 Hz to 100 MHz frequency difference), and the resulting recorded signal values at each power device may be used (such as after applying a Fourier-transform) to simultaneously determine the relative signal strength received at each power device and thus the order of the power devices. In some aspects, not all of the power devices need to record the signal and it may be sufficient to determine the order of all power devices from a subset of power devices that record the signals.

The impedance used for PLC communication may be adjusted to prevent effective PLC communication between power devices and thereby determine the order of power devices, the string of a power device in parallel strings, and/or the like. For example, when a power device in one string changes its impedance such that the PLC communication in that string is no longer possible (such as where the power devices creates a large series impedance rendering PLC communications ineffective due to significant signal attenuation by the large series impedance), the other power devices of that string may not be able to effectively communicate with a central power device and the power devices belonging to that string are determined. For example, commanding another power device to adjust impedance that is not from the first string may result in the power devices in the second string from not communicating effectively with the central power device. For example, by repeating this technique, the power devices may be categorized into strings.

A switch in each power device may connect the PLC communication loop to ground, and an impedance filter in each power device may prevent the electrical PLC signal form passing to the next power device in the string. By applying all of the impedance filters, setting the switch to connect the power device PLC communication loop to ground in one power device, and selectively setting the switch to connect the power device PLC communication loop to ground in another power device, the adjacent power device in the string may be located.

For example, under normal operating conditions in a solar power generation system, a PLC communication may be passed between power devices using the solar power connectors, which form a loop, such as a string of power devices connected at both ends to a central power device, such as an inverter. In a normal operating mode, the loop is not connected to ground. During a system installation, when the power devices are connected in a serial string to each other but no power is produced by the system, the central power device may command power devices to set a filter that prevents the PLC communication from passing along the loop. The central power device may then sequentially command each power device in turn to connect to ground, and when a PLC communication signal is received at the central power device, the power device that sent the signal may be the first power device in the string. The central power device may then command sequentially another power device to connect to ground, and when a communication link is established determine that the power device last connected is the second power device in the string. Similarly, the central power device may iteratively determine the order of the power devices in the string accordingly.

Figure 12A:
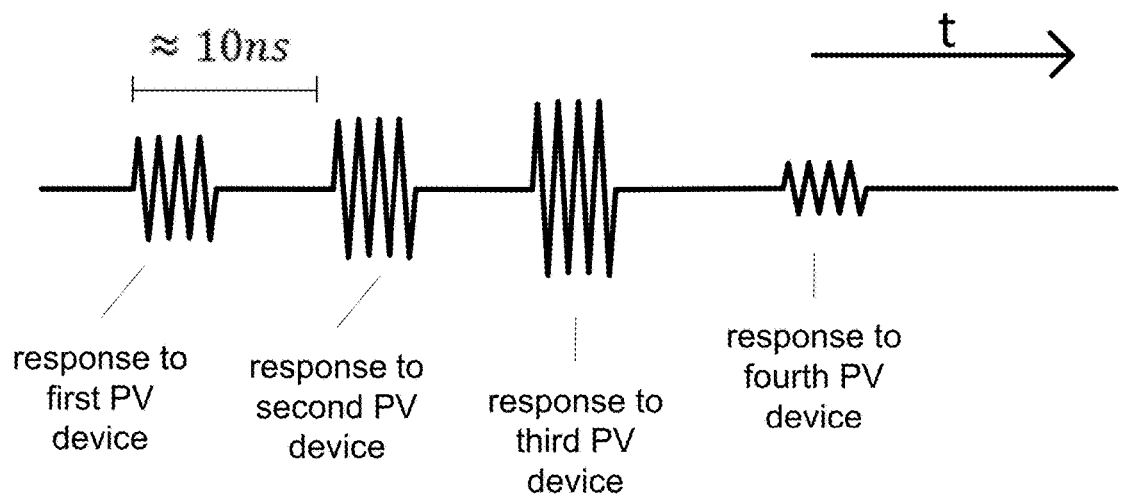
FIG. 12A illustrates an illustrative form of a wave reflected off a transmission line, according to one or more illustrative aspects of the disclosure.

Reference is now made to FIG. 12A, which shows a waveform reflected from a PV string including variable impedances, according to illustrative embodiments described herein. When illustrative variable impedances are switched at a very high frequency, such as a frequency above 100 kilohertz (kHz), such as hundreds of KHz, several megahertz (MHz), tens or hundreds of megahertz, or several gigahertz (GHz), a ripple may be detected on the wave reflected back to the transceiver. When several variable impedances are varied on the same string, the ripple each impedance causes may appear at a different time, due to the difference in distance between impedances. For example, when two PV devices including variable loads are spaced 1.5 meters (in) apart, with one of the PV devices being 1.5 meters closer to the transceiver than the other, the waveform transmitted by the transceiver may travel an additional 1.5 meters to reach the further PV device, and the reflected wave may travel an additional 1.5 meters as well on the way back, for a total difference of 3 meters in the route. Assuming the waveforms travel at the speed of light, C=3·10⁸ m/sec, the ripple caused by the farther variable impedance may appear $$\Delta t = \frac{3[m]}{3 \cdot 10^8 \left[\frac{m}{\sec}\right]} = 10$$

appear nanoseconds (ns) later than the ripple caused by the closer variable impedance.

At other distances, the timing may change, such as from 1 meter to 100 meters, corresponding to approximately 3 to 300 ns transit time. The signal frequency, conductor length, node impedances, and/or the like may determine (at least in part) the signal response characteristics of the power device network. When multiple transceivers and/or receivers may monitor the signals on the network the ordering of the devices on a serial network may be determined, as well as other parameters such as the node impedances, the electrical conductor lengths, and/or the like. High-quality digital or analog sensors may be able to detect time differences at this resolution. For example, when transceiver 115 commands device 104b to vary its impedance, it may detect a ripple appearing on the reflected waveform after 200 ns. When transceiver 115 commands device 104a to vary its impedance, and it detects a ripple appearing on the reflecting waveform after 210 ns, it may determine that device 104a is 1.5 in further than device 104b. By iteratively sending similar commands to each device in the system, the transceiver unit may be able to determine the relative distances of each PV device, and in conjunction with grouping the devices into strings and/or rows (using methods such as the illustrative embodiments shown in FIG. 10), the location of each device may be determined.

A signal transceiver or transmitter at a device that is electrically connected to the PV string may transmit a signal, such as a radiofrequency (RF) pulse. As the signal travels along the PV string, such as along a transmission line, the signal may be attenuated by each power device or power converter along the PV string (such as according to the impedances at each device). When the power devices measure the signal that reaches them, and transmit the signal values to a central processor, the recorded signals may be compared to determine the order of the power converters along the PV string. For example, each power converter may have a small impedance that attenuates the signal by 10%, and the signals recorded at each power converter may be compared to determine the location of each converter along the PV string.

To detect the transmitted signal at each PV power device, the signal reaching each power device is recorded by a receiver located in the power device. The power devices may have a constant impedance, or a multiple impedance switching circuit that may configure one or more output conductor of the power device to a different impedance state, such as a low impedance state, a high impedance state, a short circuit state, an open circuit state, a mid-impedance, and/or the like. For example, an impedance switching circuit may configure one of the output conductors to an impedance of zero ohms (a short circuit), 1 ohm, 2 ohms, 5 ohms, 7 ohms, 10 ohms, 15 ohms, between 0.001 ohm and 5,000 ohms, between 10 ohms and 1000 ohms, between 50 ohms and 500 ohms, less than 5,000 ohms, and/or the like. Here, as elsewhere in the description, ranges may be combined to form larger ranges.

Performing signal transmissions and recording of a signal at each power device, when the impedance configurations of the devices are changed, allows detecting (such as determining) the order of the power devices. For example, when all impedances are the same and a leakage impedance from each panel to ground allows ordering the power devices by signal strength, signal power, signal frequencies, and/or the like. For example, the leakage path through the chassis and parasitic capacitance may change the signal path flow and thus the recorded signal amplitude at each power device is proportional to the order of the power devices in the string.

For example, when a first power device is providing a low impedance (such as a short circuit) and the others are providing high impedance, and the device providing a low impedance is switched from one device to another until the order is determined. For example, when one power device is providing a high impedance and the others are providing a low impedance, and the device with a short circuit is switched among the devices in the string until the order is determined.

The receiver may be part of a transceiver, and each power device performs a transmission and recording of the transmitted signals. For example, each power device transmits a slightly different signal, such as different in phase, frequency, signal shape, signal harmonic content, and/or the like. The signal propagation in the serial conductor may be between 5 and 50 nano-seconds (ns) from one power device to the next, or from the transceiver to the power device, depending on the length of conductor between the two nodes. For example, the distance is 4.5 meters and the signal propagates from one of the two nodes to the other of the two nodes within 15 ns. In this manner, the order of the power devices in the string may be detected.

A signal change may be detected differentially, such as by comparing signal attenuation between two or more states. For example, a signal is measured at each power device during a first impedance configuration among the devices, and after one or more devices change the impedance, the signal is measured again, and the difference between the measured values allows determining the order of the devices at least in part.

For example, one power converter has a high impedance and the other converters have a low impedance, and the power converters between the transceiver and the high impedance converter may record a high signal and the ones on the other side may have a low signal. By changing the impedance of each power converter one at a time, it may be possible to determine the order of the power converters.

Similarly, when all power converters except one have a middle to high impedance, the signals are recorded at each converter, and the low impedance converter is changed (such as reverting to the previous impedance) until the order of the power converters is determined by comparing the recorded signals.

Figure 12B:
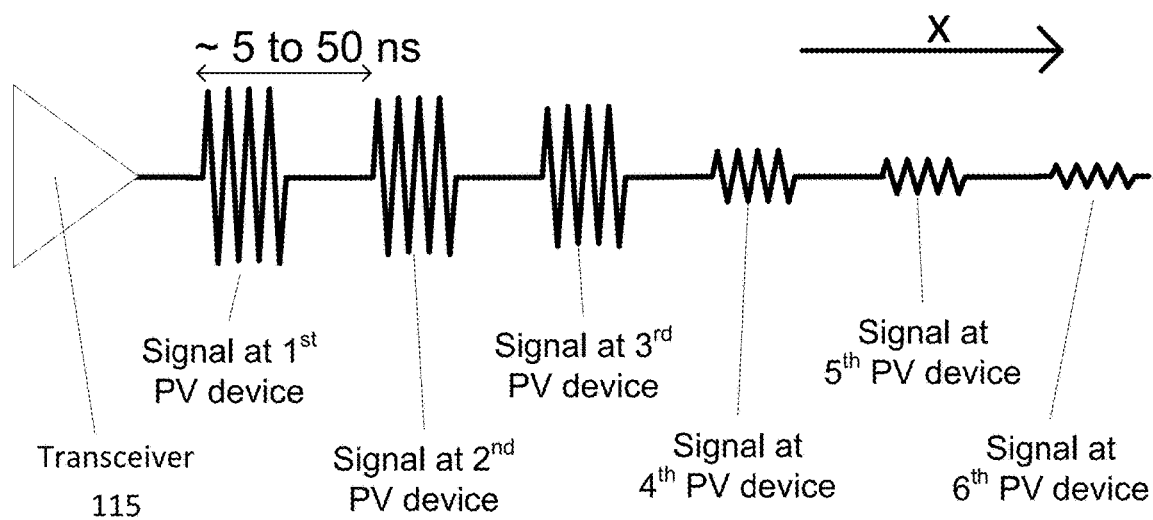
FIG. 12B illustrates an illustrative form of a first wave received at devices along a transmission line, according to one or more illustrative aspects of the disclosure.

Reference is now made to FIG. 12B, which shows an illustrative form of a first wave received at devices along a transmission line according to one or more illustrative aspects of the disclosure. FIG. 12B shows the signal generated from a transceiver 115 as received at each of 6 power converters, where the $4^{th}$ power converter has a high impedance. The power converters between transceiver 115 and the $4^{th}$ power device, such as the $1^{st}$, $2^{nd}$, and $3^{rd}$ devices, may record a high signal strength and the $4^{th}$ power device and the ones after, such as the $5^{th}$ and $6^{th}$ devices, may record a low signal. The high impedance circuit may be located after the signal recorder on each device, and in such a configuration the power converter having the high impedance may record a high signal.

Figure 12C:
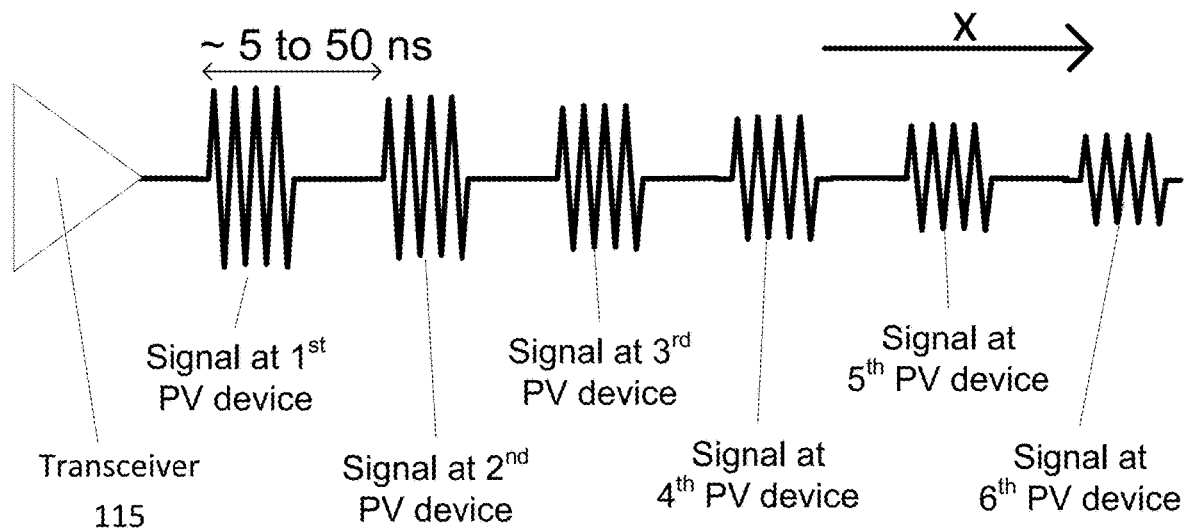
FIG. 12C illustrates an illustrative form of a second wave received at devices along a transmission line, according to one or more illustrative aspects of the disclosure.

Reference is now made to FIG. 12C, which shows an illustrative form of a second wave received at devices along a transmission line according to one or more illustrative aspects of the disclosure. For example, signal attenuation due to leakage may be detected with a signal attenuation of an RF signal received and detected at each power device, such as an optimizer. The natural impedance due to the leakage circuits may be detectable at certain transmission line frequencies.

Figure 12D:
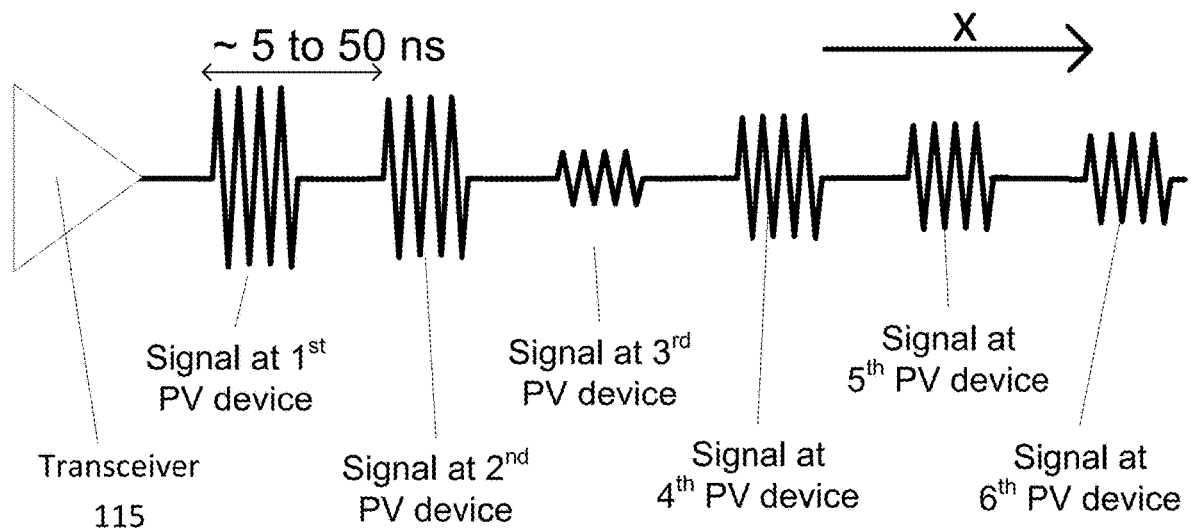
FIG. 12D illustrates an illustrative form of a third wave received at devices along a transmission line, according to one or more illustrative aspects of the disclosure.

Reference is now made to FIG. 12D, which shows an illustrative form of a third wave received at devices along a transmission line according to one or more illustrative aspects of the disclosure. For example, a low-impedance (such as a short circuit) based PV panel locating method may lower the impedance of the power device connected to the PV panel, and the resulting signal changes may show that the power device with low impedance has a lower signal detected at that PV panel node. For example, a first configuration of impedances has inductance of L=10 microHenry and capacitance of C=25 pico-farad so the resonance frequency is approximately $$f_c = \frac{1}{2\pi\sqrt{LC}} = 10 \text{ MHz.}$$

The second configuration is close to a short circuit or a resistance of zero. By sequentially modifying only one of the power devices to a low impedance, maintaining the other power devices at a high impedance may allow detecting the location of each PV panel in the string.

The frequency of the transmitted signal and the impedance changes at each device may be set so that the results of the signal measurement values at each node may be used to determine the order of the power devices in the string. For example, a spread spectrum frequency sweep signal may detect aspects of the PV panel serial order. For example, a signal with a frequency of between 1 KHz and 10 MHz may be used. For example, a signal with a frequency of between 50 KHz and 50 MHz may be used. For example, a signal is used that has a frequency of 5 KHz, 10 KHz, 15 KHz, 20 KHz, 25 KHz, 40 KHz, 50 KHz, 100 KHz, 200 KHz, 500 KHz, 1 MHz, 5 MHz, 10 MHz, 20 MHz, 50 MHz, 100 MHz, 200 MHz, or the like. For example, a signal is used that has a very low frequency (VLF), a low frequency (LF), a medium frequency (MF), a high frequency (HF), or a very high frequency (VHF).

Figure 12E:
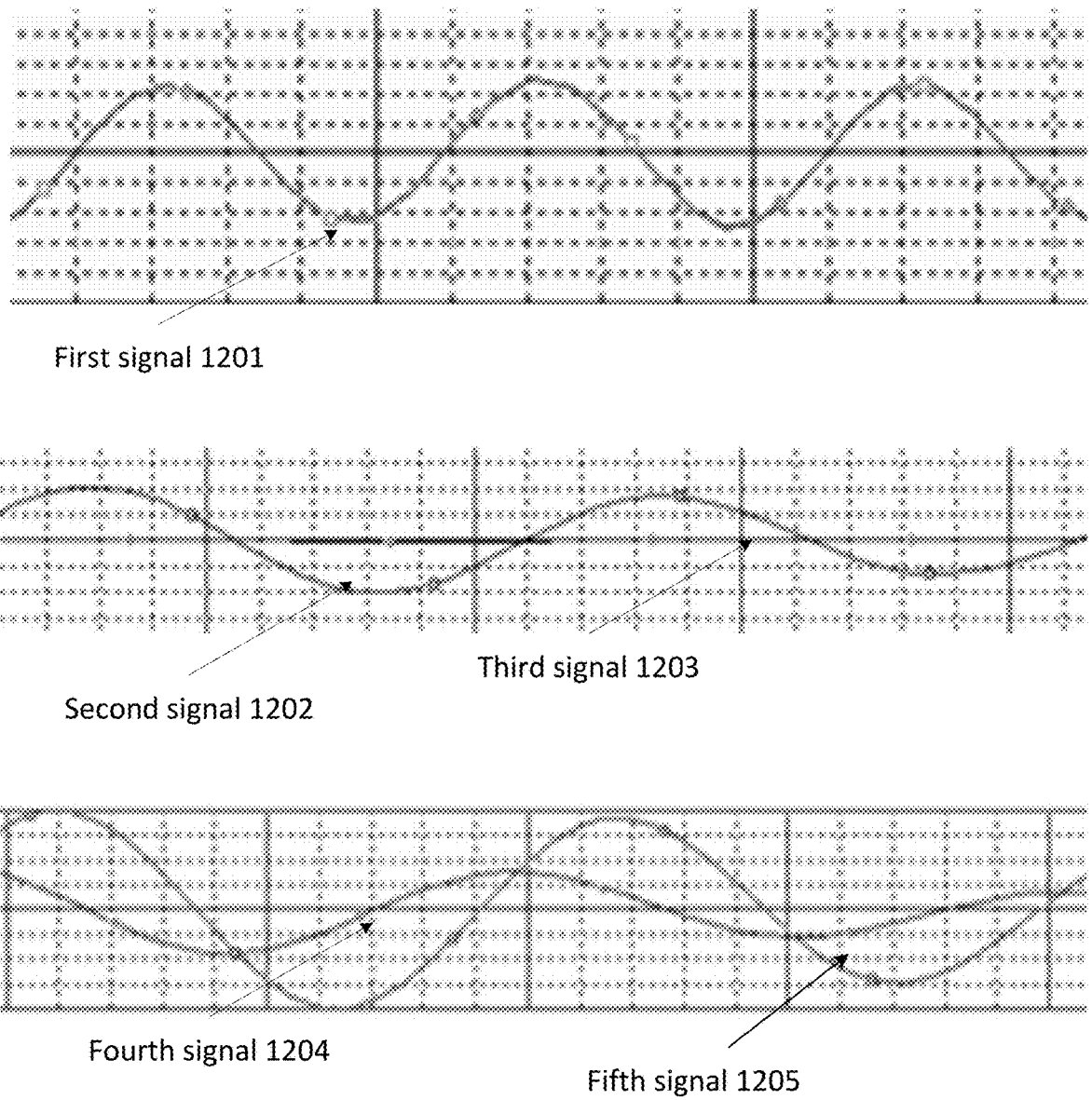
FIG. 12E illustrates an illustrative form of a signals received at devices along a transmission line, according to one or more illustrative aspects of the disclosure.

Reference is now made to FIG. 12E, which shows an illustrative plot of signals received at devices along a transmission line according to one or more illustrative aspects of the disclosure. A first plot 1201 shows the signals recorded at different nodes when the impedance is set to zero at each—such as a short circuit impedance where the signals are at full strength. A second and third plots 1202 and 1203 show a slightly attenuated signal and zero signal from an open circuit respectively. A fourth and fifth plots 1204 and 1205 show a slightly attenuated signal and slightly elevated signal from power devices with intermediate impedances, respectively.

Figure 13:
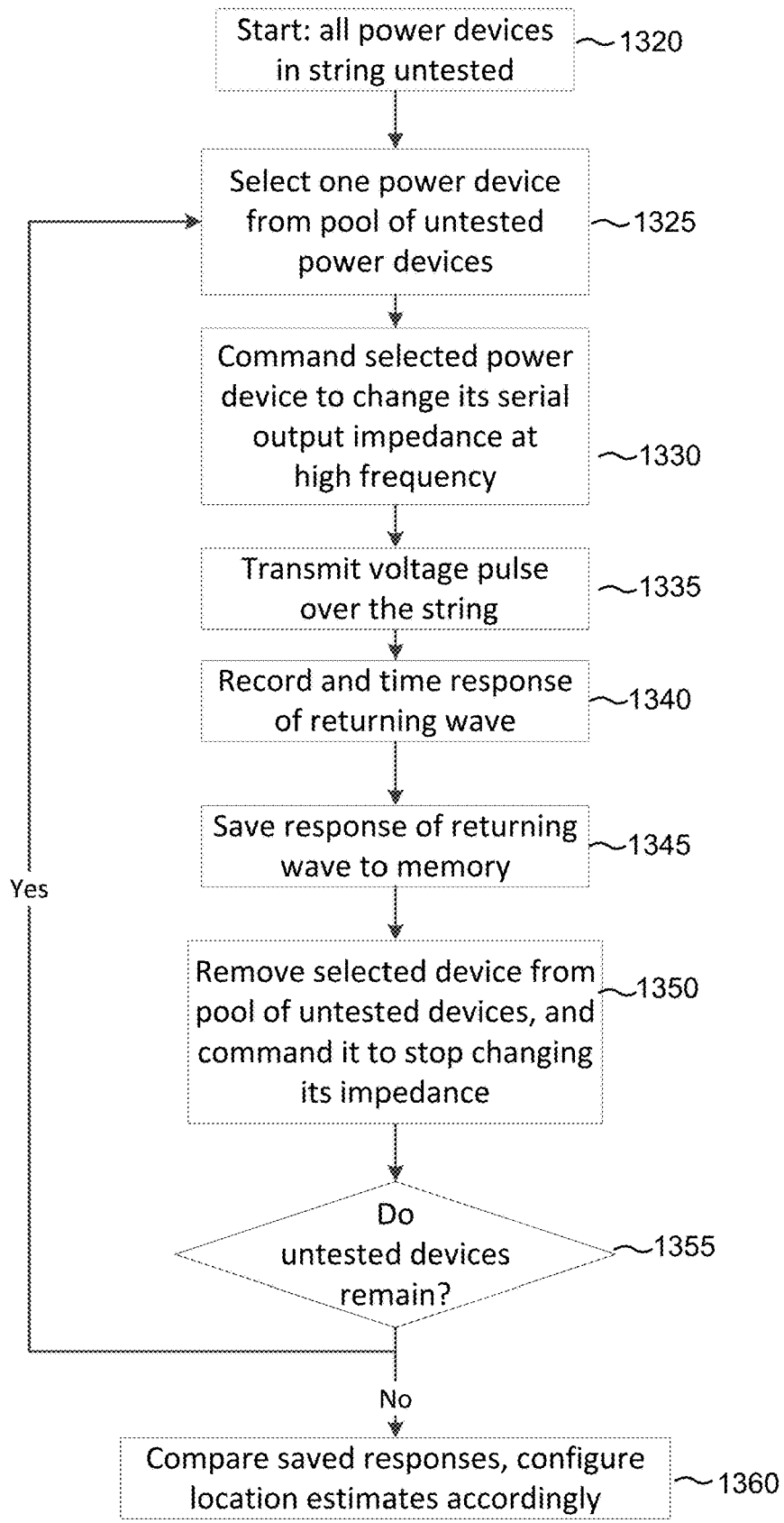
FIG. 13 is a flow diagram of a method for testing power devices, according to one or more illustrative aspects of the disclosure.

Reference is now made to FIG. 13, which shows a flow diagram of a method for testing power devices according to one or more illustrative aspects of the disclosure. In one or more embodiments, the method of FIG. 13, or one or more steps thereof, may be performed by one or more computing devices or entities. For example, portions of the method of FIG. 13 may be performed by components of a computer system. The method of FIG. 13, or one or more steps thereof, may be embodied in computer-executable instructions that are stored in a computer-readable medium, such as a non-transitory computer-readable medium. The steps in the method of FIG. 13 might not all be performed in the order specified and some steps may be omitted or changed in order.

The method of FIG. 13 may be used to determine the relative distances of serially connected PV devices from a waveform-generating transceiver, in a system which may be arranged similarly to the system shown in FIG. 11A. At step 1320, one or more power devices may be defined as "untested", such as they have not been commanded to vary their impedance. For example, initially, all power devices may be determined to be untested.

At step 1325, one of the untested devices is selected. For example, an untested device may be selected randomly at step 1325. At step 1330, the device selected at step 1325 may be commanded to vary its variable impedance. For example, the device may be commanded to vary its variable impedance at a determined frequency, such as a high frequency. At step 1335, a transceiver may transmit a voltage pulse over the PV string. At step 1340, the transceiver may receive the reflected wave, record and/or time the response, and save the received or determined data to memory at step 1345. At step 1350, the selected device may be removed from the pool of "untested" devices, and may be commanded, for example, by the transceiver, to stop varying its output. At step 1355, the transceiver may check or determine when there are devices in the string which are untested. When there are untested devices, the method may return to step 1325, and another power device may be selected. When it is determined, at step 1355, that all power devices have been tested (that is, no untested devices remain), the method may proceed to step 1360. At step 1360 the transceiver (or a master control unit or other system which receives data from the transceiver) may analyze the saved reflected waveforms and time samples, determine (as explained previously) which devices are closer than others, and estimate the distances between devices.

Figure 14:
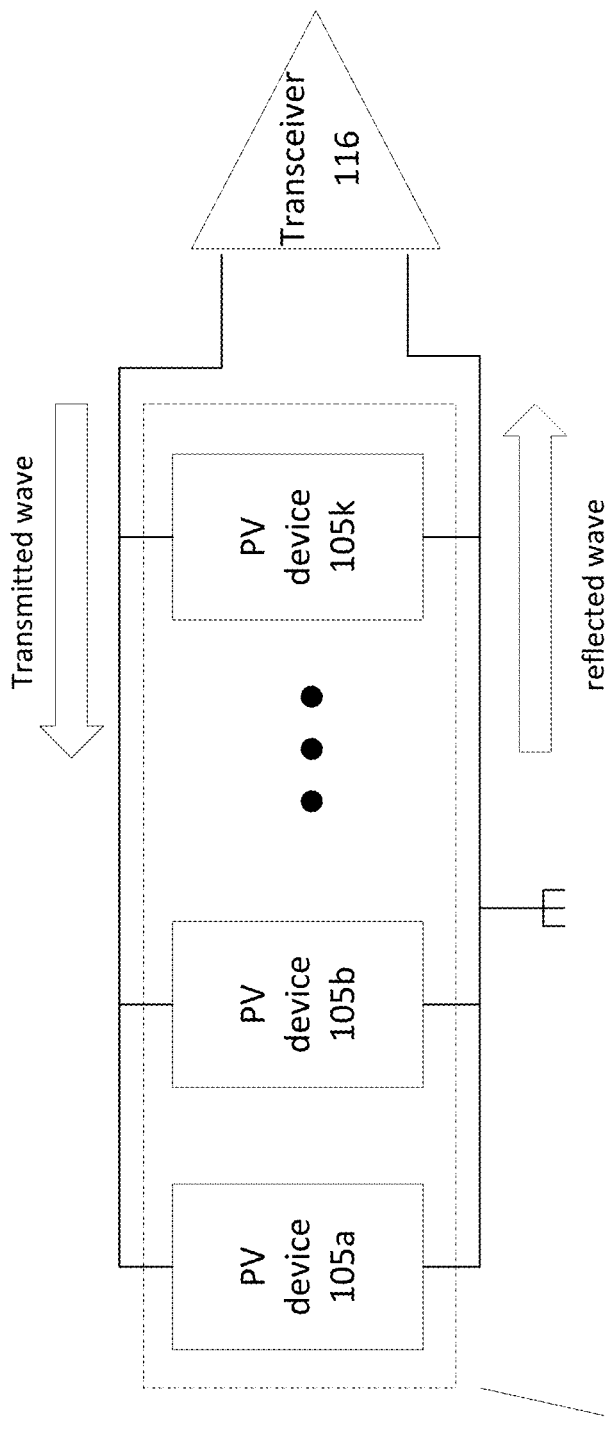
FIG. 14 is a part-block diagram, part-schematic of a PV arrangement, comprising PV system components, which may be used in conjunction with methods described herein.

Reference is now made to FIG. 14, which shows an illustrative PV arrangement. In PV arrangement 309, PV devices 105a, 105b, to 105k are coupled in parallel to one another. Although not illustrated in FIG. 14, the devices 105a-k may be coupled in parallel to a system power device such as an inverter, management and/or communication unit, safety device(s), or other devices. Each PV device 105a-k may be coupled to a power source (such as a PV panel, a battery, a wind turbine, and/or the like) and may include a DC/DC or DC/AC converter configured to output a high-voltage DC or AC voltage which is common to all PV devices 105a-k coupled in parallel. In this illustrative system, devices 105a-k might not be coupled in series with one another. Transceiver 116 may be coupled to the PV devices 105a-k and may be configured to communicate with the devices 105a-k. It may be desirable for the system installer to know the distances between the various devices and the transceiver, or to know the distance ordering (such as which device 105a-k is closest, which is the farthest, and/or the like). In parallel-connected embodiments, a voltage or current pulse may be transmitted, with the PV devices 105a-k taking turns varying their impedance as instructed by the transceiver 116, as explained above in regards to FIGS. 11A-14. In this embodiment, the transceiver 116 may analyze the current returning wave for disturbances caused by the varying impedance circuits, and based on the time delay in recording caused by each PV device, determine and/or list the devices 105a-k in order of distance from the transceiver 116.

Figure 15A:
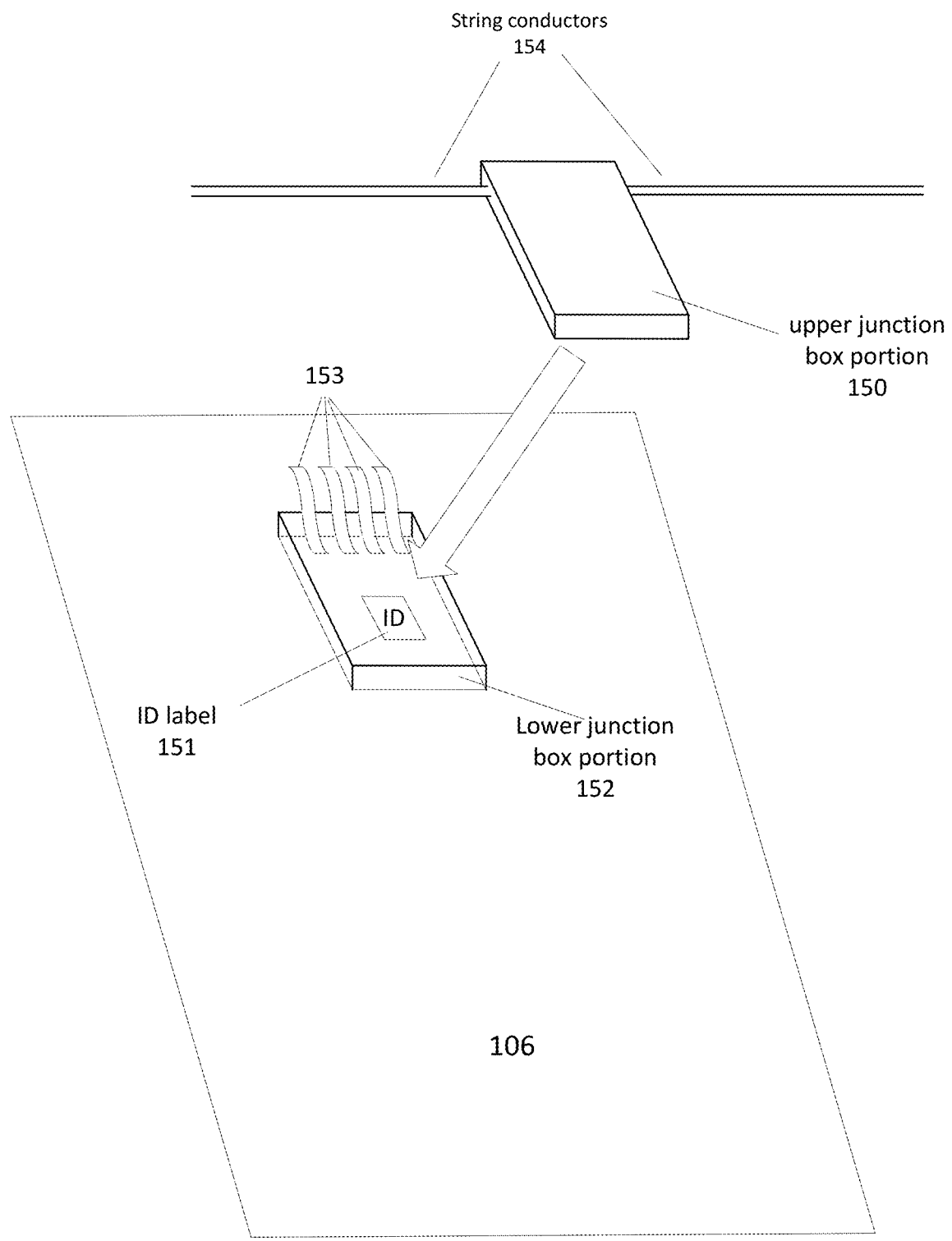
FIG. 15A is a part-block diagram, part-schematic of a PV panel and PV system components which may be used in conjunction with methods described herein.

Reference is now made to FIG. 15A, which depicts a PV device according to illustrative embodiments. PV panel 106 may include one or more solar cells on one side (not explicitly shown), and a lower portion of a junction box 152 on a second side. A plurality of panel conductors 153 such as ribbon wires may be coupled to the PV cells on one side of the panel, and may protrude through slots in the lower junction box portion 152 on the other side. The lower junction box portion 152 may be fastened to the PV panel 106 at the time of manufacturing. An identification label (ID label) 151 may be attached to the panel 106 or lower junction box portion 152 either at the time of manufacturing or thereafter. The ID label 151 may be a barcode, serial number, RFID tag, memory device or any other medium for containing information that may be read by an external device. An upper junction box portion 150 may be mechanically attachable to the lower junction box portion, and may include electronic circuits configured to receive PV power from the conductors 153, and may include string conductors 154 for coupling the upper portion to adjacent PV devices. In some embodiments, the upper junction box portion 150 may be coupled to other upper box portions at the time of manufacturing, using conductors of appropriate length to allow a plurality of upper portions 150 to be attached to a plurality of lower junction box portions during deployment in a PV installation. The upper junction box portion 150 may include an appropriate device for reading the ID label 151 from the panel or lower junction box portion. For example, when the ID label 151 includes a barcode, the upper portion 150 may include a barcode scanner. When the ID label 151 includes a serial number, the upper portion 150 may include a camera and be coupled to a device configured to identify digits and/or letters. The upper portion 150 may include an RFID tag reader, or a device configured to read identifying information from a memory device. The upper portion 150 may read, process and/or communicate the ID information automatically when attached to the lower junction box portion 152. The upper junction box portion 150 may also be configured with its own ID information, and be able to communicate to a management device both its own ID tag and the ID label of the PV panel it is coupled to.

PV device ID tags may be used for several purposes. In some embodiments, the ID tags may be used to create a map of the PV installation including the locations of specific devices in the installation. In some embodiments, the tags may be used to authenticate PV devices and ensure that approved devices are used in the installation, for example, by using an authentication protocol. In some embodiments, the protocol may be carried out by circuits and/or devices comprised in the upper part of the junction box. In some embodiments, the ID tag may be communicated to an external management device, and an authentication protocol may be carried out between components included in the lower portion, the upper portion and an external device or management unit.

Figure 15B:
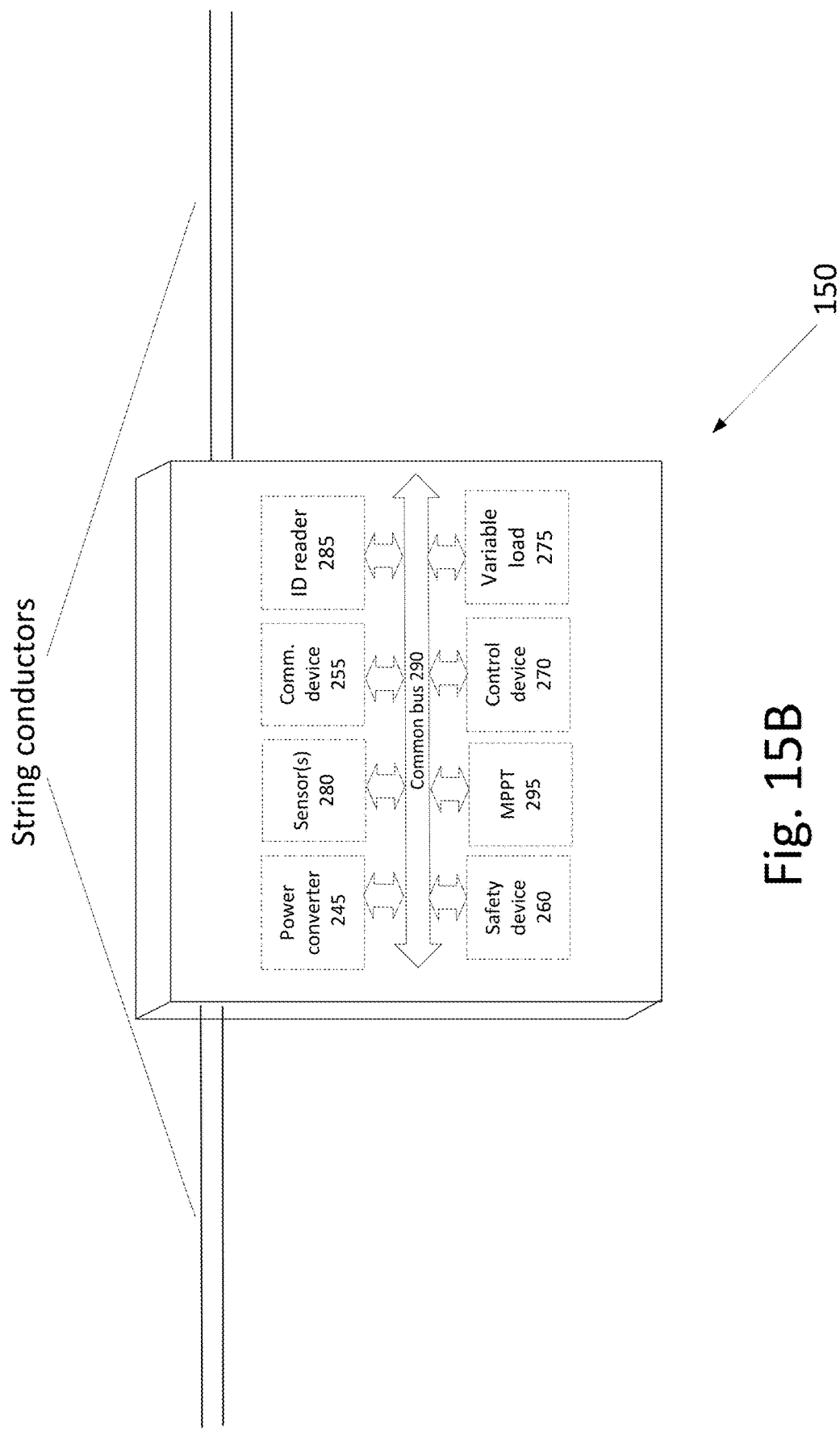
FIG. 15B is a part-block diagram, part-schematic of PV system components which may be used in conjunction with methods described herein.

Reference is now made to FIG. 15B, which shows an illustrative embodiment of an upper portion of a junction box, such as the one that may be used in the arrangement depicted in FIG. 15A. Upper junction box portion 150 may comprise power converter 245, which may be configured to receive DC power from a PV panel and convert it to DC or AC power at the converter outputs. Upper junction box portion 150 may comprise variable load 275. Upper junction box portion 150 may comprise an ID reader 285. Upper junction box portion 150 may further comprise controller 270 such as a microprocessor, Digital Signal Processor (DSP) and/or an FPGA, configured to control some or all of the other functional blocks. In some embodiments, the controller may be split into multiple control units, each configured to control one or more of the functional blocks of upper portion 150. Upper junction box portion 150 may comprise Maximum Power Point Tracking (MPPT) circuit 295, which may be configured to extract power, such as a maximized power, from the PV module the upper portion 150 is coupled to. In some embodiments, controller 270 may include MPPT functionality, and thus MPPT circuit 295 may not be included in the upper portion 150. Controller 270 may control and/or communicate with other elements over common bus 290. In some embodiments, the upper junction box portion may include circuitry and/or sensors 280 configured to measure parameters on or near a PV module or junction box, such as voltage, current, power, irradiance and/or temperature. In some embodiments, the upper junction box may include communication device 255, configured to transmit and/or receive data and/or commands from other devices. Communication device 255 may communicate using Power Line Communication (PLC) technology, or wireless technologies such as ZigBee, Wi-Fi, Bluetooth, cellular communication or other wireless methods. In some embodiments, the upper junction box portion may include safety devices 260 (such as fuses, circuit breakers and Residual Current Detectors). The various components included in upper junction box portion 150 may communicate and/or share data over common bus 290.

Figure 16:
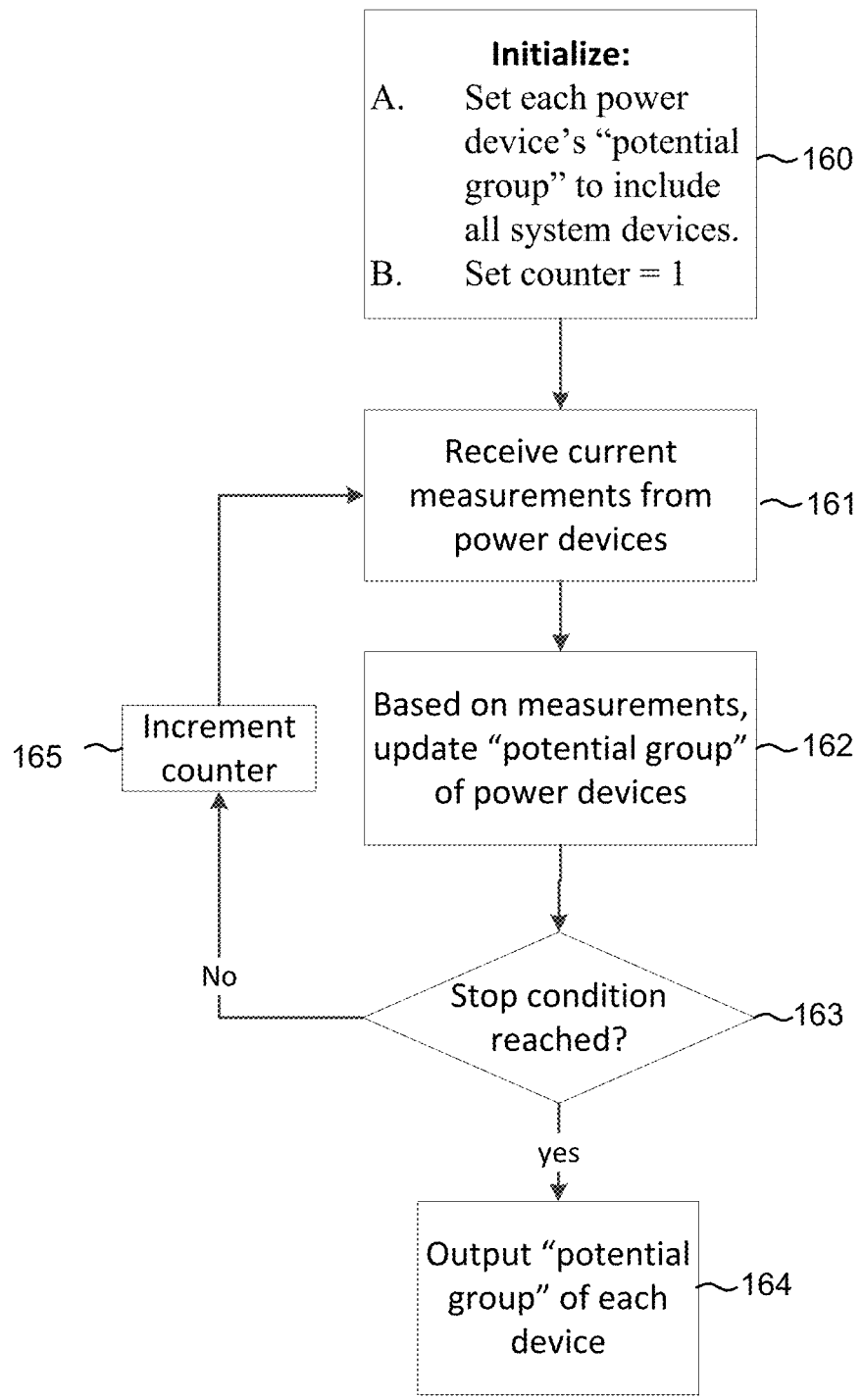
FIG. 16 is a flow diagram of a method for grouping power devices into strings, according to one or more illustrative aspects of the disclosure.

FIG. 16 is a flow diagram of a method for grouping power devices into strings. The method may be used to determine which devices are serially connected to one another in systems such as the system depicted in FIG. 9. The method of FIG. 16, or one or more steps thereof, may be used to group devices into map rows, such as at step 132 of FIG. 2A. The method may apply to a plurality of power devices which are able to report their output parameters (such as voltage, current) to a system management unit communicatively coupled to some or all of the power devices. According to Kirchhoff's Current Law (KCL), serially coupled devices carry the same current. According to KCL, when a plurality of serially-coupled power devices repeatedly report their output current to a system management unit at substantially simultaneous times, the reported currents may be substantially the same in magnitude. By logging the reported currents over a period of time, it may be determined which power devices are unlikely to be serially coupled to one another (such as when two devices report currents which are significantly different at substantially the same time, they are likely not serially coupled) and by a process of elimination and application of an appropriate stopping condition, an accurate estimate of the arrangement of power devices in a PV system may be obtained.

At step 160, initial grouping possibilities may be considered. For example, each power device may be considered to be "possibly paired" to each other power device in the system. In some embodiments, more limiting initial possibilities may be considered based on prior knowledge. For example, it may be known that two power devices are not serially coupled to one another, and they may be initially considered "not paired." In some embodiments, a counter may be optionally set to track the number of iterations the method has run. At step 161, the method may receive current measurements from two or more power devices at substantially the same time.

At step 162, some of the current measurements may be compared to one another. For example, when Device A and Device B are considered "possibly paired" at step 162 of the method, the current measurements of Device A and Device B, $I_A$ and $I_B$, respectively, may be compared to each other. When the current measurements are not substantially the same, the estimated relationship between Device A and Device B may be changed to "not paired." In some embodiments, more than one instance of substantially different currents may be required to change an estimated relationship to "not paired." For example, Device A and Device B may be considered "possibly paired" until three pairs of substantially different current measurements have been reported. In some embodiments, the determination of whether currents are substantially the same is based on an absolute current difference. For example, when $|I_A-I_B|<\epsilon$ for an appropriate $\epsilon$ (such as 10 mA, or 100 mA, or 1 A), then $I_A$ and $I_B$ might be considered "substantially the same." In some embodiments, the determination of whether currents are substantially the same is based on a relative current difference. For example, when $$\frac{|I_A - I_B|}{I_B} < \alpha \text{ and } \frac{|I_A - I_B|}{I_A} < \alpha$$

for an appropriate $\alpha$ (such as 0.01, or 0,03, or 0.1) then $I_A$ and $I_B$ might be considered substantially the same. In some embodiments, multiple criteria may be used to determine when two currents are substantially the same.

By comparing pairs of current measurements to each other as detailed above, it may be determined which devices are unlikely to be serially coupled to one another. In some embodiments, the method may compare current measurements of each pair of power devices considered "possibly paired," and based on the result of the comparison, the method may change the relationship between the pair of power devices to "not paired." In some embodiments, the method may compare only a portion of the current measurements to one another. In some embodiments, some or all the current measurements selected for comparison may be chosen at random.

At step 163, the method determines when a stop condition has been reached. In some embodiments, a stop condition may be reached when a certain number of iterations have been completed. The number of iterations which trigger the stop condition may be fixed (such as 10, 50, or 100), or may depend on the number of power devices in the system (such as N/10, N/2 or $\sqrt{N}$ for a system containing power devices). In some embodiments, the stop condition may be triggered when a certain number of iterations have not changed the relationship between any two power devices. For example, when three method iterations have not changed the relationship between any two devices to "not paired," the stop condition may be reached. In some embodiments, the stop condition may be reached when each power device is considered "possibly paired" to no more than a certain number of other devices. For example, a stop condition may be reached when each power device is considered "possibly paired" to no more than twenty devices, or forty devices, or sixty devices. In some embodiments, a stop condition is reached based on a combination of criteria. For example, a stop condition may be reached only when three method iterations have not changed the relationship between any two devices to "not paired," and additionally, each power device is considered "possibly paired" to no more than fifty devices.

When the method determines that the stop condition has not been reached, at step 165 the iteration counter may be incremented, and the method may return to step 161. When the method determines that the stop condition has been reached, the method may continue to step 164, and for each Power Device X, output the group of power devices that are considered "possibly paired" to Power Device X (such as the "potential group" of Power Device X).

Figure 17A:
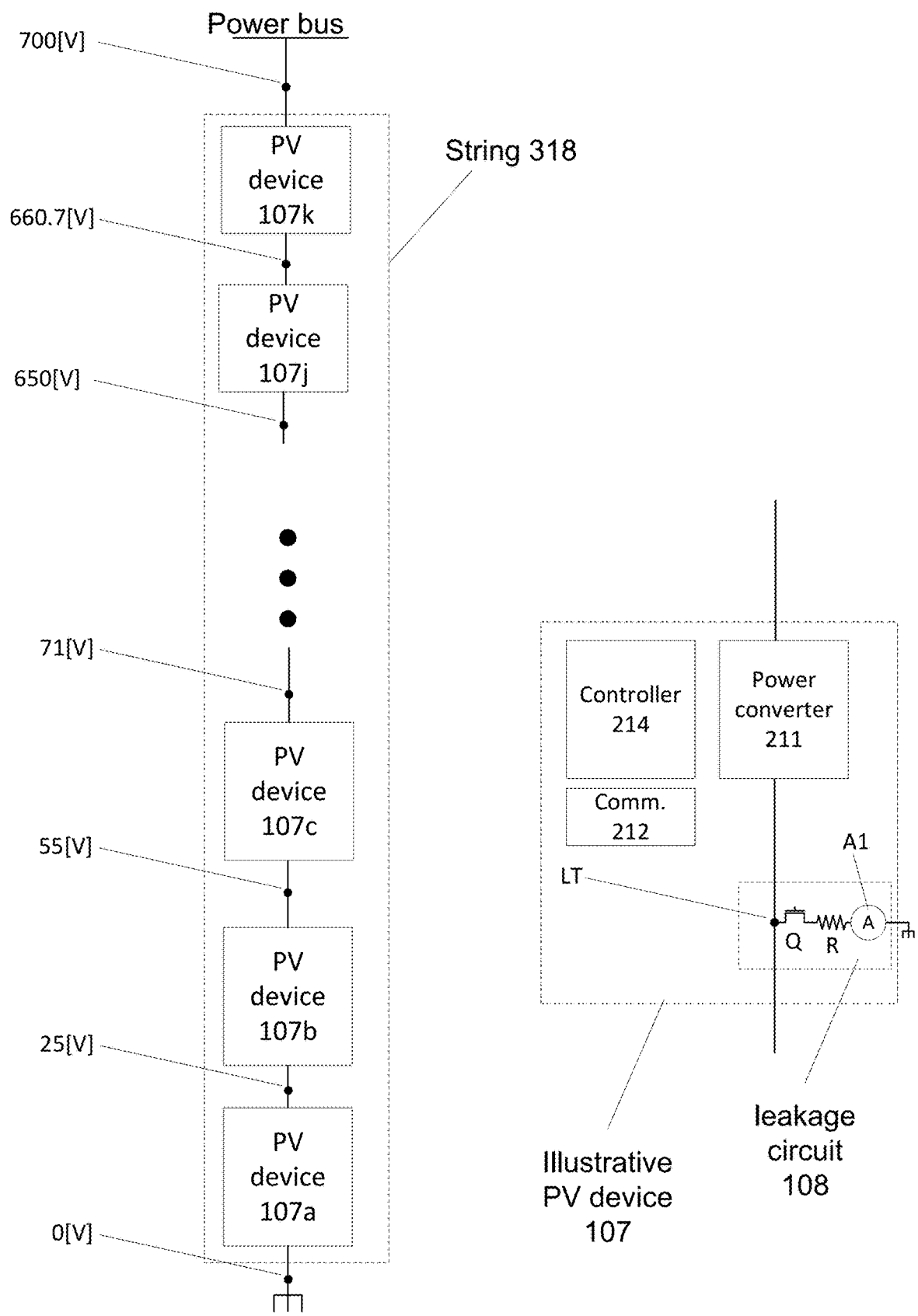
FIG. 17A illustrates an illustrative PV string of PV devices, according to one or more illustrative aspects of the disclosure.

Reference is now made to FIG. 17A, which shows an illustrative embodiment of a PV string of PV devices, where it may be possible to determine the order of the devices within the string. Selective coupling of PV devices to a common ground may result in leakage current, which may be used to determine the ordering of PV devices within a PV string. String 318 may comprise a plurality of serially-connected PV devices 107, such as PV devices 107a, 107b, to 107k. The string 318 may comprise any number of PV devices 104a-k. The string may be coupled between a ground terminal and a power bus. The voltage between the terminals of each PV device may vary from device to device. For example, in the illustrative embodiment depicted in FIG. 17A, PV device 107a outputs 25V, PV device 107b outputs 30V (55V−25V=30V), and PV device 107k outputs 39.3V (700−660.7V=39.3V). The string voltage may be the sum of the voltages output by each PV device in the string, with the power bus being at voltage approximately equal to the string voltage.

Devices 104a-k may comprise elements similar to those previously discussed with regard to PV devices 103 and/or 104. Some elements have not been explicitly illustrated. Devices 104a-k may each include power converter 211 (such as a DC/DC or DC/AC converter) which receives input from a PV panel, battery or other form of energy generation, and produces an output. The converter may include two output terminals for serial coupling to adjacent PV devices in string 318. One output of converter 211 may further be coupled to a leakage circuit 108 at leakage terminal LT. Leakage circuit 108 may be variously configured. In an illustrative embodiment such as shown in FIG. 17A, leakage circuit 108 may comprise a serial branch including resistor R, switch Q and current-sensor A1. The serial branch may be coupled to a common electrical ground. In some PV installations, the mounting structures used to support PV panels may be required to be coupled to a common ground, and in such embodiments, the leakage branch may be coupled to the ground via the mounting structures. In some embodiments, alternative grounding points may be considered. Resistor R may be of large resistance, such as 10 kΩ, 100 kΩ, or even 1MΩ or larger. Switch Q may be implemented using an appropriate device such as a MOSFET. During regular operating conditions, switch Q may be in the OFF position, disconnecting leakage terminal LT from the grounding point. Switch Q may be temporarily switched to ON, allowing current to flow from the leakage terminal LT to the ground. In some embodiments, where switch Q and current sensor A1 may have negligible resistance, a current of magnitude approximately proportional to the voltage at leakage terminal LT may flow through the leakage circuit and be sensed by current sensor A1. For example, when the voltage at leakage terminal is 100V, and the resistor R is of resistance 100 kΩ, current sensor A1 may sense a leakage current of $$\frac{100 \text{ V}}{100 \text{ k}\Omega} = 1 \text{ mA}.$$

In some embodiments, PV device 107 may include a communication device for transmitting leakage current measurements to a management device configured to use the current measurements for appropriate calculations (not illustrated explicitly). Controller 214 may be similar to controller 220 described with regard to FIG. 11A, and may further be configured to control the switching of switch Q. In some embodiments, a separate controller may be dedicated to switching switch Q. Communication device 212 may be configured to communicate with other system power devices for sending or receiving commands or data. For example, communication device 212 may be configured to provide measurements of a voltage or current at leakage terminal LT. Communication device 212 may be a wireless (such as a cellular, ZigBee™, Wi-Fi™, Bluetooth™ or other wireless protocol) transceiver, or a wired communication device (for example, a device using Power Line Communications).

Returning to string 318, in some embodiments each PV device 107 may comprise a leakage circuit similar to leakage circuit 108. Each device may include a current sensor corresponding to sensor A1, and each current sensor may sense a different current, with the magnitude each sensed current indicating a proximity to the system power bus. For example, using the numerical example indicated in FIG. 17A, when each PV device 107a, 107b . . . 107k includes a leakage circuit coupled to the "low voltage" output of a power converter 211, and each PV device includes an identical resistor R=100 kΩ, PV device 107a may sense a current of approximately $$\frac{0 \text{ V}}{100 \text{ k}\Omega} = 0 \text{ A}.$$

PV device 107b may sense a current of approximately $$\frac{25 \text{ V}}{100 \text{ k}\Omega} = 0.25 \text{ mA}.$$

PV device 107c may sense a current of approximately $$\frac{55 \text{ V}}{100 \text{ k}\Omega} = 0.55 \text{ mA}.$$

PV device 107j may sense a current of approximately $$\frac{650 \text{ V}}{100 \text{ k}\Omega} = 6.5 \text{ mA}.$$

PV device 107k may sense a current of approximately $$\frac{660.7 \text{ V}}{100 \text{ k}\Omega} = 6.607 \text{ mA}.$$

It may be observed that the closer a PV device is to the power bus, the higher the magnitude of the sensed current may be, and in some embodiments, it may be possible to estimate the relative order of the PV devices 107a . . . 107k with regard to the power bus by comparing the current magnitude sensed by each PV device.

Figure 17B:
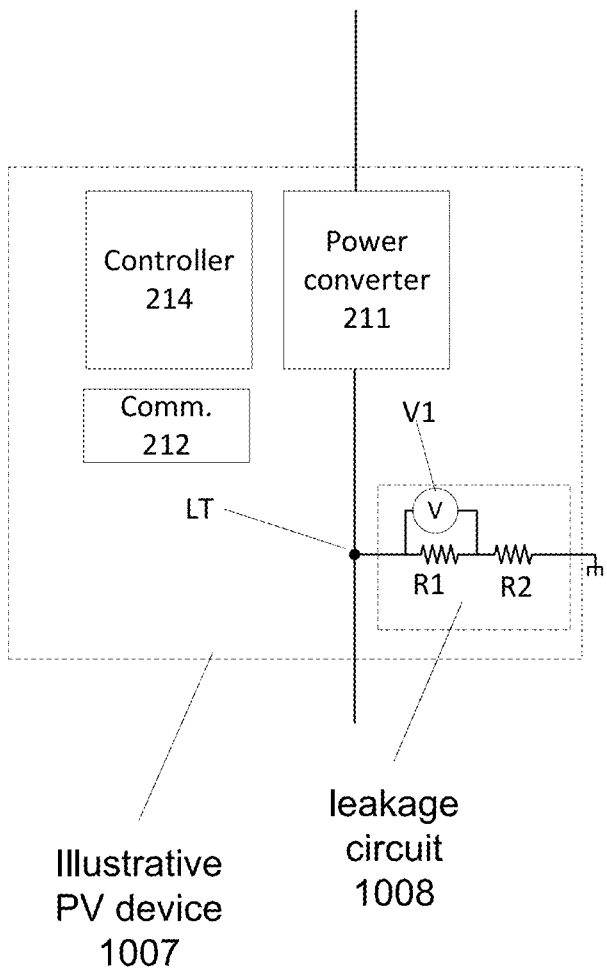
FIG. 17B illustrates an illustrative current leakage circuit, according to one or more illustrative aspects of the disclosure.

Reference is now made to FIG. 17b, which shows a leakage circuit according to an illustrative embodiment. PV device 1007 may be used instead of PV devices 107 in FIG. 17A. For example, PV devices 107a-107k of FIG. 17A may be replaced by a corresponding plurality of PV devices 1007a-k. PV device 1007 may comprise controller 214, power converter 211 and communication device 212, which may be the same as controller 214, power converter 211 and communication device 212 of FIG. 17A. PV device 1007 may feature a leakage terminal (LT) similar to that of PV device 107. Leakage circuit 1008 may comprise voltage sensor V1 and resistors R1 and R2. Resistor R2 may have a very large resistance, such as 100 MΩ, 1 GΩ, 2 GΩ or even 10 GΩ. R1 may be substantially smaller than R2. For example, R1 may have a resistance of under % 1 of R2. A high-impedance current path may be provided between leakage terminal LT and the ground, via resistors R1 and R2. R1 and R2 may be of sufficient resistance to hold leakage current to a small value, which may reduce losses due to the leakage current. For example, R2 may be 5 GΩ and R1 may be 10 MΩ, for a total resistance of 5.01 GΩ. When the voltage at LT is 500V, the leakage current may be about 100 μA. Voltage sensor V1 may measure the voltage across resistor R1. Since R2 may be much larger than R1, R2 may absorb the majority of the voltage drop at leakage terminal LT. As an illustrative example, assume that R2 is 99 times as large as R1, resulting in R2 absorbing 99 percent of the voltage drop at LT, and R1 absorbing 1 percent of the voltage drop at LT. When a series of PV devices 1007 are serially coupled, each having a leakage terminal and a leakage circuit 1008, each respective voltage sensor V1 of each respective leakage circuit 1008 may measure a voltage equal to about % 1 of the voltage at the respective leakage terminal. By determining a relative order in magnitude of the respective voltage measurements, an order of the serially-coupled PV devices 1007 may be determined (such as by a centralized controller which may receive the voltage measurements measured by the respective voltage sensors).

Figure 18:
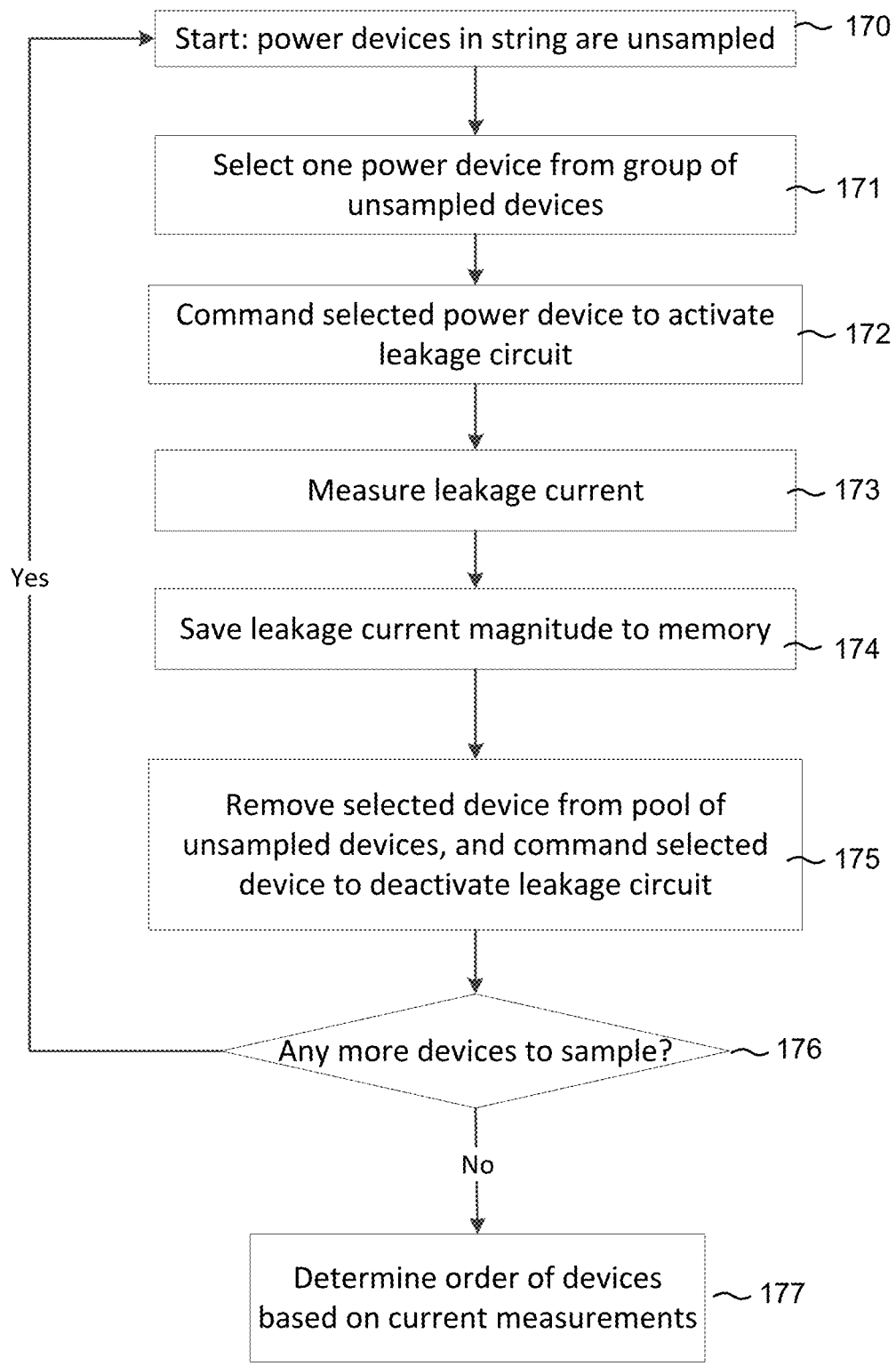
FIG. 18 is a flow diagram of a method for determining the order of power devices within a PV string, according to one or more illustrative aspects of the disclosure.

FIG. 18 is a flow diagram of a method for determining the order of power devices within a PV string, which may be similar to the PV string illustrated in FIG. 17A. At step 170, some power devices may be considered "unsampled," such as power devices at which leakage currents have not been sampled. At step 171, a power device from a group of unsampled devices may be selected. In some embodiments, a device may be selected from a group of unsampled devices at random. In some embodiments, a device may be selected from a group of unsampled devices according to predetermined criteria, such as according to an estimated location within a PV string. At step 172, a power device selected at step 171 is commanded to activate the power device's leakage circuit. A power device command may be received via various communication methods, for example PLC and/or wireless communications, and the command may be sent by a system management unit. At step 173, upon reception of a command to activate a leakage circuit, a power device's leakage circuit may be activated. A leakage circuit may be similar to the one illustrated in FIG. 17A, and an activation of a leakage circuit may comprise setting the switch Q to the ON position. A current sensor similar to the sensor A1 illustrated in FIG. 17A, may measure a leakage current obtained when is at the ON position. At step 174, a leakage current may be measured and the measurement may be saved to a data logging device. The data logging device may comprise flash memory, EEPROM or other memory devices. At step 175, the power device selected at step 171 may be removed from the pool of un-sampled devices, and a command may be issued to the power device to deactivate the power device's leakage circuit. Deactivation may comprise setting the switch Q to the OFF state. At step 176 the method may determine when additional power devices are to be sampled. In some embodiments, method may sample the leakage current of each power device in the string, and as long as there is at least one power device which has not yet activated its leakage circuit, the method may loop back to step 170. In some embodiments, the method may proceed to step 177 even when some power devices have not yet activated their respective leakage circuits. At step 177, the logged leakage current measurements may be compared, and based on the measurements, a relative order of power devices corresponding to the leakage current measurements may be estimated. For example, when three leakage currents have been measured, for example $I_A$, $I_B$, $I_C$, with the three current measurements corresponding to power devices $D_A$, $D_B$, $D_C$, and when $I_A<I_B<I_C$, then the method may determine that $D_C$ may be the closest device of the three to the power bus, and that $D_A$ may be the farthest of the three devices from the power bus. When leakage currents of all power devices in a PV string have been sampled, it may be possible in some embodiments to determine the order of all of the power devices in the string.

Figure 19:
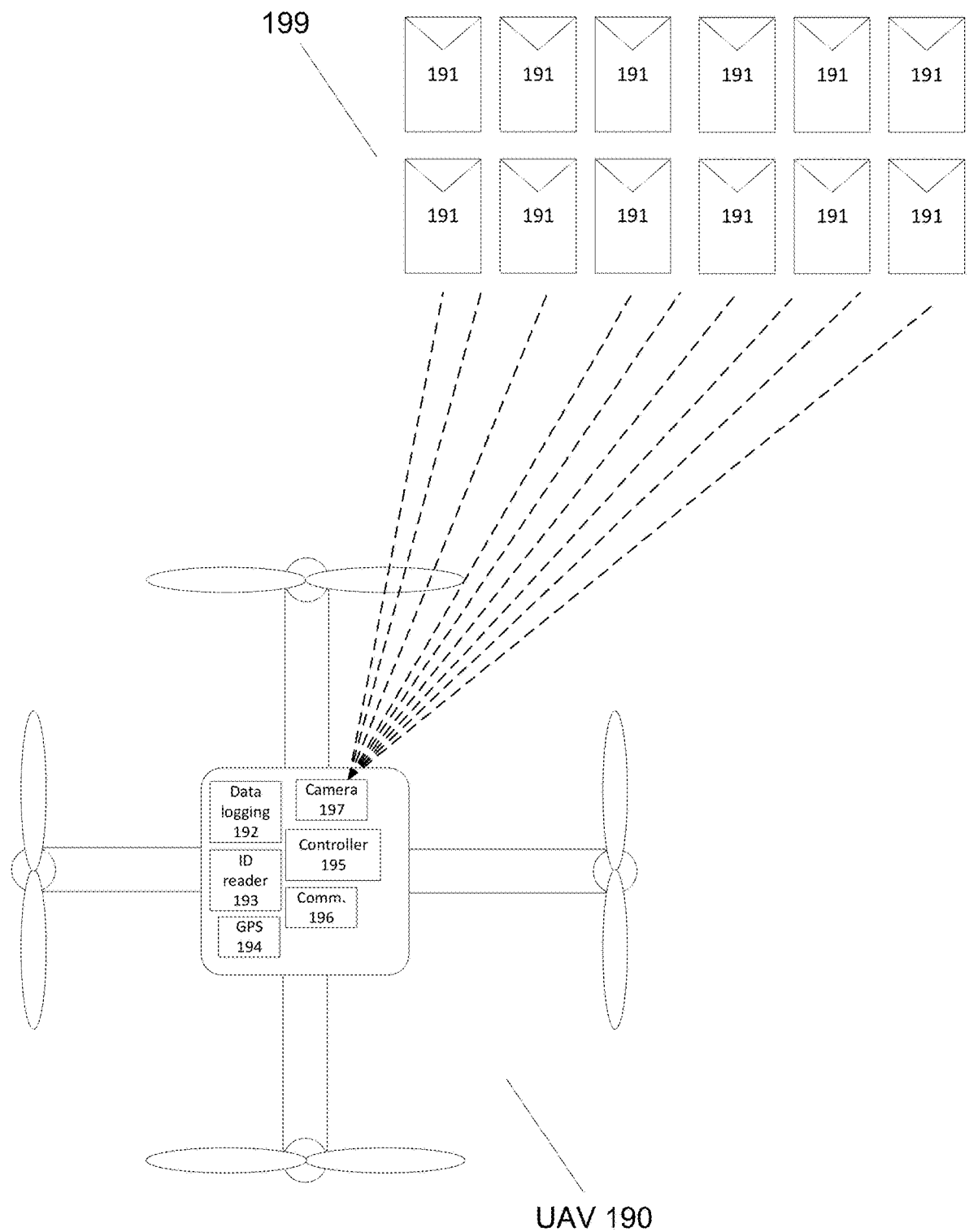
FIG. 19 illustrates illustrative devices which may be used for reading identifying information and/or estimating device location, according to one or more illustrative aspects of the disclosure.

Reference is now made to FIG. 19, which illustrates a portion of a photovoltaic installation and a mapping Unmanned Aerial Vehicle (UAV) according to an illustrative embodiment, Photovoltaic (PV) installation 199 may comprise PV modules 191. One or more Unmanned Aerial Vehicles (UAV) 190 may be used to obtain Estimated Layout Map (ELM) of PV installation 199, such as to determine the relative order and/or location of PV modules 191. PV modules 191 may comprise PV generators (such as one or more PV cells, PV strings, PV substrings, PV panels, PV shingles, and/or the like) coupled to photovoltaic power devices (such as PV optimizers, DC/DC converters, DC/AC inverters). In some embodiments, each PV module 191 may comprise an identification label (ID label) which may be readable by UAV 190. The ID label may be a barcode, serial number, RFID tag, memory device or any other medium for containing information that may be read by an external device, with UAV 190 comprising an appropriate device for reading the ID label. For example, each PV module 191 may have an RFID tag, while UAV 190 may have an RFID reader. In some embodiments, each PV module 191 may have a barcode sticker, tag, while UAV 190 may have a barcode scanner. UAV 190 may have various functional devices similar to those comprising combined device 700 of FIG. 7. For example, UAV 190 may comprise controller 195, communication device 196, GPS device 194, ID reader 193, and data logging device 192, which may be similar to or the same as ID reader 203, GPS device 201, data logging device 202, controller 205, and communication device 206 of FIG. 7.

In some embodiments, UAV 190 may automatically read the ID tag of each of PV modules 191. In some embodiments, UAV 190 may be in proximity to each PV module at the time the PV module's ID tag is read, and use GPS device 194 to estimate the coordinates of the PV module being scanned. The method of FIG. 2A may be used to generate an ELM of the PV installation using the measured or estimated GPS coordinates of the PV modules.

UAV 190 may be variously realized. For example, a drone, miniature helicopter, remote-controlled airplane or various other UAVs may be utilized.

In some embodiments, UAV 190 may comprise a thermal camera. For example, camera 197 may be a thermal camera for obtaining a thermal image of PV installation 199, and by taking multiple thermal images of PV installation 199 over time, relative locations of PV modules may be estimated for generating an ELM, using methods disclosed herein.

Figure 20:
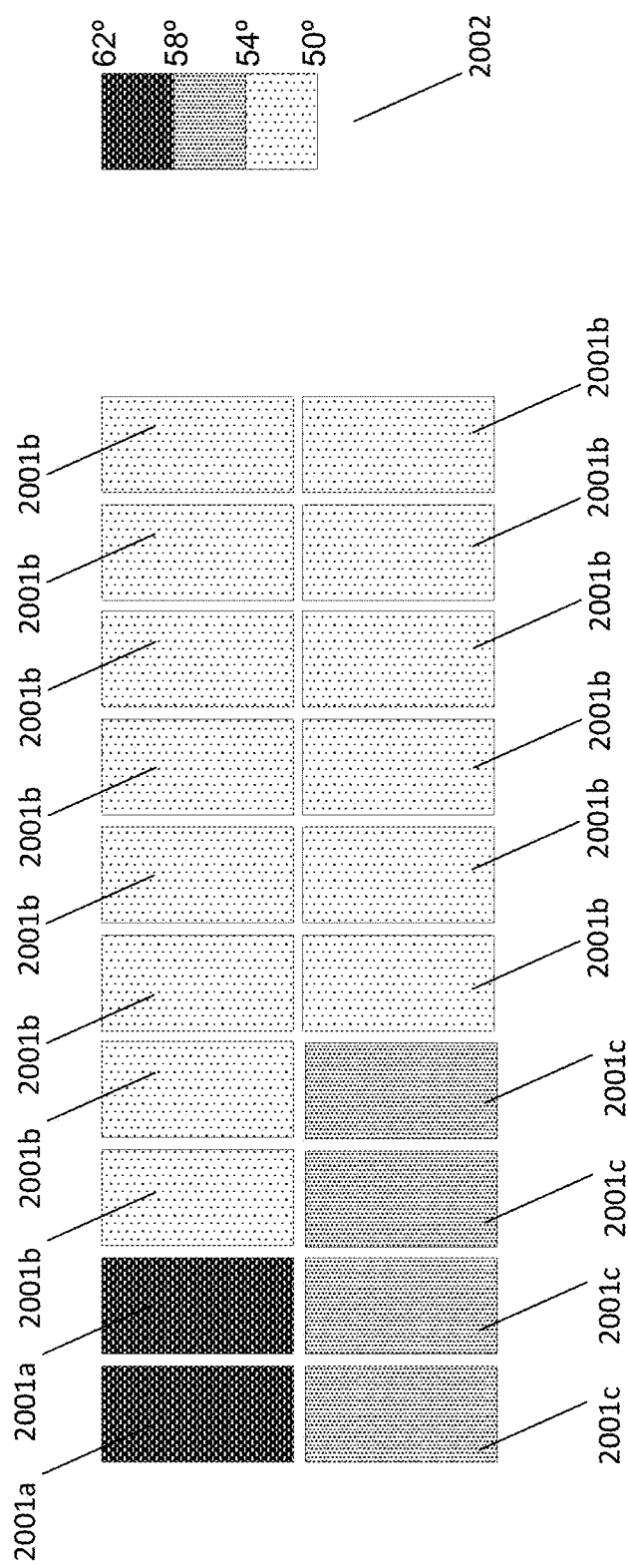
FIG. 20 illustrates a thermal image of a group of photovoltaic modules, according to one or more illustrative aspects of the disclosure.

Reference is now made to FIG. 20, which illustrates thermal properties of photovoltaic generators (such as photovoltaic panels) which may be featured in accordance with methods and apparatuses disclosed herein. Some types of photovoltaic panels may generate increased heat when photovoltaic power generated by the panel is not provided to an electrical load. Photovoltaic power may be generated by a PV panel as a result of photovoltaic cells mounted on the PV panel absorbing solar irradiance. When an electrical load is coupled to a PV panel, some of the absorbed solar irradiance may be converted to electrical power provided to the load. When no electrical load (or a reduced electrical load) is coupled to the PV panel, an increased portion of the absorbed irradiance may be converted to heat, which may result in an increased temperature of the PV panel. When an electrical load is coupled to a PV panel, but the load only draws a small portion of the PV power produced by the panel, the panel temperature may be lower than the temperature when compared to the "no-load" case, but may be higher than the temperature that would be measured when an electrical load drew an increased amount of PV power from the PV panel.

With reference again to FIG. 20, this figure shows an illustrative thermal image of a group of PV generators (which may be used as PV modules 191 of FIG. 19). PV generators 2001b may be providing a first level of electrical power (such as 300 watts) to a load, PV generators 2001c may be providing a second level of electrical power (such as 200 watts) to an electrical load, and PV generators 2001 may be providing a third, lower level of electrical power (such as 50 W) to an electrical load, or might not be providing any electrical power to a load. All of PV generators 2001a-2001c may be irradiated by substantially the same level of solar irradiance. As indicated by temperature bar 2002, a reduced provision of electrical power to a load may increase a temperature of an associated PV generator in a manner (such as by about 4° C.) which may be visually detectable by a thermal image.

With reference yet again to FIG. 20, which illustrates a thermal image portion of a photovoltaic string according to an illustrative embodiment, PV panels 2001a-2001f may be coupled in series or in parallel to form part of a PV string. At the time the thermal image was obtained, PV panels 2001a-2001e were coupled to an electrical load, and PV panel 2001f was not coupled to an electrical load. PV panel 2001f may be observed to be visually distinguishable compared to PV panels 2001a-2001e.

Referring back to FIG. 19, camera 197 may be used to obtain thermal images similar to the thermal images illustrated in FIGS. 20A-20C, with controller 195 configured to implement a method for determining a ELM from images obtained by camera 197. A succession of thermal images similar to the images of FIGS. 20A-20C may be obtained and stored in data logging device 192, with controller 195 configured to read the images from data logging device 192 for processing.

Figure 21:
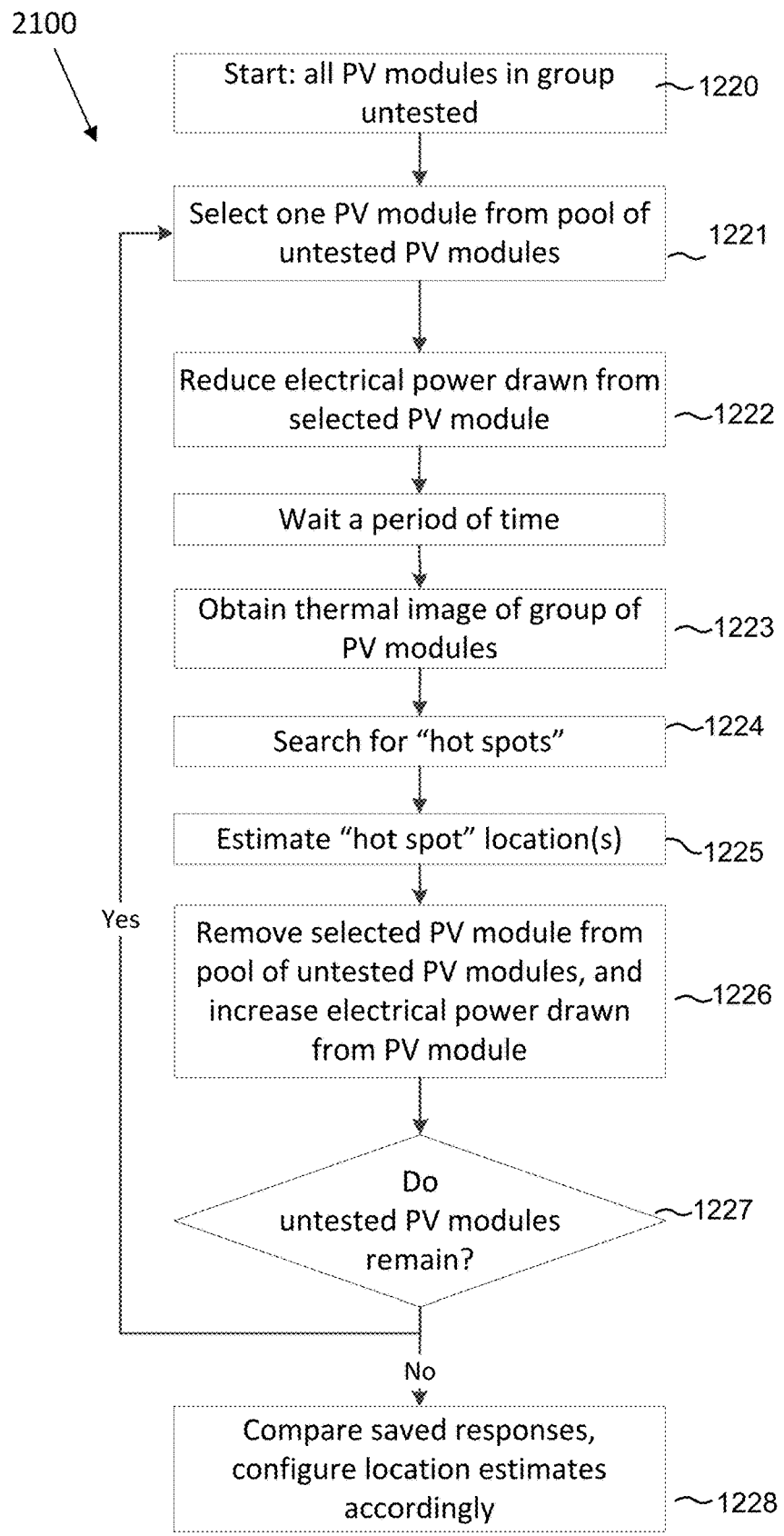
FIG. 21 is a flow diagram of a method for determining relative locations of one or more PV modules within a group of PV modules, according to one or more illustrative aspects of the disclosure.

Reference is now made to FIG. 21, which illustrates a method for installation mapping according to one or more illustrative aspects of the disclosure. Method 2100 may be carried out by a controller comprised by a UAV (such as controller 195 of FIG. 19), or by a system-level controller in communication with PV modules and/or a UAV, or by a combination thereof. For illustrative purposes, it may be assumed that method 2100 is carried out by controller 195 of FIG. 19 and applied to PV modules 191 of FIG. 19. Each PV module 191 may comprise a PV power device capable of increasing or decreasing the electrical power drawn from the PV model. For example, in some embodiments, each PV module 191 may comprise a disconnect switch configured to disconnect the PV module from a string of PV modules which coupled to an electrical load. By disconnecting a selected PV module from the string of PV modules, the selected PV module may cease providing power to the electrical load, and the temperature of the selected PV module may rise. In some embodiments, each PV module 191 may be coupled to an optimizer, each optimizer configured to increase or reduce the power drawn from the corresponding PV module.

PV power devices coupled to PV modules 191 may be in communication with a controller carrying out method 2100 or part thereof. For example, PV power devices coupled to PV modules 191 may comprise wireless communication devices configured to communicate with communication device 196 of UAV 190.

Method 2100 may be applied to a group of PV modules without regard for interconnectivity. Method 2100 may effectively map PV modules which are electrically connected (such as modules which are part of the same PV string) and may effectively map PV modules which are not electrically connected (such as modules which are part of different PV strings).

At the start of method 2100, at step 1220, all PV modules in the group are considered "untested". At step 1221, a controller (such as the controller carrying out method 2100 or part of method 2100) may select a PV module from the pool of untested PV modules. At step 1222, the controller reduces the electrical power drawn from the selected. PV module. For example, the controller may command a PV power device (such as a disconnect switch or an optimizer) coupled to the PV module to reduce the electrical power drawn from the PV module (such as by disconnected the PV module from a load, or by operating the PV module at an operating point which reduces the power drawn from the PV module.

After the electrical power drawn from the PV module is reduced, it may take several minutes for the temperature of the PV module to substantially rise. The controller may wait for a period of time (such as 3, 5, 10 or 20 minutes) before proceeding to step 1223.

At step 1223, the controller may control a thermal imaging device (such as camera 197) to obtain a thermal image of the group of PV modules. At step 1224, the controller may analyze the thermal image to find "hot spots", e.g., areas in the image which indicate a higher temperature. In some embodiments, the thermal image may comprise temperature measurements which may be numerically compared. In some embodiments, the thermal image may be represented by pixels of varying colors and/or shades of gray, with the controller configured to process the image and detect areas comprising pixels which may be indicative of a higher temperature (e.g. red, or darker shades of gray).

At step 1225, the controller may estimate the relative location of a hot spot detected at step 1224. For example, the controller may determine that the group of PV modules comprises nine PV modules placed side-by-side (e.g. similar to the depiction of FIG. 20C), with the fourth PV module from the right (i.e. PV module 2001) hotter than the rest. In some embodiments, the controller may have estimated physical coordinates of one of the PV modules, and may use the estimated coordinates as an "anchor" node for estimating locations of the other PV modules. In some embodiments, the controller may determine a relative ordering or relational placements (e.g. to the right of, to the left of, in front of, behind) of the PV modules in the group, and aggregate the relational placements to generate a ELM.

In an embodiment, method 2100 may be adapted to have all PV devices initially not providing substantial power to an electrical load. The method may be adapted at step 1222 to increase the electrical power drawn from the selected PV module, at steps 1224-1225 to detect and estimate "cold spot" locations, and at step 1226 to decrease the electrical power drawn from the selected PV module.

At step 1226, the PV module selected at step 1221 is removed from the group of untested PV modules, and the power drawn from the selected PV module is increased (e.g. by commanding a disconnect switch to reconnect the PV module to an electrical load, or commanding an optimizer to operate the PV module at an increased-power operating point).

At step 1227, the controller determines if untested PV modules remain, i.e., if there are PV modules in the group which have not yet been selected at step 1221. If untested PV modules remain, the controller may loop back to step 1221. If no untested PV modules remain, the controller may proceed to step 1228.

At step 1228, the controller may aggregate the hot spot locations estimated at step 1225 over the method iterations, to produce an estimated ELM.

In an alternative embodiment, thermal images obtained at step 1223 may be saved to memory, with steps 1224-1225 carried out after the final iteration of step 1227. In other words, analysis of thermal images may be delayed until after a full set of thermal images (one per iteration through steps 1221-1227) has been obtained. In a preferred embodiment, steps 1224-1225 are carried out in the order indicated in FIG. 21, to enable the controller to repeat iterations if needed. For example, method 2100 may comprise an additional step of ensuring that a "hot spot" has been detected at step 1224, and in the event that the method has not identified a hot spot in the thermal image obtained at step 1223, having the method loop back to step 1221, or alternatively, wait an additional several minutes and then loop back to step 1223.

Method 2100 may be combined with other methods disclosed herein, for example, to increase the accuracy of ELMs and PIMs generated by methods disclosed herein. For example, method 2100 may be used to obtain an initial ELM, with the method of FIG. 18 used for validation (or vice-versa).

In some embodiments, reference was made to "upper" and "lower" junction box portions. This language was used for ease and is not intended to be limiting. In some embodiments, the two portions may be side-by-side, and/or functional circuitry may be transferred from one junction box portion to other, in a manner that allows them to be in electrical communication when coupled to one another.

In the illustrative embodiments disclosed herein, PV modules are used to exemplify energy sources which may make use of the novel features disclosed. In some embodiments, the energy sources may include batteries, wind or hydroelectric turbines, fuel cells or other energy sources in addition to or instead of PV modules. The current routing methods and other techniques disclosed herein may be applied to alternative energy sources such as those listed above, and the mentioning of PV modules as energy sources is for illustrative purposes only and not intended to be limiting in this respect. For example, any other energy sources or combination of energy sources may be used.

It is noted that various connections are set forth between elements herein. These connections are described in general and, unless specified otherwise, may be direct or indirect; this specification is not intended to be limiting in this respect. Further, elements of one embodiment may be combined with elements from other embodiments in appropriate combinations or subcombinations.

Specific dimensions, specific materials, specific ranges, specific frequencies, specific voltages, specific impedances, and/or other specific properties and values disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (for example, the disclosure of a first value and a second value for a given parameter may be interpreted as disclosing that any value between the first and second values may also be employed for the given parameter). For example, parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, when parameter X is exemplified herein to have values in the range of 1-10, or 2-9, or 3-8, it is also envisioned that parameter X may have other ranges of values including 1-9, 1-8, 1-3, 1-2, 2-10, 2-8, 2-3, 3-10, and 3-9.

EXPERIMENTAL RESULTS

Parasitic leakage from the DC+ and/or DC− lines of a power device to ground may be dominated by the leakage from the power device over other sources. For example, the device leakage may be approximately 250 pf (e.g., from MOSFET spreaders to the power device chassis) and solar panel leakage to enclosure may be approximately 100 pf. The PV string power devices' impedance, such as from switch bodies, inductors, capacitors, and/or leakage capacitances, may be modified using switches configured to tune the impedance to a mapping signal frequency, such as using switches that connect capacitors and inductors in series or parallel. For example, the switches may adjust the impedance incrementally until a best match is found to the tuning signal. The signal frequency may be tuned or adjusted to the devices' impedances, such as an adjustable frequency transmitter searching for an optimal frequency based on a fixed set of impedance changing components being connected. A spread spectrum signal injection may be used to send a plurality of signal frequencies to the power devices. Each power device may collect and record the attenuation during the frequency changes, send the recorded signal back to the central processor, and the central processor may analyze the signal strength at each frequency to determine the correct order of power devices along the string. Corresponding signal receivers at each power device may be tuned to a fixed signal frequency or be broadband receivers for receiving signals at multiple frequencies.

A high frequency (HF) signal (e.g., 140 kHz) may be injected to one side of the PV string conductor, and an amplitude reduction during the signal propagation along the PV string may be observed. A processor may determine the power devices' order within the PV string based on the injected signal being gradually attenuated by each device along the string. The device leakage may be between 50 and 500 pf, and the solar panel leakage may be between 20 and 350 pf. Depending on the leakage values of a specific installation, the HF signal frequency may be between 20 kHz and 500 kHz, where a higher frequency of this range allows more attenuation between adjacent devices, but also may cause devices further down the string to reach saturation and for the signal strength to become flat. Furthermore, as the signal may enter the PV string from both the DC+ and DC− sides of the string, and the signal and leakages are relative to ground, the signal injected at DC+ may also reach the DC− side of the string. This may result in a monotonically decreasing signal strengths at each device up to a certain point in the string, and then the signal strengths may increase due to the signal arriving at the device from the DC− side. The signal may be configured such that the leakage impedances may optimally attenuate the signal strength along the entire string.

Figure 22:
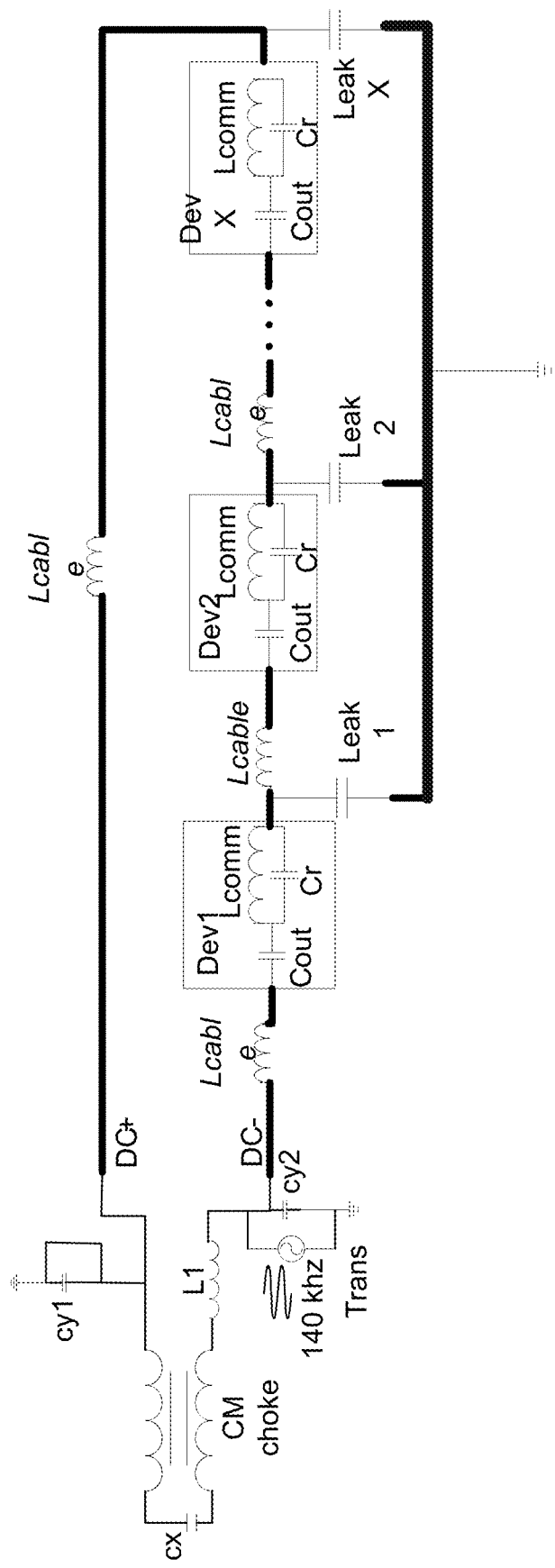
FIG. 22 shows an example circuit diagram of a PV string with PV order detection components.

FIG. 22 shows an example circuit diagram of a PV string with PV order detection components. A central processor or central power device (not shown) may include capacitor(s) at cx and a common mode choke at CM. Terminals DC+ and DC− may be connected to a string of power devices Dev1, Dev2, ..., DevX, each power device being connected to a PV panel (not shown). Connections to ground cy1 and cy2 allow the injected signal to propagate through the string and attenuate to ground through the leakage capacitors Leak1, Leak2, ..., LeakX. Serial inductor L1 may be used to assist in measuring the signal attenuation at each device as it may prevent the signal from entering the reverse side of the PV string. A transmitter as at Trans may inject a signal at a high frequency, such as 140 kHz, into the DC+ side of the PV string or the DC− side of the PV string (not shown). The cables of the PV string may have impedance or inductance of Lcable. Each power device along the string, as at Dev1, may include serial output capacitor Cout in series with parallel inductor Lcomm and capacitor Cr. Leakage capacitors Leak1, Leak2, ... LeakX may attenuate some of the signal strength by leaking some of the signal to ground.

Prior to injecting a signal at one end of the PV string, the other end of the string may be grounded to form a closed loop to ground. To obtain better signal attenuation along the PV string, a large impedance may be serially connected between the DC+ or DC−, on the opposite side from the PV string, and past the signal injection points and ground connection point. For example, a 150 kHz signal may be injected (with respect to ground) on the DC+ end of the PV string conductor. The signal may be injected from the DC+ end of the string and the DC− end of the string may be shorted to ground, or vice versa. Signal strengths at each PV panel along the string are measured, for example signal strength at the power devices along the string, such as junction boxes, power converters, optimizers, micro-inverters, or the like, associated with each PV panel. A serial inductance may be added in series to the DC− conductor, after the ground connection, such as an inductor of 0.1 mH to 10 mH. The serial impedance may help limit the amount of signal that reaches the opposite end of the string, limiting the "bathtub curve" and improving the accuracy of the mapping. Using a higher signal frequency may provide better attenuation from the power devices, but may also reach saturation quicker. To overcome the saturation, the side of the PV string used for signal injection may be reversed, for example the signal is injected from the DC− end, a 1 mH inductor is serially coupled to the DC+ end of the string, and the DC+ end is shorted to ground. The reverse injection may be especially suitable for long strings.

Figure 23:
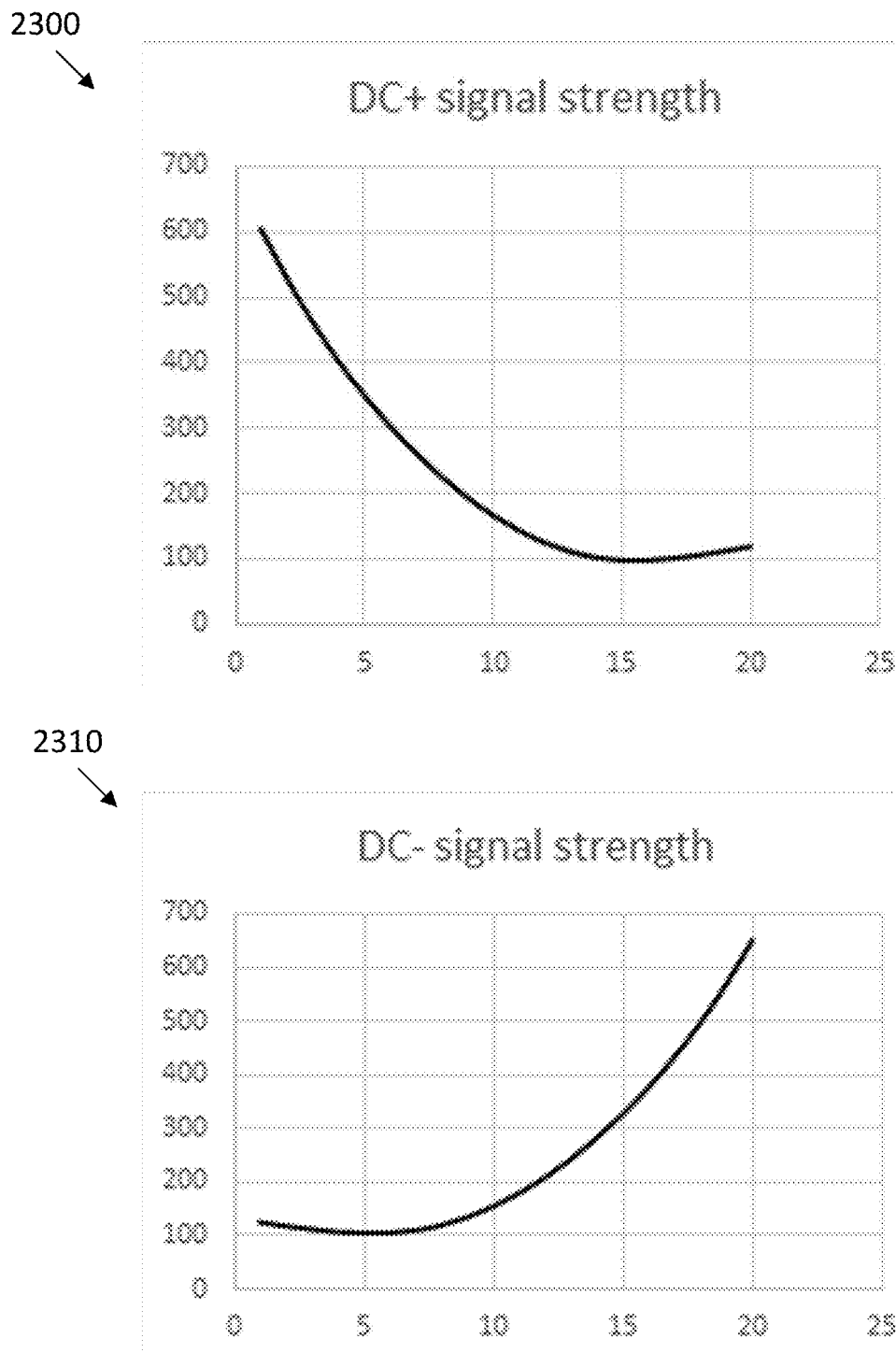
FIG. 23 shows example graphs of signal attenuations from signal injection on DC+ and DC−.

FIG. 23 shows example graphs of signal attenuations from signal injection on DC+ and DC−. Graph 2300 shows the decrease in signal strength along the PV string when the signal is injected from the DC+ terminal, where the increase from power device 15 to 20 is due to leakage of the signal from the DC− terminal. Graph 2310 shows the decrease in signal strength along the PV string when the signal is injected from the DC− terminal, where the increase from power device 5 to 1 is due to leakage of the signal from the DC+ terminal.

The serial inductance may saturate at power generation currents through the string, for example, a serial inductance of 1 mH may saturate at currents through the PV string higher than 0.2 A, such as during normal operation (e.g. after the mapping is completed). The power device receiver may switch to the tuned frequency of 140 kHz during the mapping and when the mapping is complete return to a normal communication frequency, such as 60 kHz or the like. Each of the power devices may receive a reduced signal strength in proportion to the power device's position along the string from the injected signal. After mapping, such as after a predefined time limit, each power device may transmit the received signal strength value back to a central processor or power device.

The central processor may determine the order based on the received signal strength measurements at each solar panel. The mapping may be verified or confirmed by repeating the mapping at a slightly different frequency, impedance values at each device, or both. By comparing the mapping order between two or more different mapping measurements, it may be determined that the mapping is accurate, or that there may be different leakage from some of the devices. A spread spectrum signal may allow collecting multiple signal frequencies at once and comparing the order determined at each frequency may help confirm the solar panel order. For example, sending a signal at a fixed frequency, and adjusting impedances during different mapping tests to different impedance values for each test may confirm that the results of the solar panel order are correct. When the order at different frequencies or different device impedance levels is different, the power device or solar panel leakages may be different, and adjusting the power devices to different impedance values may help determine and confirm the correct order of panels along the string.

The invention claimed is:

1. A method comprising:
    sending, to a plurality of power devices connected in a serial string, one or more commands to adjust an impedance between serial connections of each power device of the plurality of power devices;
    sending, via the serial string, a signal to the plurality of power devices;
    receiving, from the plurality of power devices, values of the signal measured at each serial connection between the plurality of power devices; and
    determine, based on the received values, an order of the plurality of power devices in the serial string.

2. The method of claim 1, wherein the signal comprises a first frequency, and wherein the method further comprises:
    sending, via the serial string, a second signal to the plurality of power devices, wherein the second signal comprises a second frequency different from the first frequency;
    receiving, from the plurality of power devices, values of the second signal measured at each serial connection between the plurality of power devices; and
    determining the order of the plurality of power devices in the serial string further based on the received values of the second signal.

3. The method of claim 1, wherein the signal comprises a spread spectrum frequency.

4. The method of claim 1, wherein the sending the one or more commands comprises sending the one or more commands to adjust the impedance to a first impedance, and wherein the method further comprises:
    sending, to the plurality of power devices, additional one or more commands to adjust the impedance to a second impedance different from the first impedance;
    sending, via the serial string, a second signal to the plurality of power devices;
    receiving, from the plurality of power devices, values of the second signal measured at each serial connection between the plurality of power devices; and
    determining the order of the plurality of power devices in the serial string further based on the received values of the second signal.

5. The method of claim 1, wherein each of the plurality of power devices comprises a capacitance leakage to ground.

6. The method of claim 5, wherein, in the capacitance leakage of each of the plurality of power devices, leakage from a solar panel is greater than leakage from any other source of each of the plurality of power devices.

7. The method of claim 1, wherein the sending the one or more commands to adjust the impedance comprises sending the one or more commands to adjust the impedance by using switches that connect capacitors and inductors to serial terminals of each power device.

8. The method of claim 1, wherein the signal comprises a frequency between 20 kHz and 500 kHz.

9. A power device comprising:
    serial connections connected to a serial string of other power devices, the other power devices comprising a central power device;
    a receiver configured to receive, via the serial connections, a signal from the central power device; and
    a processor configured to:
        receive a command from the central power device,
        adjust, based on the received command, an impedance between the serial connections,
        measure, using the receiver, a value of the received signal, and send the measured value to the central power device.

10. The power device of claim 9, wherein the signal comprises a first frequency,
  wherein the receiver is further configured to receive a second signal from the central power device, the second signal comprising a second frequency different from the first frequency, and
  wherein the processor is further configured to:
    measure, using the receiver, a value of the second signal, and
    send the measured value of the second signal to the central power device.

11. The power device of claim 9, wherein the signal comprises a spread spectrum signal having a plurality of frequencies.

12. The power device of claim 9, wherein the processor is configured to adjust, based on the received command, the impedance between the serial connections to a first impedance, and
  wherein the processor is further configured to:
    adjust the impedance between the serial connections to a second impedance different from the first impedance,
    measure, using the receiver and based on the second impedance, a value of a second signal received via the receiver from the central power device, and
    send the measured value of the second signal to the central power device.

13. The power device of claim 9, further comprising a capacitance leakage to ground.

14. The power device of claim 13, wherein the capacitance leakage dominates over other sources.

15. The power device of claim 9, further comprising switches that connect capacitors and inductors to the serial connections, thereby adjusting the impedance to one of a plurality of values.

16. The power device of claim 9, wherein the signal comprises a frequency between 20 kHz and 500 kHz.

17. A central power device comprising:
  a transmitter configured to send a signal through a serial string of power devices; and
  a processor configured to:
    send a command to the power devices,
    receive values, corresponding to the signal, from the power devices, and
    determine, based on the received values, an order of the power devices in the serial string.

18. The central power device of claim 17, wherein the command comprises a request for at least one of: (a) adjusting an impedance of the power devices, (b) measuring the values at the power devices, or (c) sending the signal values to the central power device.

19. The central power device of claim 17, wherein the signal comprises a spread spectrum signal having a plurality of frequencies.

20. The central power device of claim 17, wherein the signal comprises a frequency between 20 kHz and 500 kHz.

\* \* \* \* \*